United States Patent
Fukumoto et al.

(10) Patent No.: US 10,820,385 B2
(45) Date of Patent: Oct. 27, 2020

(54) LED DRIVE CIRCUIT, LED DRIVE DEVICE, AND LED DRIVE SYSTEM

(71) Applicant: ROHM CO., LTD., Kyoto (JP)

(72) Inventors: Kenichi Fukumoto, Kyoto (JP); Koji Katsura, Kyoto (JP); Ryosuke Kanemitsu, Kyoto (JP); Junichi Itai, Kyoto (JP); Nobuaki Matsui, Kyoto (JP); Seiji Nakashima, Kyoto (JP); Kouji Miyamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 16/480,327

(22) PCT Filed: Jan. 31, 2018

(86) PCT No.: PCT/JP2018/003238
§ 371 (c)(1),
(2) Date: Jul. 24, 2019

(87) PCT Pub. No.: WO2018/143282
PCT Pub. Date: Aug. 9, 2018

(65) Prior Publication Data
US 2019/0387591 A1 Dec. 19, 2019

(30) Foreign Application Priority Data

Jan. 31, 2017 (JP) .................................. 2017-016226
Jan. 31, 2017 (JP) .................................. 2017-016227

(51) Int. Cl.
*H05B 45/14* (2020.01)
*H05B 45/24* (2020.01)
(Continued)

(52) U.S. Cl.
CPC ............. *H05B 45/14* (2020.01); *H05B 45/24* (2020.01); *H05B 45/37* (2020.01); *H05B 45/44* (2020.01)

(58) Field of Classification Search
CPC ........ H05B 45/10; H05B 45/20; H05B 45/14; H05B 45/37; H05B 45/24; H05B 45/44;
(Continued)

(56) References Cited

U.S. PATENT DOCUMENTS 8,368,312 B2 * 2/2013 Kim ...................... H05B 45/46
315/185 R
8,783,901 B2 * 7/2014 Zoorob ..................... F21K 9/00
362/230
(Continued)

FOREIGN PATENT DOCUMENTS

| JP | 2005-33853 | 2/2005 |
| JP | 2011-138716 | 7/2011 |

(Continued)

OTHER PUBLICATIONS

Japan Patent Office, International Search Report for PCT/JP2018/003238, dated Mar. 6, 2018.

*Primary Examiner* — Haissa Philogene
(74) *Attorney, Agent, or Firm* — Fish & Richardson P.C.

(57) ABSTRACT

An LED drive circuit drives an LED module. The LED module has a light-emitting diode, and an identification unit having characteristic information relating to light-emitting characteristics of the light-emitting diode. The LED drive circuit includes a detection unit and a drive circuit. The detection unit is provided for detecting characteristic information, and generates a detection signal that corresponds to the characteristic information. The drive circuit generates drive current by a drive signal supplied according to the
(Continued)

US 10,820,385 B2

Page 2 characteristic information based on the detection signal, and supplies the drive current to drive the light-emitting diode.

17 Claims, 31 Drawing Sheets

(51) Int. Cl.
 *H05B 45/37* (2020.01)
 *H05B 45/44* (2020.01)
(58) Field of Classification Search
 CPC .... H05B 45/40; H05B 47/10; H05B 45/3725; H05B 47/135; B60Q 1/0094; B60Q 1/147; F21V 23/00; Y02B 20/30
 See application file for complete search history.

(56) References Cited

U.S. PATENT DOCUMENTS

| 9,113,532 | B2* | 8/2015 | Naruo | H05B 45/24 |
| 9,326,337 | B2* | 4/2016 | Nam | H05B 45/10 |
| 9,414,457 | B2* | 8/2016 | Fukuda | H05B 45/20 |
| 10,165,632 | B2* | 12/2018 | Jin | H05B 45/37 |
| 2005/0007085 | A1 | 1/2005 | Murakami | |
| 2011/0074294 | A1 | 3/2011 | Song et al. | |
| 2012/0319602 | A1 | 12/2012 | Naruo et al. | |
| 2013/0162154 | A1* | 6/2013 | Lee | H05B 45/10 315/200 R |
| 2013/0169171 | A1 | 7/2013 | Kamizono et al. | |
| 2014/0340887 | A1 | 11/2014 | Kobayakawa | |
| 2016/0227616 | A1* | 8/2016 | Lee | H05B 45/37 |
| 2016/0270177 | A1 | 9/2016 | Mishima | |

FOREIGN PATENT DOCUMENTS

| JP | 2012-119541 | 6/2012 |
| JP | 2013-004280 | 1/2013 |
| JP | 2013-136298 | 7/2013 |
| JP | 2014-225511 | 12/2014 |
| JP | 2016-167383 | 9/2016 |

* cited by examiner

LED DRIVE CIRCUIT, LED DRIVE DEVICE, AND LED DRIVE SYSTEM

TECHNICAL FIELD

The present invention relates to an LED driving circuit, an LED driving device, and an LED driving system.

BACKGROUND ART

An LED driving circuit that performs constant current driving has been proposed (refer to, for example, patent document 1) to stably operate one or more light emitting diodes (LEDs). It is known that variation occurs in light emission color and brightness in the LED.

Furthermore, an LED module serving as a chip component in which one or more light emitting diodes (LED) are packaged has been proposed (refer to, for example, patent document 1). In such an LED module, it is known that variation occurs in light emission color and brightness in the mounted LED.

PRIOR ART DOCUMENTS

Patent Document

Patent Document 1: Japanese Laid-Open Patent Publication No. 2005-33853 Patent Document 2: Japanese Laid-Open Patent Publication No. 2014-225511

SUMMARY OF INVENTION

Problems that are to be Solved by the Invention

The LED (LED module) is required to emit light with a desired color or brightness. For this reason, in an LED driving circuit that drives the LED (LED module), the amount of current that flows to the LED (LED mounted on LED module) is adjusted. In the adjustment operation, a technician checks the color or brightness of the emitted light when LEDs emit light and adjusts the amount of current flowing to each light emitting diode. Thus, since the adjustment operation is performed based on information obtained by visually checking the color or brightness of the emitted light when the LEDs emit light, that is, the information that is not quantitative data, the adjustment operation is sometimes repeatedly performed until the color or brightness of the emitted light of the LEDs becomes a desired color or brightness. In addition, in order to emit light with the brightness of the emitted light of one LED at a desired brightness, the adjustment operation of adjusting the amount of current flowing to one LED in the LED driving circuit may be similarly performed repeatedly until the brightness of the emitted light of one LED becomes the desired brightness.

An object of the present invention is to provide an LED driving circuit, an LED driving device, and an LED driving system capable of easily obtaining light of a desired color or brightness.

Means for Solving the Problems

[1] An LED driving circuit that solves the above problem is an LED driving circuit that drives an LED module including a light emitting diode and an identification unit having characteristic information related to light emission characteristics of the light emitting diode. The LED driving circuit includes a detector that detects the characteristic information and generates a detection signal corresponding to the characteristic information and a driving circuit that generates a drive current with a drive signal provided in accordance with the characteristic information based on the detection signal and supplies the drive current to drive the light emitting diode.

According to this configuration, the identification unit has the characteristic information corresponding to the light emission characteristic of the light emitting diode. Therefore, the characteristic information of the identification unit is read out from the LED module by the detector, and the driving circuit supplies a drive current corresponding to the characteristic information to the LED module, whereby light of a desired color or brightness is obtained. It is sufficient to merely read out the characteristic information of the identification unit of the LED module, and the adjustment work becomes unnecessary. Therefore, light of a desired color or brightness can be easily obtained.

[2] Preferably, in the LED driving circuit, the LED module includes a plurality of the light emitting diodes. The characteristic information includes at least one of information related to a color rank of emitted light produced by the plurality of light emitting diodes and information related to a brightness of emitted light produced by the plurality of light emitting diodes. The driving circuit generates the drive current based on the characteristic information for each of the plurality of light emitting diodes and supplies the drive current to drive each of the plurality of light emitting diodes.

According to this configuration, since the characteristic information related to at least one of the color rank and the brightness of the emitted light produced by the plurality of light emitting diodes is detected by the detector, quantitative information related to at least one of the color rank and the brightness of the emitted light produced by the plurality of light emitting diodes can be acquired. As the driving circuit supplies a drive current corresponding to the information to each of the plurality of light emitting diodes, the color unevenness of the emitted light produced by the plurality of light emitting diodes can be reduced and light having at least one of a desired color and brightness can be obtained.

[3] Preferably, in the LED driving circuit, the light emitting diode includes a first light emitting diode that emits red light, a second light emitting diode that emits green light, and a third light emitting diode that emits blue light. The characteristic information includes at least one of information related to a color rank of emitted light produced by the first light emitting diode, the second light emitting diode, and the third light emitting diode and information related to a brightness of emitted light produced by the first light emitting diode, the second light emitting diode, and the third light emitting diode. The driving circuit generates a first drive current supplied to the first light emitting diode, a second drive current supplied to the second light emitting diode, and a third drive current supplied to the third light emitting diode as the drive current based on the characteristic information. The driving circuit supplies the first drive current, the second drive current, and the third drive current to respectively drive the first light emitting diode, the second light emitting diode, and the third light emitting diode.

According to this configuration, since the characteristic information related to at least one of the color rank and the brightness of the emitted light produced by the first, second, and third light emitting diodes is detected by the detector, quantitative information related to at least one of the color rank and the brightness of the emitted light produced by each of the light emitting diodes can be acquired. As the driving circuit supplies a drive current corresponding to the information to each of the first, second, and third light emitting diodes, the color unevenness of the emitted light produced by the plurality of light emitting diodes can be reduced and light having at least one of a desired color and brightness can be obtained.

[4] Preferably, in the LED driving circuit, the light emitting diode includes a first light emitting diode that emits red light, a second light emitting diode that emits green light, and a third light emitting diode that emits blue light. The characteristic information includes at least one of information related to a combination of a color rank of emitted light of the first light emitting diode, a color rank of emitted light of the second light emitting diode, and a color rank of emitted light of the third light emitting diode and information related to a combination of a brightness of emitted light of the first light emitting diode, a brightness of emitted light of the second light emitting diode, and a brightness of emitted light of the third light emitting diode. The driving circuit generates a first drive current supplied to the first light emitting diode, a second drive current supplied to the second light emitting diode, and a third drive current supplied to the third light emitting diode as the drive current based on the characteristic information. The driving circuit supplies the first drive current, the second drive current, and the third drive current to respectively drive the first light emitting diode, the second light emitting diode, and the third light emitting diode.

According to this configuration, since the characteristic information related to at least one of a combination of a color rank of emitted light and a combination of a brightness of emitted light of each of the first, second, and third light emitting diodes is detected by the detector, quantitative information related to the color rank of the emitted light and the brightness of the emitted light produced by each of the light emitting diodes can be acquired. As the driving circuit supplies a drive current corresponding to the information to each of the first, second, and third light emitting diodes, the color unevenness of the emitted light produced by the plurality of light emitting diodes can be reduced and light having at least one of a desired color and brightness can be obtained.

[5] Preferably, in the LED driving circuit, the identification unit includes a resistance element having a resistance value corresponding to the characteristic information, and the detector detects the characteristic information from a voltage value when current flows to the resistance element.

According to such a configuration, the characteristic information related to the light emission characteristic of the light emitting diode can be detected by supplying current to the resistance element. Therefore, the characteristic information can be easily detected.

[6] Preferably, in the LED driving circuit, the detector includes a detection circuit that generates a voltage corresponding to the resistance element and a conversion circuit that converts the voltage into the characteristic information.

[7] An LED driving device that solves the above problems is an LED driving device including an LED module including a light emitting diode and an LED driving circuit that drives the light emitting diode. The LED module includes an identification unit having characteristic information related to light emission characteristics of the light emitting diode. The LED driving circuit includes a detector that detects the characteristic information and generates a detection signal corresponding to the characteristic information and a driving circuit that generates a drive current with a drive signal provided in accordance with the characteristic information based on the detection signal and supplies the drive current to drive the light emitting diode.

According to this configuration, the identification unit has the characteristic information corresponding to the light emission characteristic of the light emitting diode. Therefore, the characteristic information of the identification unit is read out from the LED module by the detector, and the driving circuit supplies a drive current corresponding to the characteristic information to the LED module, whereby light of a desired color or brightness is obtained. It is sufficient to merely read out the characteristic information of the identification unit of the LED module, and the adjustment work becomes unnecessary. Therefore, light of a desired color or brightness can be easily obtained.

[8] Preferably, in the LED driving device, the LED module includes a plurality of the light emitting diodes. The characteristic information includes at least one of information related to a color rank of emitted light produced by the plurality of light emitting diodes and information related to a brightness of emitted light produced by the plurality of light emitting diodes. The driving circuit generates the drive current based on the characteristic information for each of the plurality of light emitting diodes and supplies the drive current to drive each of the plurality of light emitting diodes.

According to this configuration, since the characteristic information related to at least one of the color rank and the brightness of the emitted light produced by the plurality of light emitting diodes is detected by the detector, quantitative information related to at least one of the color rank and the brightness of the emitted light produced by the plurality of light emitting diodes can be acquired. As the driving circuit supplies a drive current corresponding to the information to each of the plurality of light emitting diodes, the color unevenness of the emitted light produced by the plurality of light emitting diodes can be reduced and light having at least one of a desired color and brightness can be obtained.

[9] Preferably, in the LED driving device, the light emitting diode includes a first light emitting diode that emits red light, a second light emitting diode that emits green light, and a third light emitting diode that emits blue light. The characteristic information includes at least one of information related to a color rank of emitted light produced by the first light emitting diode, the second light emitting diode, and the third light emitting diode and information related to a brightness of emitted light produced by the first light emitting diode, the second light emitting diode, and the third light emitting diode. The driving circuit generates a first drive current supplied to the first light emitting diode, a second drive current supplied to the second light emitting diode, and a third drive current supplied to the third light emitting diode as the drive current based on the characteristic information, and the driving circuit supplies the first drive current, the second drive current, and the third drive current to respectively drive the first light emitting diode, the second light emitting diode, and the third light emitting diode.

According to this configuration, since the characteristic information related to at least one of the color rank of the emitted light and the brightness of the emitted light produced by the first, second, and third light emitting diodes is detected by the detector, quantitative information related to at least one of the color rank of the emitted light and the brightness of the emitted light produced by each of the light emitting diodes can be acquired. As the driving circuit supplies a drive current corresponding to the information to each of the first, second, and third light emitting diodes, the color unevenness of the emitted light produced by the plurality of light emitting diodes can be reduced and light having at least one of a desired color and brightness can be obtained.

[10] Preferably, in the LED driving device, the light emitting diode includes a first light emitting diode that emits red light, a second light emitting diode that emits green light, and a third light emitting diode that emits blue light. The characteristic information includes at least one of information related to a combination of a color rank of emitted light of the first light emitting diode, a color rank of emitted light of the second light emitting diode, and a color rank of emitted light of the third light emitting diode and information related to a combination of a brightness of emitted light of the light emitting diode, a brightness of emitted light of the second light emitting diode, and a brightness of emitted light of the third light emitting diode. The driving circuit generates a first drive current supplied to the first light emitting diode, a second drive current supplied to the second light emitting diode, and a third drive current supplied to the third light emitting diode as the drive current based on the characteristic information, and the driving circuit supplies the first drive current, the second drive current, and the third drive current to respectively drive the first light emitting diode, the second light emitting diode, and the third light emitting diode.

According to this configuration, since the information related to at least one of a combination of a color rank and a combination of a brightness of each of the first, second, and third light emitting diodes is detected by the detector, quantitative information related to at least one of the color rank and the brightness of the emitted light produced by each of the light emitting diodes can be acquired. As the driving circuit supplies a drive current corresponding to the information to each of the first, second, and third light emitting diodes, the color unevenness of the emitted light produced by the plurality of light emitting diodes can be reduced and light having at least one of a desired color and brightness can be obtained.

[11] Preferably, in the LED driving device, the identification unit includes a resistance element having a resistance value corresponding to the characteristic information, and the detector detects the characteristic information from a voltage value when current flows to the resistance element.

According to such a configuration, the characteristic information related to the light emission characteristic of the light emitting diode can be detected by supplying current to the resistance element. Therefore, the characteristic information can be easily detected.

[12] Preferably, in the LED driving device, the detector includes a detection circuit that generates a voltage corresponding to the resistance element and a conversion circuit that converts the voltage into the characteristic information.

[13] Preferably, in the LED driving device, the resistance value of the resistance element is greater than or equal to 100Ω and less than or equal to 10 kΩ.

According to this configuration, even when resistance elements of different resistance values are prepared, the difference between the closest resistance values can be increased. This ensures identification of the resistance value of the resistance element.

[14] Preferably, in the LED driving device, the LED module is a package of the light emitting diode and the identification unit. According to this configuration, the number of parts of the LED driving device can be reduced as compared to when the LED module and the identification unit are provided separately.

[15] An LED driving system that solves the above problem is an LED driving system including an LED module including a light emitting diode, an LED driving circuit that drives the light emitting diode, and a control device that controls the LED driving circuit. The LED module includes an identification unit having characteristic information related to light emission characteristics of the light emitting diode. The LED driving circuit includes a detector provided to detect the characteristic information, generate a detection signal corresponding to the characteristic information, and output the detection signal to the control device. A driving circuit drives the light emitting diode. The control device generates a drive signal corresponding to the characteristic information based on the detection signal, and the control device outputs the drive signal to the driving circuit. The driving circuit generates a drive current with the drive signal and supplies the drive current to drive the light emitting diode.

According to this configuration, the control device controls the driving circuit to obtain light of a desired color or brightness based on the characteristic information related to the light emission characteristic of the light emitting diode. Thus, the color or brightness of the light emitting diode is automatically set to a desired color or brightness by the control device. The adjustment work thus becomes unnecessary. Therefore, light of a desired color or brightness can be easily obtained.

[16] Preferably, in the LED driving system, the LED module includes a plurality of the light emitting diodes. The characteristic information includes at least one of information related to a color rank of emitted light produced by the plurality of light emitting diodes and information related to a brightness of the emitted light produced by the plurality of light emitting diodes. The control device generates the drive signal corresponding to the characteristic information for each of the plurality of light emitting diodes and outputs the drive signal to the driving circuit. The driving circuit generates the drive current for each of the plurality of light emitting diodes according to the drive signal and supplies the drive current to drive each of the plurality of light emitting diodes.

According to this configuration, the control device drives the plurality of light emitting diodes based on the characteristic information related to at least one of the color rank of the emitted light and the brightness of the emitted light produced by the plurality of light emitting diodes. Thus, the color unevenness of the emitted light produced by the plurality of light emitting diodes is reduced, and light having at least one of a desired color and brightness is obtained.

[17] Preferably, in the LED driving system, the light emitting diode includes a first light emitting diode that emits red light, a second light emitting diode that emits green light, and a third light emitting diode that emits blue light. The characteristic information includes at least one of information related to a color rank of emitted light produced by the first light emitting diode, the second light emitting diode, and the third light emitting diode and information related to a brightness of emitted light produced by the first light emitting diode, the second light emitting diode, and the third light emitting diode. The control device generates a first drive signal for driving the first light emitting diode, a second drive signal for driving the second light emitting diode, and a third drive signal for driving the third light emitting diode in accordance with the characteristic information, and the control device output the first drive signal, the second drive signal, and the third drive signal to the driving circuit. The driving circuit generates a first drive current supplied to the first light emitting diode with the first drive signal, a second drive current supplied to the second light emitting diode with the second drive signal, and a third drive current supplied to the third light emitting diode with the third drive signal, and the driving circuit supplies the first drive current, the second drive current, and the third drive current to respectively drive the first light emitting diode, the second light emitting diode, and the third light emitting diode.

According to this configuration, the control device drives each light emitting diode based on the characteristic information related to at least one of the color rank of the emitted light and the brightness of the emitted light produced by the first, second, and third light emitting diodes. Thus, the color unevenness of the emitted light produced by each of the light emitting diodes is reduced, and light having at least one of a desired color and brightness is obtained.

[18] Preferably, in the LED driving system, the light emitting diode includes a first light emitting diode that emits red light, a second light emitting diode that emits green light, and a third light emitting diode that emits blue light. The characteristic information includes at least one of information related to a combination of a color rank of emitted light produced by the first light emitting diode, a color rank of emitted light produced by the second light emitting diode, and a color rank of emitted light produced by the third light emitting diode and information related to a combination of a brightness of emitted light produced by the first light emitting diode, a brightness of emitted light produced by the second light emitting diode, and a brightness of emitted light produced by the third light emitting diode. The control device generates a first drive signal for driving the first light emitting diode, a second drive signal for driving the second light emitting diode, and a third drive signal for driving the third light emitting diode in accordance with the characteristic information, and the control device outputs the first drive signal, the second drive signal, and the third drive signal to the driving circuit. The driving circuit generates a first drive current supplied to the first light emitting diode in accordance with the first drive signal, a second drive current supplied to the second light emitting diode in accordance with the second drive signal, and a third drive current supplied to the third light emitting diode in accordance with the third drive signal, and the driving circuit supplies the first drive current, the second drive current, and the third drive current to respectively drive the first light emitting diode, the second light emitting diode, and the third light emitting diode.

According to this configuration, the control device drives the respective light emitting diodes based on the characteristic information related to at least one of the combination of the color ranks and the combination of the brightness of each of the first, second, and third light emitting diodes. Thus, the color unevenness of the emitted light produced by each of the light emitting diodes is reduced, and light having at least one of a desired color and brightness is obtained.

[19] Preferably, in the LED driving system, the identification unit includes a resistance element having a resistance value corresponding to the characteristic information. The detector is connected to the resistance element and detects the characteristic information from a voltage value when current flows to the resistance element. The control device generates the drive signal based on the voltage value of the detector.

According to such a configuration, the characteristic information related to the light emission characteristic of the light emitting diode can be detected by supplying current to the resistance element. Therefore, the characteristic information can be easily detected.

[20] Preferably, in the LED driving system, the detector includes a detection circuit that generates a voltage corresponding to the resistance element and a conversion circuit that converts the voltage into the characteristic information.

[21] Preferably, in the LED driving system, the resistance value of the resistance element is greater than or equal to 100Ω and less than or equal to 10 kΩ.

[22] Preferably, in the LED driving system, the detector detects the characteristic information before the light emitting diode is driven by the driving circuit.

According to this configuration, the light emitting diode has the desired color or brightness from when the drive circuit starts driving the light emitting diode.

[23] Preferably, in the LED driving system, the LED module is a package of the light emitting diode and the identification unit.

According to this configuration, the number of components of the LED driving system can be reduced in comparison with when the LED module and the identification unit are separate.

[24] The LED module according to a further aspect includes a plurality of light emitting diodes, an anode side electrode connected to an anode of the light emitting diode, a cathode side electrode connected to a cathode of the light emitting diode, a passive element, a support member that supports the anode side electrode, the cathode side electrode, and the passive element, and a translucent protective member that covers the plurality of light emitting diodes.

According to this configuration, when the passive element has a characteristic value corresponding to the light emission characteristic of the light emitting diode, the characteristic value of the passive element is read out from the LED module and current corresponding to the characteristic value is supplied to the LED module, so that light of a desired color or brightness is obtained. It is sufficient to merely read out the characteristic value of the passive element accommodated in the LED module, and the adjustment work becomes unnecessary. Therefore, light of a desired color or brightness can be easily obtained.

[25] Preferably, in the LED module, the passive element preferably has a characteristic value corresponding to information related to at least one of a color rank and a brightness of the emitted light produced by the plurality of light emitting diodes as light emission characteristics.

According to this configuration, since the passive element has the characteristic value corresponding to the information related to at least one of the color rank and the brightness of the emitted light produced by the plurality of light emitting diodes, quantitative information related to at least one of the color rank and the brightness of the emitted light can be acquired. Then, light having at least one of a desired color and brightness can be obtained by supplying current corresponding to the information to each of the plurality of light emitting diodes.

[26] Preferably, in the LED module, the light emitting diode includes a first light emitting diode that emits red light, a second light emitting diode that emits green light, and a third light emitting diode that emits blue light; the anode side electrode includes a first anode side electrode connected to an anode of the first light emitting diode, a second anode side electrode connected to an anode of the second light emitting diode, and a third anode side electrode connected to an anode of the third light emitting diode; and the cathode side electrode includes a first cathode side electrode connected to a cathode of the first light emitting diode, a second cathode side electrode connected to a cathode of the second light emitting diode, and a third cathode side electrode connected to a cathode of the third light emitting diode.

According to this configuration, emitted light of any color can be obtained by the first, second, and third light emitting diodes. A white light can be obtained by simultaneously driving the first, second, and third light emitting diodes.

[27] Preferably, in the LED module, the passive element has a characteristic value corresponding to information related to at least one of a color rank and a brightness of emitted light produced by the first light emitting diode, the second light emitting diode, and the third light emitting diode as light emission characteristics.

According to this configuration, since the passive element has the characteristic value corresponding to the information related to at least one of the color rank and the brightness of the emitted light produced by the first, second, and third light emitting diodes, quantitative information related to at least one of the color rank and the brightness of the emitted light can be acquired. Then, light having at least one of desired color and brightness can be obtained by supplying current corresponding to the information to the first, second, and third light emitting diodes.

[28] Preferably, in the LED module, the first anode side electrode, the second anode side electrode, and the third anode side electrode are located closer to one side in a first direction of the support member and arranged spaced apart in a second direction orthogonal to the first direction in a plan view of the LED module; the first cathode side electrode, the second cathode side electrode, and the third cathode side electrode are located closer to the other side in the first direction of the support member and arranged spaced part in the second direction; the first light emitting diode is supported by either one of the first anode side electrode and the first cathode side electrode; the second light emitting diode is supported by either one of the second anode side electrode and the second cathode side electrode, and the third light emitting diode is supported by either one of the third anode side electrode and the third cathode side electrode.

[29] Preferably, in the LED module, the first anode side electrode is located between the second anode side electrode and the third anode side electrode in the second direction; the first cathode side electrode is located between the second cathode side electrode and the third cathode side electrode in the second direction; the first light emitting diode is supported by the first anode side electrode; the second light emitting diode is supported by the second cathode side electrode; and the third light emitting diode is supported by the third cathode side electrode.

According to this configuration, the first light emitting diode, the second light emitting diode, and the third light emitting diode can be arranged close to each other. Therefore, the color mixing property of the first, second, and third light emitting diodes can be enhanced.

[30] Preferably, the LED module includes at least one of a Zener diode connected in antiparallel to the first light emitting diode, a Zener diode connected in antiparallel to the second light emitting diode, and a Zener diode connected in antiparallel to the third light emitting diode.

According to this configuration, an excessive voltage can be avoided from being applied to the light emitting diode to which the Zener diode is connected in antiparallel of the first, second, and third light emitting diodes.

[31] Preferably, in the LED module, assuming the Zener diode connected in antiparallel to the second light emitting diode is a first Zener diode, and the Zener diode connected in antiparallel to the third light emitting diode is a second Zener diode, the first Zener diode is supported by the second anode side electrode, and the second Zener diode is supported by the third anode side electrode.

[32] Preferably, the LED module further includes a support electrode for supporting the passive element.

[33] In the LED module, preferably, the support electrode is electrically connected to the passive element, and part of the support electrode is exposed from the support member.

According to this configuration, the characteristic value of the passive element can be easily extracted through the support electrode.

[34] Preferably, in the LED module, the support electrode includes a first support electrode and a second support electrode spaced apart in the first direction, and the passive element is arranged to cross the first support electrode and the second support electrode and is electrically connected to the first support electrode and the second support electrode.

[35] Preferably, in the LED module, the first support electrode is located closer to one side in the first direction of the support member and is arranged spaced apart from each of the first anode side electrode, the second anode side electrode, and the third anode side electrode in the second direction; the second support electrode is located closer to the other side in the first direction of the support member and is arranged spaced apart from each of the first cathode side electrode, the second cathode side electrode, and the third cathode side electrode in the second direction.

According to this configuration, the first support electrode and the second support electrode are located at different positions from the anode electrodes and the cathode electrodes in a plan view of the LED module, and thus the height dimension of the LED module can be reduced.

[36] Preferably, in the LED module, the first support electrode is located closer to one side than each of the first anode side electrode, the second anode side electrode, and the third anode side electrode in the second direction, and the second support electrode is located closer to one side than each of the first cathode side electrode, the second cathode side electrode, and the third cathode side electrode in the second direction.

According to this configuration, since the first support electrode is not located between the adjacent anode side electrodes of the first, second, and third anode side electrodes, the distance between the adjacent anode side electrodes of the first, second, and third anode side electrodes does not become long. Since the second support electrode is not located between the adjacent cathode side electrodes of the first, second, and third cathode side electrodes, the distance between the adjacent cathode side electrodes of the first, second, and third anode side electrodes does not become long. Therefore, since the first, second, and third light emitting diodes can be brought close to one another, color mixing property can be enhanced.

[37] Preferably, in the LED module, the first support electrode includes a first terminal projecting out to the outer side of the support member and a first support that supports the passive element, the second support electrode includes a second terminal projecting out to the outer side of the support member and a second support that supports the passive element, a width of the first support is larger than a width of the first terminal, and a width of the second support is larger than a width of the second terminal.

According to this configuration, since the widths of the first support and the second support that support the passive element are large, the passive element can be easily attached to the first support and the second support. Therefore, the workability of attachment of the passive element to the support electrode is enhanced.

[38] Preferably, in the LED module, the first support electrode has the first terminal exposed from the back surface of the support member and the first support not exposed from the back surface of the support member; and the second support electrode has the second terminal exposed from the back surface of the support member and the second support not exposed from the back surface of the support member.

According to this configuration, since only the first terminal and the second terminal are exposed from the back surface of the support member, the distance between a portion of the first support electrode exposed from the back surface of the support member and a portion of the second support electrode exposed from the back surface of the support member in the first direction can be increased. Therefore, the electrical insulation between the first support electrode and the second support electrode can be enhanced.

[39] In the LED module, a first opening that surrounds the light emitting diode and a second opening that surrounds the passive element are preferably formed in the support member.

According to this configuration, the light emitting diode can be easily located near the center of the first opening.

[40] In the LED module, the passive element is preferably embedded in the support member between the back surface of the support member and the anode side electrode and the cathode side electrode in the height direction of the support member.

According to this configuration, the passive element can be arranged at a position overlapping at least one of the light emitting diode, the anode side electrode, and the cathode side electrode. Therefore, the size of the LED module can be reduced in a plan view of the LED module.

[41] Preferably, in the LED module, the anode side electrode includes an anode terminal located at an end on one side in the first direction of the support member and exposed from the back surface of the support member and an anode support extending from the anode terminal toward the other side in the first direction of the support member; the cathode side electrode includes a cathode terminal located at an end on the other side in the first direction of the support member and exposed from the back surface of the support member and a cathode support extending from the cathode terminal toward the one side in the first direction of the support member; the thickness of the anode support is thinner than the thickness of the anode terminal; the thickness of the cathode support is thinner than the thickness of the cathode terminal; the passive element is located between the anode terminal and the cathode terminal in the first direction and is arranged at a position overlapping at least one of the anode support and the cathode support in the plan view of the LED module.

According to this configuration, in a plan view of the LED module, the passive element is arranged at a position overlapping at least one of the anode support thinner than the anode terminal and the cathode support thinner than the cathode terminal, and thus the height dimension of the LED module can be reduced.

[42] Preferably, the LED module includes a first detection terminal electrically connected to the first terminal of the passive element, and a second detection terminal electrically connected to the second terminal of the passive element; the first detection terminal and the second detection terminal are located between the anode terminal and the cathode terminal in the first direction and spaced apart in a second direction orthogonal to the first direction in a plan view of the LED module and exposed from the back surface of the support member, and the passive element is located between the first detection terminal and the second detection terminal in the second direction.

According to such a configuration, since the first detection terminal, the second detection terminal, and the passive element are aligned in the second direction, the arrangement space of the first detection terminal, the second detection terminal, and the passive element in the first direction can be reduced. Therefore, the size of the LED module in the first direction can be reduced.

[43] In the LED module, the first detection terminal and the second detection terminal are preferably located at positions overlapping at least one of the anode support and the cathode support in a plan view of the LED module.

According to this configuration, the size of the LED module in the second direction can be reduced compared to a structure in which the first detection terminal and the second detection terminal are located between the anode support and the cathode support in the second direction.

[44] Preferably, in the LED module, the passive element and the first detection terminal are connected by a first wiring, the passive element and the second detection terminal are connected by a second wiring, and the first wiring and the second wiring are not exposed from the back surface of the support member.

According to this configuration, the distance between the first detection terminal and the second detection terminal can be increased. Therefore, the electrical insulation between the first detection terminal and the second detection terminal can be enhanced.

[45] In the LED module, the passive element is preferably arranged so as to cross the second cathode side electrode and the third cathode side electrode, and is electrically connected to the second cathode side electrode and the third cathode side electrode.

According to this configuration, since the passive element is supported by the second cathode side electrode and the third cathode side electrode, a dedicated electrode for supporting the passive element can be omitted. Therefore, the number of parts of the LED module can be reduced. In addition, the size of the LED module can be reduced because the passive element is arranged at a position overlapping the second cathode side electrode and the third cathode side electrode in a plan view of the LED module.

[46] In the LED module, the passive element is preferably located on a side opposite to the side on which the second light emitting diode and the third light emitting diode are located at the front and back of the second cathode side electrode and the third cathode side electrode.

[47] In the LED module, the passive element is preferably a resistance element.

According to this configuration, since the resistance value can be calculated by supplying current to the resistance element, the light emission characteristic of the light emitting diode can be easily obtained from the resistance value.

[48] In the LED module, the resistance value of the resistance element is preferably in the range of greater than or equal to 100Ω and less than or equal to 10Ω.

According to this configuration, even if resistance elements of a plurality of types of resistance values are prepared, the difference between the resistance values, in which the values are the closest, can be made large. Thus, identification of the resistance value of a resistance element can be reliably performed.

[49] An LED driving device for solving the above problems includes the LED module according to any one of [1] to [25], and an LED driving circuit for driving the LED module.

According to this configuration, the same advantages as the LED module can be obtained.

[50] An LED driving system for solving the above problems includes the LED driving device and a control device for controlling the LED driving device.

According to this configuration, the same advantages as the LED module can be obtained.

Effects of Invention

According to the LED driving circuit, the LED module, the LED driving device, and the LED driving system, light of a desired color or brightness can be easily obtained.

EMBODIMENTS OF INVENTION

Hereinafter, embodiments of a light emitting diode (LED) module, an LED driving circuit, an LED driving device, and an LED driving system will now be described with reference to the drawings. The embodiments shown below exemplify a configuration and a method for embodying the technical idea, and the material, shape, structure, arrangement, dimensions, and the like of each component are not to be limited to the following. The following embodiments can be variously modified within the scope of the claims.

First Embodiment

[LED Driving System]

Figure 1:
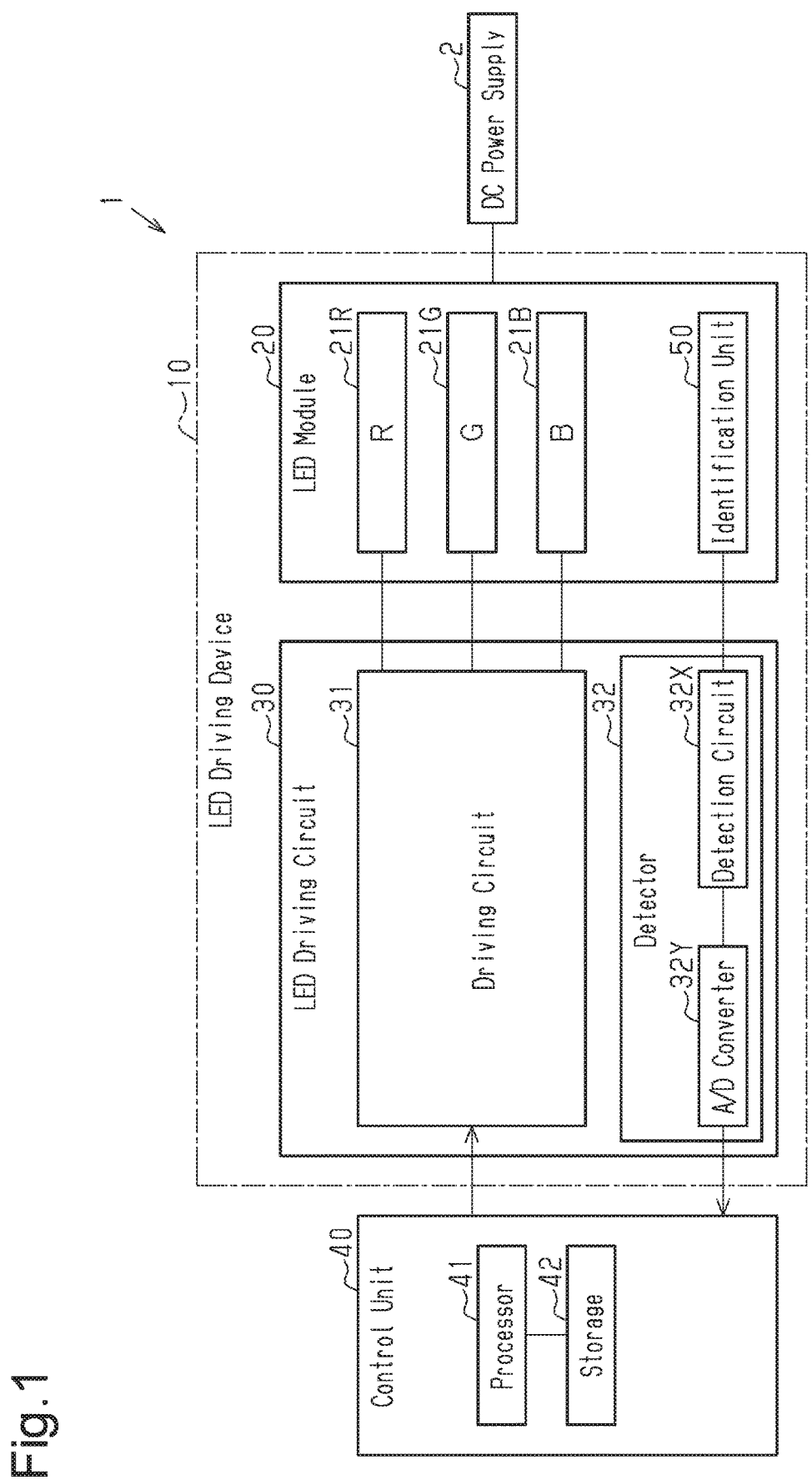
FIG. 1 is a schematic diagram of a first embodiment of an LED driving system.

As shown in FIG. 1, the LED driving system 1 includes an LED driving device 10 and a control device 40. The control device 40 controls the LED driving device 10. The LED driving device 10 includes an LED module 20 and an LED driving circuit 30. The LED driving circuit 30 drives the LED module 20. The LED driving system 1 is used, for example, as a backlight of a liquid crystal panel for an amusement device and a game device, a light source of a meter panel of a vehicle, and the like.

The LED module 20 is connected to a direct current (DC) power supply 2. The LED module 20 includes a first light emitting diode 21R that emits red light, a second light emitting diode 21G that emits green light, and a third light emitting diode 21B that emits blue light. The LED module 20 emits a single emitted light of each light emitting diode 21R, 21G, 21B, light of a color in which the emitted lights of the two light emitting diodes are mixed, and a white light in which the emitted lights of the three light emitting diodes are mixed.

The LED module 20 includes an identification unit 50 having light emission characteristics of each light emitting diode 21R, 21G, 21B, for example, characteristic information related to a color rank of the emitted light produced by each light emitting diode 21R, 21G, 21B. The LED module 20 is obtained by integrating each light emitting diode 21R, 21G, 21B and the identification unit 50 into one package. In the present embodiment, the first, second, and third light emitting diodes 21R, 21G and 21B and the identification unit 50 are electrically insulated. The identification unit 50 includes a resistance element 51 which is an example of a passive element having a characteristic value corresponding to the light emission characteristic of each light emitting diode 21R, 21G, and 21B. That is, the resistance element 51 has a resistance value corresponding to the light emission characteristic of each light emitting diode 21R, 21G, and 21B.

The LED driving circuit 30 is connected to the DC power supply 2 through the LED module 20. The LED driving circuit 30 individually performs a drive control of each light emitting diode 21R, 21G, 21B of the LED module 20. The LED driving circuit 30 includes a driving circuit 31 that controls the amount of current to supply to each of the light emitting diodes 21R, 21G, and 21B, and a detector 32 that detects the characteristic information of the identification unit 50. The driving circuit 31 is electrically connected to each of the light emitting diodes 21R, 21G, and 21B. The detector 32 is electrically connected to the identification unit 50 and the control device 40. The detector 32 generates a detection signal corresponding to the characteristic information. The detector 32 includes a detection circuit 32X electrically connected to the identification unit 50, and an A/D converter 32Y which is an example of a conversion circuit that digitally converts an analog signal (detection signal) by the detection circuit 32X. The detection circuit 32X generates a voltage corresponding to the resistance element 51. The A/D converter 32Y is electrically connected to the detection circuit 32X. The A/D converter 32Y converts the voltage generated by the detection circuit 32X into characteristic information. In the present embodiment, the A/D converter 32Y outputs the information (voltage) obtained by the detection circuit 32X to the control device 40 as a digital signal (characteristic information).

The control device 40 is electrically connected to the driving circuit 31 and the detector 32. The control device 40 controls the driving circuit 31 based on the detection result of the detector 32. In the present embodiment, the control device 40 performs PWM control on the driving circuit 31. The control device 40 includes a processor 41 and storage 42. The processor 41 executes a control program defined in advance. The processor 41 includes, for example, a central processing unit (CPU) or a micro-processing unit (MPU). The storage 42 stores various control programs, a plurality of operation modes, and information used for various control processes. The storage 42 includes, for example, a random access memory (RAM) and a read only memory (ROM).

The control device 40 has three modes of operation: single color light emission mode, mixed color light emission mode, and white color light emission mode. The single color light emission mode is a mode in which one of the first, second, and third light emitting diodes 21R, 21G and 21B emits light. The mixed color light emission mode is a mode in which two light emitting diodes of the first, second, and third light emitting diodes 21R, 21G and 21B emit light. The white color light emission mode is a mode in which all of the first, second, and third light emitting diodes 21R, 21G and 21B emit light. Thus, the LED module 20 can obtain emitted light of any color by each of the light emitting diodes 21R, 21G, 21B. The white light can be obtained by simultaneously driving each light emitting diode 21R, 21G, and 21B.

[LED Driving Circuit]

Figure 2:
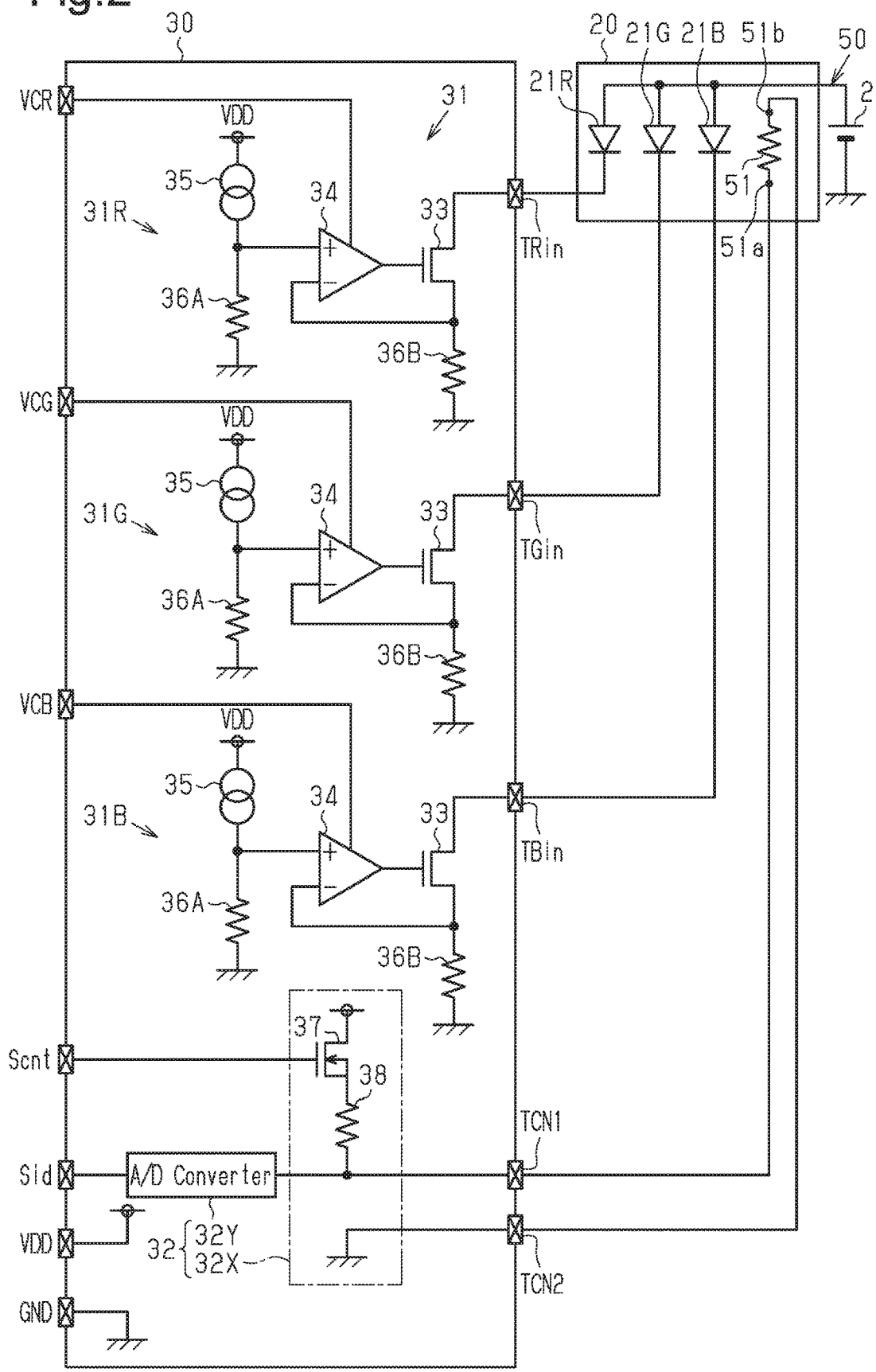
FIG. 2 is a circuit diagram of an LED module and an LED driving circuit.

The detailed circuit configuration of the LED driving circuit 30 will now be described with reference to FIG. 2.

The LED driving circuit 30 includes a power supply voltage terminal VDD, a ground terminal GND, a first signal terminal VCR, a second signal terminal VCG, a third signal terminal VCB, a first input terminal TRin, a second input terminal TGin, a third input terminal TBin, a detection output terminal TCN1, a detection input terminal TCN2, a control input terminal Scnt, and a control output terminal Sid.

Although not shown, the power supply voltage terminal VDD is electrically connected to the DC power supply 2. The ground terminal GND is connected to ground. A first drive signal for driving the first light emitting diode 21R is input from the control device 40 to the first signal terminal VCR (see FIG. 1). A second drive signal for driving the second light emitting diode 21G is input from the control device 40 to the second signal terminal VCG. A third drive signal for driving the third light emitting diode 21B is input from the control device 40 to the third signal terminal VCB. The first input terminal TRin is connected to a cathode of the first light emitting diode 21R. The second input terminal TGin is connected to a cathode of the second light emitting diode 21G. The third input terminal TBin is connected to a cathode of the third light emitting diode 21B. An anode of the first light emitting diode 21R, an anode of the second light emitting diode 21G, and an anode of the third light emitting diode 21B are connected to the DC power supply 2.

The detection output terminal TCN1 is connected to a first terminal 51a of the resistance element 51 of the identification unit 50. The detection input terminal TCN2 is connected to a second terminal 51b of the resistance element 51 and is connected to ground. A control signal for controlling the operation of the detector 32 is input from the control device 40 to the control input terminal Scnt. The control output terminal Sid is electrically connected to the control device 40, and outputs, to the control device 40, the detection result of the detector 32, that is, the characteristic information related to the color rank of the emitted light produced by each light emitting diode 21R, 21G, 21B.

The driving circuit 31 includes a first driving circuit 31R that supplies a first drive current to the first light emitting diode 21R, a second driving circuit 31G that supplies a second drive current to the second light emitting diode 21G, and a third driving circuit 31B that supplies a third drive current to the third light emitting diode 21B. The first drive current is generated based on the first drive signal, the second drive current is generated based on the second drive signal, and the third drive current is generated based on the third drive signal.

The first driving circuit 31R is a constant current circuit configured such that a preset first drive current flows to the first light emitting diode 21R. The first driving circuit 31R includes a transistor 33, an operational amplifier 34, a constant current source 35, a first resistor 36A, and a second resistor 36B. The first resistor 36A is, for example, 1 kΩ, and the second resistor 36B is, for example, 1Ω. An example of the first drive current is 100 mA.

The transistor 33 in the present embodiment is an N-type Metal Oxide Semiconductor Field Effect Transistor (MOSFET). A drain terminal of the transistor 33 is connected to the first input terminal TRin. That is, the drain terminal of the transistor 33 is connected to the cathode of the first light emitting diode 21R. A source terminal of the transistor 33 is connected to a constant potential side power supply wiring (e.g., power supply wiring to which 0 V is supplied) through the second resistor 36B. The first drive current flows to the first light emitting diode 21R when the transistor 33 is activated, and the first drive current does not flow to the first light emitting diode 21R when the transistor 33 is deactivated.

An output terminal of the operational amplifier 34 is connected to a gate terminal of the transistor 33. An inverted input terminal (−) of the operational amplifier 34 is connected to the source terminal of the transistor 33 and the first terminal of the second resistor 36B. That is, the voltage of the source terminal of the transistor 33 is fed back to the inverted input terminal (−) of the operational amplifier 34. A non-inverted input terminal (+) of the operational amplifier 34 is connected to the constant current source 35. A first terminal of the constant current source 35 is connected to a high potential side power supply wiring (wiring to which the power supply voltage VDD is supplied, hereinafter referred to as the power supply wiring VDD) of the LED driving circuit 30. A second terminal of the constant current source 35 is connected to the non-inverted input terminal (+) of the operational amplifier 34 and the first terminal of the first resistor 36A. The second terminal of the first resistor 36A is connected to ground. Therefore, a reference voltage Vref (e.g., Vref=0.1 V) is input to the non-inverted input terminal (+) of the operational amplifier 34. A positive power supply terminal of the operational amplifier 34 is connected to the first signal terminal VCR. That is, the first drive signal (PWM signal) from the control device 40 is input to the positive power supply terminal of the operational amplifier 34. The voltage of the signal for activating the transistor 33 in the first drive signal is larger than 0.1 V.

The operational amplifier 34 is activated/deactivated (operated/stopped) based on the first drive signal. The activated operational amplifier 34 activates the transistor 33. The transistor 33 is deactivated by the deactivation of the operational amplifier 34. The first drive signal is provided as a pulse-like signal from the control device 40 shown in FIG. 1. Therefore, the first driving circuit 31R intermittently activates and deactivates the transistor 33 based on the first drive signal. Then, as the DUTY value of the first drive signal increases, the period for activating the transistor 33 becomes longer. The on period of the transistor 33 corresponds to the amount of current (smoothened amount of current) flowing to the first light emitting diode 21R. Therefore, the first driving circuit 31R supplies the first light emitting diode 21R with current (first drive current) of an amount corresponding to the on period of the transistor 33, that is, the DUTY value of the first drive signal. A current limiting resistor may be added between the output terminal of the operational amplifier 34 and the gate terminal of the transistor 33.

The first resistor 36A and the second resistor 36B are set to a resistance ratio corresponding to the ratio of the current to be supplied to these resistors. Specifically, if the resistance value of the first resistor 36A is defined as RA, and the current flowing to the first resistor 36A is defined as IA, the resistance value of the second resistor 36B is defined as RB, and the current flowing to the second resistor 36B is defined as IB, when RA:RB=IB:IA, that is, IB=100 IA, RA=100 RB is set.

The second driving circuit 31G and the third driving circuit 31B are circuits having the same configuration as the first driving circuit 31R. Therefore, the circuit members included in the second driving circuit 31G and the third driving circuit 31B are denoted with the same reference numerals as the circuit members included in the first driving circuit 31R, and the description thereof will be omitted.

The detection circuit 32X includes a transistor 37 and a resistance element 38. The transistor 37 according to the present embodiment is an N-type MOSFET. A drain terminal of the transistor 37 is connected to the power supply voltage terminal VDD. A source terminal of the transistor 37 is connected to a first terminal of the resistance element 38. A gate terminal of the transistor 37 is connected to the control input terminal Scnt. Therefore, the operation of the transistor 37 is controlled by the control signal from the control device 40. The second terminal of the resistance element 38 is connected to the A/D converter 32Y and the detection output terminal TCN1. The A/D converter 32Y is connected to the control output terminal Sid.

When the transistor 37 is activated based on the control signal of the control device 40, the detection circuit 32X has a predetermined current flow to the resistance element 51. The detection circuit 32X outputs the voltage of the A/D converter 32Y when the current flows to the resistance element 51 to the A/D converter 32Y. The A/D converter 32Y digitally converts the voltage generated by the detection circuit 32X and outputs the converted voltage to the control device 40 through the control output terminal Sid.

The quality of each of the light emitting diodes 21R, 21G, 21B may vary depending on the conditions (temperature, humidity, etc.) in the manufacturing process. For example, the color rank of the emitted light of the first light emitting diode 21R manufactured in a predetermined lot may be different from the color rank of the emitted light of the first light emitting diode 21R manufactured in another lot.

The color rank of the emitted light of the first light emitting diode 21R shows, for example, a range obtained by dividing the range of greater than or equal to 600 nm and less than or equal to 700 nm, which is a wavelength range corresponding to red, by four. The color rank of the first light emitting diode 21R is classified based on the peak wavelength when a predetermined current is supplied to the first light emitting diode 21R. For example, the first light emitting diode 21R having a peak wavelength in the range of greater than or equal to 675 nm and less than or equal to 700 nm is set as "A rank". The first light emitting diode 21R having a peak wavelength in the range of greater than or equal to 650 nm and less than 675 nm is set as "B rank". The first light emitting diode 21R having a peak wavelength in the range of greater than or equal to 625 nm and less than 650 nm is set as "C rank". The first light emitting diode 21R having a peak wavelength in the range of greater than or equal to 600 nm and less than 625 nm is set as "D rank".

The color rank of the emitted light of the second light emitting diode 21G shows, for example, a range obtained by dividing the range of greater than or equal to 500 nm and less than 600 nm, which is a wavelength range corresponding to green, by four. The color rank of the second light emitting diode 21G is classified based on the peak wavelength when a predetermined current is supplied to the second light emitting diode 21G. For example, the second light emitting diode 21G having a peak wavelength in the range of greater than or equal to 575 nm and less than 600 nm is set as "A rank". The second light emitting diode 21G having a peak wavelength in the range of greater than or equal to 550 nm and less than 575 nm is set as "B rank". The second light emitting diode 21G having a peak wavelength in the range of greater than or equal to 525 nm and less than 550 nm is set as "C rank". The second light emitting diode 21G having a peak wavelength in the range of greater than or equal to 500 nm and less than 525 nm is set as "D rank".

The color rank of the emitted light of the third light emitting diode 21B shows, for example, a range obtained by dividing the range of greater than or equal to 400 nm and less than 500 nm, which is a wavelength range corresponding to blue, by four. The color rank of the third light emitting diode 21B is classified based on the peak wavelength when a predetermined current is supplied to the third light emitting diode 21B. For example, the third light emitting diode 21B having a peak wavelength in the range of greater than or equal to 475 nm and less than 500 nm is set as "A rank". The third light emitting diode 21B having a peak wavelength in the range of greater than or equal to 450 nm and less than 475 nm is set as "B rank". The third light emitting diode 21B having a peak wavelength in the range of greater than or equal to 425 nm and less than 450 nm is set as "C rank". The third light emitting diode 21B having a peak wavelength in the range of greater than or equal to 400 nm and less than 425 nm is set as "D rank".

Although the wavelength range of the first light emitting diode 21R is set to greater than or equal to 600 nm and less than or equal to 700 nm, the wavelength range of the first light emitting diode 21R may be set narrower than the above range. For example, the wavelength range of the first light emitting diode 21R may be set to greater than or equal to 650 nm and less than or equal to 700 nm. In this case, the first light emitting diode 21R may be classified into A rank to D rank in the wavelength range of greater than or equal to 650 nm and less than or equal to 700 nm. Furthermore, although the wavelength range of the second light emitting diode 21G is set to greater than or equal to 500 nm and less than 600 nm, the wavelength range of the second light emitting diode 21G may be set narrower than the above range. For example, the wavelength range of the second light emitting diode 21G may be set to greater than or equal to 520 nm and less than or equal to 570 nm. In this case, the second light emitting diode 21G may be classified into A rank to D rank in the wavelength range of greater than or equal to 520 nm and less than or equal to 570 nm. Moreover, although the wavelength range of the third light emitting diode 21B is set to greater than or equal to 400 nm and less than 500 nm, the wavelength range of the third light emitting diode 21B may be set narrower than the above range. For example, the wavelength range of the third light emitting diode 21B may be set to greater than or equal to 410 nm and less than or equal to 460 nm. In this case, the third light emitting diode 21B may be classified into A rank to D rank in the wavelength range of greater than or equal to 410 nm and less than or equal to 460 nm.

As described above, since the light emission colors (colors of the emitted light) of the light emitting diodes 21R, 21G, and 21B vary, the emitted light of the LED module 20, that is, the light (white light) in which the emitted lights of the light emitting diodes 21R, 21G, and 21B are combined also vary. In particular, if the white light varies, it is easier for humans to recognize than when light of other colors is varied. The color of the emitted light of the LED modules 20 that varies in such a manner is classified as a color rank.

Figure 3:
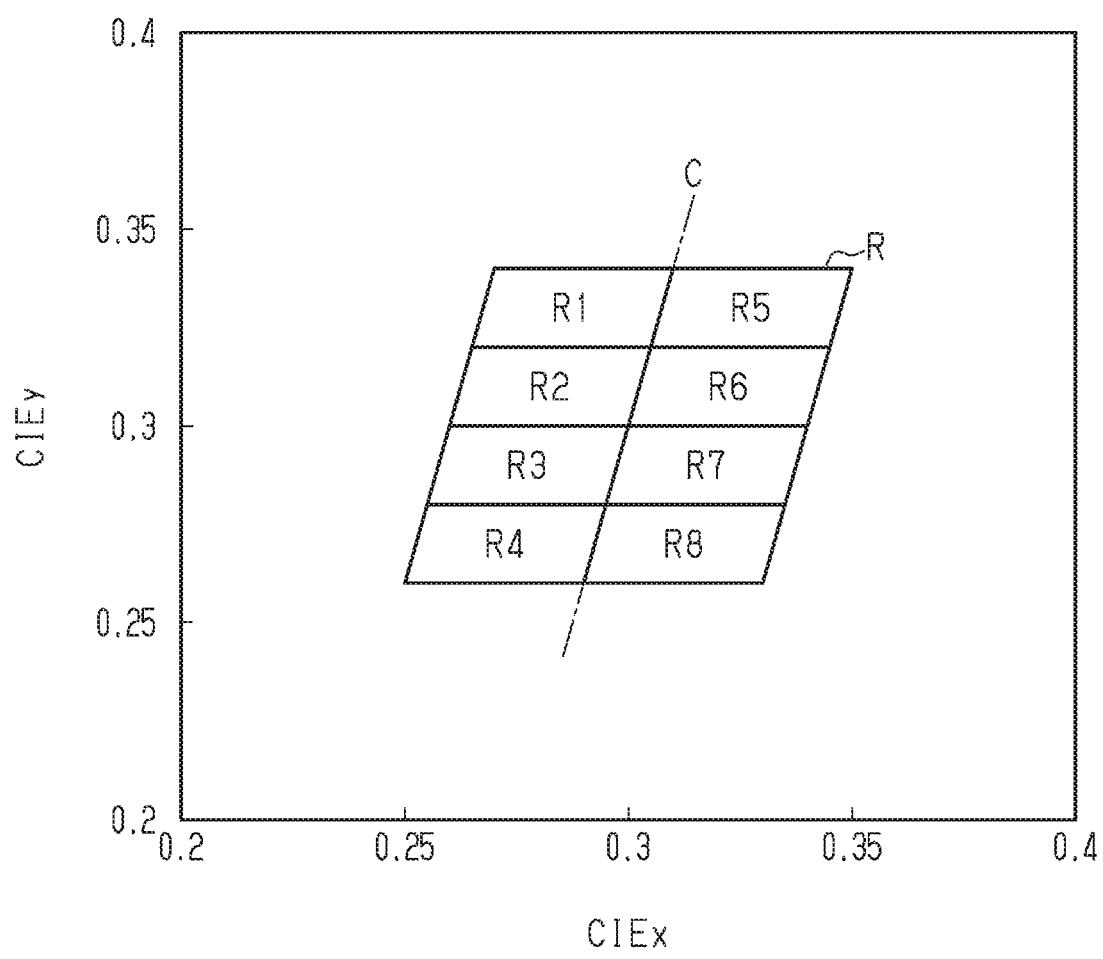
FIG. 3 is an xy chromaticity diagram showing color ranks of the emitted light of the LED module.

For example, the color rank of the emitted light is classified in the range shown in the xy chromaticity diagram as shown in FIG. 3. On an x-axis of FIG. 3, the ratio of red increases as the value increases, and the ratio of blue increases as the value decreases. On a y-axis of FIG. 3, the ratio of green increases as the value increases, and the ratio of blue increases as the value decreases.

Region R illustrated in FIG. 3 indicates the xy chromaticity of light obtained by combining the emitted light of each light emitting diode 21R, 21G, and 21B classified into the color ranks described above. Hereinafter, region R will now be described as a white region R. The white region R is a parallelogram region shown in FIG. 3. In the xy coordinate, the white region R has (x, y)=(0.25, 0.26), (0.25, 0.33), (0.27, 0.34), (0.35, 0.34) as each vertex, and (0.30, 0.30) as a standard value. This standard value is, for example, a white point.

The white region R is divided into the eight regions of a first region R1 to an eighth region R8. The first region R1 to the fourth region R4 are regions where the value of the x-axis is smaller than a center line C that equally divides the white region R into two on the x-axis. The first region R1 to the fourth region R4 are regions obtained by equally dividing the white region R that has been equally divided into two into four on the y-axis. The first region R1 is a region where the value of the y axis is the largest. The fourth region R4 is a region where the value of the y axis is the smallest. The second region R2 is a region where the value of the y axis is smaller than the first region R1 and larger than the third region R3. The third region R3 is a region where the value of the y axis is smaller than the second region R2 and larger than the fourth region R4. The fifth region R5 to the eighth region R8 are regions where the value of the x axis is larger than the center line C in the white region R. The fifth region R5 to the eighth region R8 are regions obtained by equally dividing the white region R that has been equally divided into two into four on the y-axis. The fifth region R5 is a region where the value of the y axis is the largest, and is a region adjacent to the first region R1 in the x axis. The eighth region R8 is a region where the value of the y axis is the smallest, and is a region adjacent to the fourth region R4 in the x axis. The sixth region R6 is a region where the value of the y axis is smaller than the fifth region R5 and larger than the seventh region R7, and is a region adjacent to the second region R2 in the x axis. The seventh region R7 is a region where the value of the y axis is smaller than the sixth region R6 and larger than the eighth region R8, and is a region adjacent to the third region R3 in the x axis.

As shown in the white region R, as the color of the emitted light of the LED module 20 varies, it is preferable to control the light emission of each light emitting diode 21R, 21G, 21B such that a predetermined region of the first to eighth regions R1 to R8 becomes white to reduce the variation. The predetermined region may be one of the first to eighth regions R1 to R8, or may include a plurality of adjacent regions.

For example, in when the light emission of each light emitting diode 21R, 21G, 21B is controlled so as to become white in the third region R3, if each light emitting diode 21R, 21G, 21B emits light in white in the first region R1, the current value of the third light emitting diode 21B may be increased and the current values of the first light emitting diode 21R and the second light emitting diode 21G may be decreased. Thus, if which of the first to eighth regions R1 to R8 is the color of the emitted light when a predetermined current flows to each of the light emitting diodes 21R, 21G, and 21B can be recognized, the emitted light of a color of a predetermined region can be obtained by adjusting the amount of current of each light emitting diode 21R, 21G, and 21B (amount of current of the first, second, and third drive currents).

From the combination of a color rank of the emitted light of the first light emitting diode 21R, a color rank of the emitted light of the second light emitting diode 21G, and a color rank of the emitted light of the third light emitting diode 21B, the one of the first to eighth regions R1 to R8 of the color of the emitted light produced by each of the light emitting diodes 21R, 21G, 21B is located in the white region R can be recognized in advance through tests or the like. That is, if the combination of the color ranks of the emitted light of each light emitting diode 21R, 21G, 21R can be determined, the region of the white region R in which the color of the emitted light produced by each light emitting diode 21R, 21G, 21B is located can be recognized without emitting light from the light emitting diodes 21R, 21G, 21B. In the present embodiment, for each of the combinations of the color rank of the emitted light of each light emitting diode 21R, 21G, 21B, which one of the first to eighth regions R1 to R8 is the color of the emitted light when a predetermined amount of current (e.g., standard amount of current) flows to each of the light emitting diodes 21R, 21G, and 21B can be recognized in advance through tests or the like. Information as to which of the first to eighth regions R1 to R8 is the color of the emitted light is quantitatively shown by the resistance value (characteristic value of the passive element) of the resistance element 51 of the identification unit 50 as the characteristic information related to the color rank. Table 1 is a table showing the relationship between the first to eighth regions R1 to R8 and the resistance values X1 to X8 of the resistance element 51. Preferably, the range between the minimum value and the maximum value of the resistance values X1 to X8 of the resistance element 51 is set in the range of greater than or equal to 100Ω and less than or equal to 10Ω.

TABLE 1

| Resistance value of resistance element | White region |
|---|---|
| X1 | R1 |
| X2 | R2 |
| X3 | R3 |
| X4 | R4 |
| X5 | R5 |
| X6 | R6 |
| X7 | R7 |
| X8 | R8 |

The combination of the resistance value and the region shown in Table 1 is stored, for example, in the storage 42 of the control device 40. The adjacent resistance values among the resistance values X1 to X8 are preferably set to a value at which the resistance value of the resistance element 51 can be identified by the voltage acquired by the detection circuit 32X when current is supplied to the resistance element 51. In the present embodiment, adjacent resistance values among the resistance values X1 to X8 are set to be different from each other so that the difference in voltage acquired by the detection circuit 32X becomes a predetermined value (e.g., 0.1 V or more) by the resistance value.

As described above, the LED module 20 has the information related to which one of the first to eighth regions R1 to R8 is the color of the emitted light obtained as a predetermined amount of current flows to each of the light emitting diodes 21R, 21G, and 21B. Then, the control device 40 acquires the resistance value of the resistance element 51 of the identification unit 50 through the LED driving circuit 30, whereby the characteristic information related to the color rank of the LED module 20 can be acquired from the resistance value of the resistance element 51 based on the combination of the resistance value and the region shown in Table 1.

Under such circumstances, in the LED driving system 1 according to the present embodiment, a setting process of setting the amount of current to supply to each light emitting diode 21R, 21G, 21B (amount of current of first, second, and third drive currents) is executed such that the color of the emitted light produced by each light emitting diode 21R, 21G, 21B becomes the desired white color.

Figure 4:
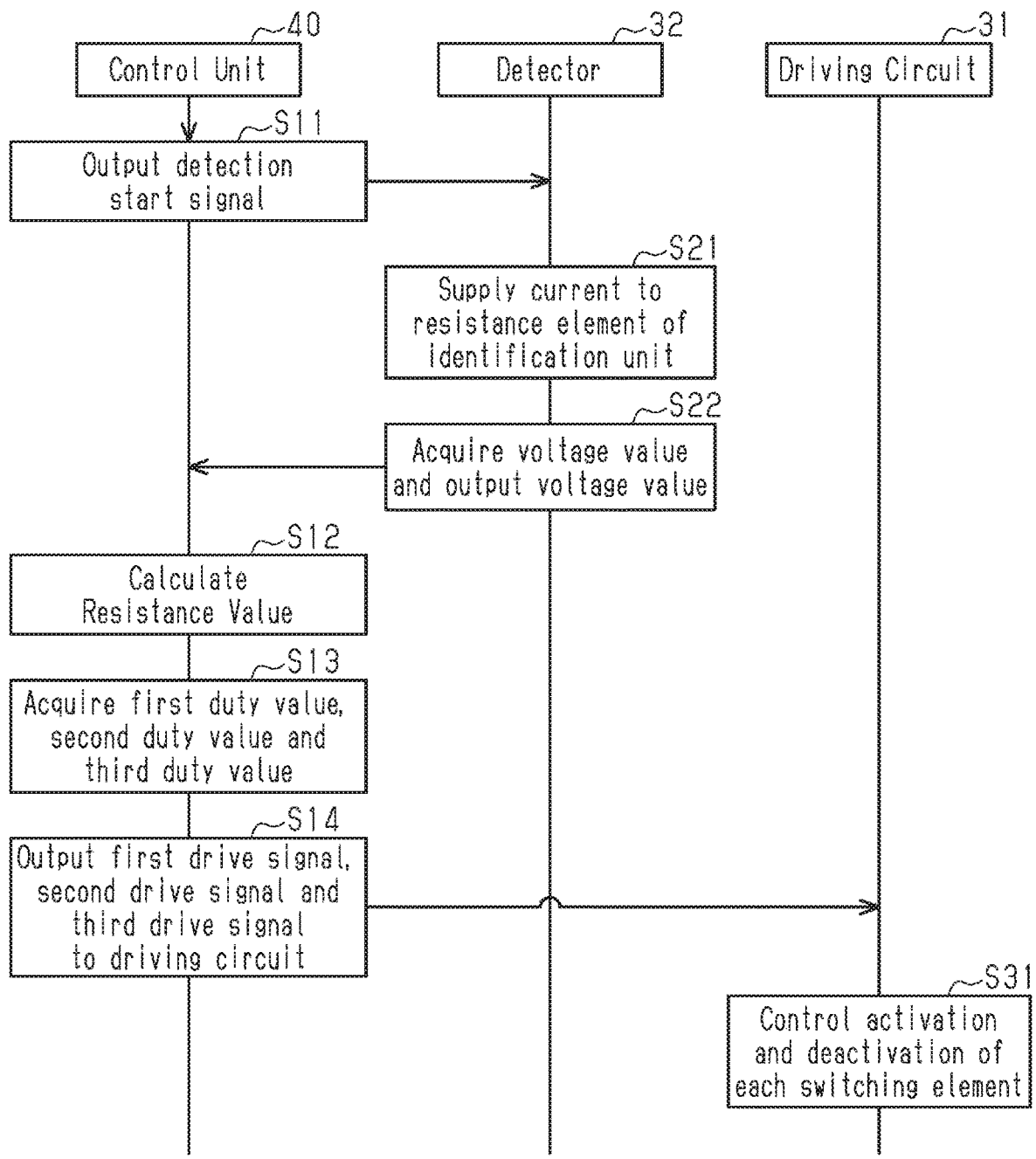
FIG. 4 is a sequence diagram showing a procedure for driving the LED module.

The setting process is executed through a procedure according to a sequence shown in FIG. 4. The setting process is executed, for example, once before the LED module 20 emits light for the first time. In FIG. 4, the setting process includes processes of steps S11 to S14 executed by the control device 40, processes of steps S21 and S22 performed by the detector 32 (see FIG. 2), and process of step S31 performed in the driving circuit 31.

In step S11, the control device 40 outputs a detection start signal to the detector 32. The detection start signal is input to the gate of the transistor 37 (both shown in FIG. 2) of the detection circuit 32X. Since the transistor 37 is thus activated, in step S21, the detection circuit 32X supplies current to the resistance element 51 (see FIG. 2) of the identification unit 50. In step S22, the A/D converter 32Y (see FIG. 2) then outputs the output value (voltage value) of the A/D converter 32Y to the control device 40. In step S12, the control device 40 that received the voltage value calculates the resistance value of the resistance element 51. Then, in step S13, the control device 40 obtains a first DUTY value for driving and controlling the first light emitting diode 21R (see FIG. 2), a second DUTY value for driving and controlling the second light emitting diode 21G (see FIG. 2) and a third DUTY value for driving and controlling the third light emitting diode 21B (see FIG. 2) from the calculated resistance value. For example, the storage 42 (see FIG. 1) of the control device 40 stores, in advance, a table showing the relationship between the resistance value of the resistance element 51 and the DUTY value of each light emitting diode 21R, 21G, 21B as shown in Table 2. A table showing combinations of the resistance value of the resistance element 51 and each DUTY value of each light emitting diode 21R, 21G, 21B shown in Table 2 is determined in advance through tests or the like. The control device 40 obtains the first DUTY value, the second DUTY value, and the third DUTY value based on the combination of the resistance value and each DUTY value shown in Table 2 from the calculated resistance value.

The output value (voltage value) of the A/D converter 32Y corresponds to the resistance value of the resistance element 51 included in the identification unit 50. Therefore, a table in which the voltage value and the DUTY value are associated may be stored in the storage 42 (see FIG. 1), and each DUTY value may be obtained from the voltage value using the table. Furthermore, the DUTY value may be calculated from the resistance value or the voltage value by an arithmetic circuit or an arithmetic program.

TABLE 2

| Resistance value of resistance element | DUTY value | | |
|---|---|---|---|
| | 1st DUTY value (R) | 2nd DUTY value (G) | 3rd DUTY value (B) |
| X1 | DRA | DGA | DBA |
| X2 | DRB | DGB | DBB |
| X3 | DRC | DGC | DBC |
| X4 | DRD | DGD | DBD |
| X5 | DRE | DGE | DBE |
| X6 | DRF | DGF | DBF |
| X7 | DRG | DGG | DBG |
| X8 | DRH | DGH | DBH |

In step S14, the control device 40 generates a first drive signal based on the first DUTY value, generates a second drive signal based on the second DUTY value, and generates a third drive signal based on the third DUTY value as a control signal for controlling the driving circuit 31. Then, the control device 40 outputs the first to third drive signals to the driving circuit 31. The first drive signal is input to the positive power supply terminal of the operational amplifier 34 of the first driving circuit 31R (both shown in FIG. 2) through the first signal terminal VCR of the LED driving circuit 30. The second drive signal is input to the positive power supply terminal of the operational amplifier 34 of the second driving circuit 31G (both shown in FIG. 2) through the second signal terminal VCG of the LED driving circuit 30. The third drive signal is input to the positive power supply terminal of the operational amplifier 34 of the third driving circuit 31B (both shown in FIG. 2) through the third signal terminal VCB of the LED driving circuit 30. Thus, in step S31, the first to third driving circuits 31R, 31G, and 31B activate and deactivate the transistors 33 (see FIG. 2). As a result, the first driving circuit 31R generates the first drive current corresponding to the first DUTY value, and supplies the first drive current to drive the first light emitting diode 21R. The second driving circuit 31G generates the second drive current corresponding to the second DUTY value, supplies the second drive current to drive the second light emitting diode 21G. The third driving circuit 31B generates the third drive current corresponding to the third DUTY value, and supplies the third drive current to drive the third light emitting diode 21B. The color of the emitted light produced by each light emitting diode 21R, 21G, 21B thus becomes a desired white color.

Each DUTY value of each light emitting diode 21R, 21G, and 21B shown in Table 2 is a value adjusted so that the color of the emitted light emitted of the LED module 20 is within a region (e.g., second region R2) set in advance of the first to eighth regions R1 to R8. For example, a drive current corresponding to a drive signal based on the DUTY value (DRA, DGA, DBA) shown in Table 2 is supplied to the LED module 20 in which the color of the emitted light resulting from the standard current is included in the first region R1. The LED module 20 driven in this manner emits light of the color included in the second region R2.

[Effects]

The present embodiment has the following advantages.

(1) The resistance element 51 of the identification unit 50 has a resistance value (characteristic value) corresponding to the light emission characteristics of the first, second, and third light emitting diodes 21R, 21G, and 21B. Therefore, the resistance value of the resistance element 51 is read out from the LED module 20 by the detector 32, and the LED driving circuit 30 supplies current corresponding to the resistance value to the LED module 20, so that color unevenness of the emitted light produced by each of the light emitting diodes 21R, 21G, 21B is reduced, and light of a desired color is obtained. Then, the resistance value of the resistance element 51 accommodated in the LED module 20 is merely read out, and an operation in which the technician adjusts the color of the emitted light produced by each of the light emitting diodes 21R, 21G, 21B to a desired color becomes unnecessary. Therefore, light of a desired color can be easily obtained. Furthermore, even when changing the color to be light emitted by each light emitting diode 21R, 21G, 21B due to change in design, and the like after a desired color is obtained, each DUTY value of each light emitting diode 21R, 21G, 21B is changed according to the light emission characteristic obtained from the identification unit 50. The desired color thus can be easily produced. Thus, for example, fine adjustment of the design can be easily executed.

In the present embodiment, the detector 32 detects the characteristic information related to the color rank of the emitted light produced by each light emitting diode 21R, 21G, and 21B from the resistance element 51. Thus, the quantitative information related to the color rank of the emitted light produced by each light emitting diode 21R, 21G, and 21B can be acquired. Then, according to the information, the first drive current is supplied to the first light emitting diode 21R, the second drive current is supplied to the second light emitting diode 21G, and the third drive current is supplied to the third light emitting diode 21B. Thus, the color unevenness of the emitted light produced by each light emitting diode 21R, 21G, 21B is reduced, and the light of a desired color is obtained.

(2) According to the LED driving system 1, the detector 32 detects a voltage value through the resistance element 51 of the identification unit 50, and the control device 40 calculates the resistance value of the resistance element 51 based on the voltage value. The control device 40 acquires the DUTY value of each of the light emitting diodes 21R, 21G, and 21B from the resistance value, and controls the driving circuit 31 based on the DUTY values. Thus, the color of the emitted light produced by each light emitting diode 21R, 21G, 21B is automatically adjusted by the control device 40 to be a desired color. Therefore, the operation in which the technician adjusts the color of the emitted light produced by each of the light emitting diodes 21R, 21G and 21B to a desired color becomes unnecessary. Furthermore, color unevenness of the emitted light produced by each of the light emitting diodes 21R, 21G, 21B can be reduced.

(3) The characteristic information related to the color rank of the emitted light produced by each of the light emitting diodes 21R, 21G, and 21B can be detected as current is supplied to the resistance element 51 by the detection circuit 32X. Therefore, the characteristic information can be easily detected by the detection circuit 32X.

(4) The resistance value of the resistance element 51 is set in the range of greater than or equal to 100Ω and less than or equal to 10Ω. Thus, if the resistance value is within the above range, the resistance value can be read out without any problem by the detection circuit 32X. Furthermore, the value of the resistance value corresponding to each color rank can be determined such that the difference between the resistance values is sufficiently large. Thus, the value of the resistance value corresponding to a different color rank can be prevented from becoming a close value. As a result, the color rank can be reliably identified.

(5) The LED module 20 is obtained by integrating each light emitting diode 21R, 21G, 21B and the identification unit 50 into one package. Thus, compared with when the LED module 20 and the identification unit 50 are provided separately, the number of components of the LED driving device 10 and the LED driving system 1 can be reduced.

(6) As indicated in the table showing the combinations of the resistance values and the regions shown in Table 1 and the relationships of the resistance values and the DUTY values of the light emitting diodes 21R, 21G and 21B shown in Table 2, the resistance values X1 to X8 of the resistance element 51 are prepared according to the first to eighth regions R1 to R8 of the white region R. Thus, compared with when the resistance value of the resistance element 51 is prepared according to the combination of each color rank of each light emitting diode 21R, 21G, 21B, the type of resistance value of the resistance element 51 can be reduced. Therefore, the resistance element 51 of the identification unit 50 can be easily set.

[LED Module]

Figure 5:
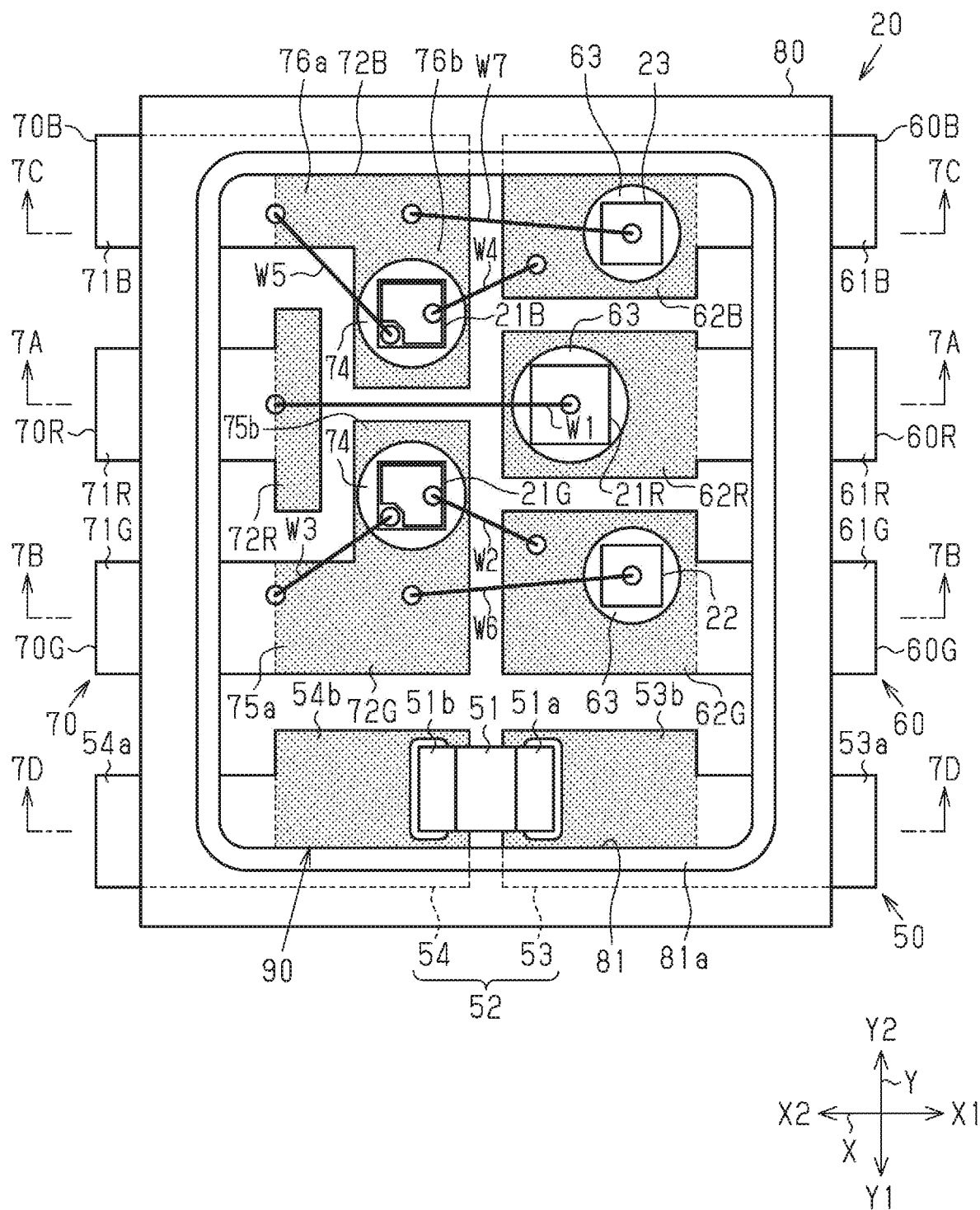
FIG. 5 is a plan view of the LED module.

Next, the detailed configuration of the LED module 20 will now be described with reference to FIGS. 5, 6, and 7A to 7D. In the following description, the horizontal direction of the LED module 20 in the plan view of the LED module 20 of FIG. 5 is defined as a "first direction X", and the vertical direction of the LED module 20, that is, the direction orthogonal to the first direction X in the plan view of the LED module 20 is defined as a "second direction Y". Furthermore, the height direction of the LED module 20, that is, the direction orthogonal to both the first direction X and the second direction Y is defined as a "third direction Z". In FIG. 5, the shaded portions indicate portions where the plate thickness of the lead is thin.

As shown in FIG. 5, the LED module 20 includes the first light emitting diode 21R, the second light emitting diode 21G, the third light emitting diode 21B, the identification unit 50, an anode side lead 60, which is an example of an anode side electrode, a cathode side lead 70, which is an example of a cathode side electrode, a case 80, which is an example of a support member, and a sealing resin 90 (see FIG. 7A), which is an example of a protective member. Furthermore, the LED module 20 further includes a first Zener diode 22 for avoiding an excessive reverse voltage from being applied to the second light emitting diode 21G, and a second Zener diode 23 for avoiding an excessive reverse voltage from being applied to the third light emitting diode 21B.

The case 80 supports the first light emitting diode 21R, the second light emitting diode 21G, the third light emitting diode 21B, the first Zener diode 22, the second Zener diode 23, the identification unit 50, the anode side lead 60, and the cathode side lead 70. More specifically, the case 80 accommodates each of the light emitting diodes 21R, 21G, 21B, the Zener diodes 22, 23, the identification unit 50, the anode side lead 60, and the cathode side lead 70. The case 80 has a rectangular shape in which the second direction Y is a longitudinal direction in a plan view. The case 80 is formed of, for example, white epoxy resin. The outer dimension of the case 80 in the first direction X is, for example, 3.1 mm, and the outer dimension of the case 80 in the second direction Y is, for example, 3.8 mm. The outer dimension of the case 80 in the third direction Z is, for example, 0.6 mm.

An opening 81 filled with the sealing resin 90 is formed in the case 80. The first light emitting diode 21R, the second light emitting diode 21G, the third light emitting diode 21B, the first Zener diode 22, the second Zener diode 23, and the resistance element 51 of the identification unit 50 are arranged in the opening 81. An inner side surface 81a of the peripheral wall forming the opening 81 is inclined such that the opening area increases in the third direction Z toward the opening side end (see FIGS. 7A to 7D). The inner side surface 81a of the peripheral wall functions as a reflector that reflects the light of each of the light emitting diodes 21R, 21G, and 21B.

The opening 81 is filled with the sealing resin 90 the to seal the first light emitting diode 21R, the second light emitting diode 21G, the third light emitting diode 21B, the first Zener diode 22, the second Zener diode 23, and the resistance element 51 in the case 80. The sealing resin 90 is a translucent member that covers the light emitting diodes 21R, 21G, and 21B. The sealing resin 90 is formed of, for example, a transparent epoxy resin or a silicone resin.

The anode side lead 60 is a terminal of the LED module 20 and forms an anode side terminal of each light emitting diode 21R, 21G, 21B. The anode side lead 60 is located closer to one side (X1 side in FIG. 5) of the case 80 in the first direction X. The anode side lead 60 is formed from, for example, copper, nickel, or an alloy thereof. The anode side lead 60 includes a first anode side lead 60R, which is an example of a first anode side electrode connected to the anode of the first light emitting diode 21R, a second anode side lead 60G, which is an example of a second anode side electrode connected to the anode of the second light emitting diode 21G, and a third anode side lead 60B, which is an example of a third anode side electrode connected to the anode of the third light emitting diode 21B. The first anode side lead 60R, the second anode side lead 60G, and the third anode side lead 60B are arranged spaced apart by predetermined intervals in the second direction Y. The second anode side lead 60G is located on one side (Y1 side in FIG. 5) of the first anode side lead 60R in the second direction Y, and the third anode side lead 60B is located on the other side (Y2 side in FIG. 5) of the first anode side lead 60R.

Figure 6:
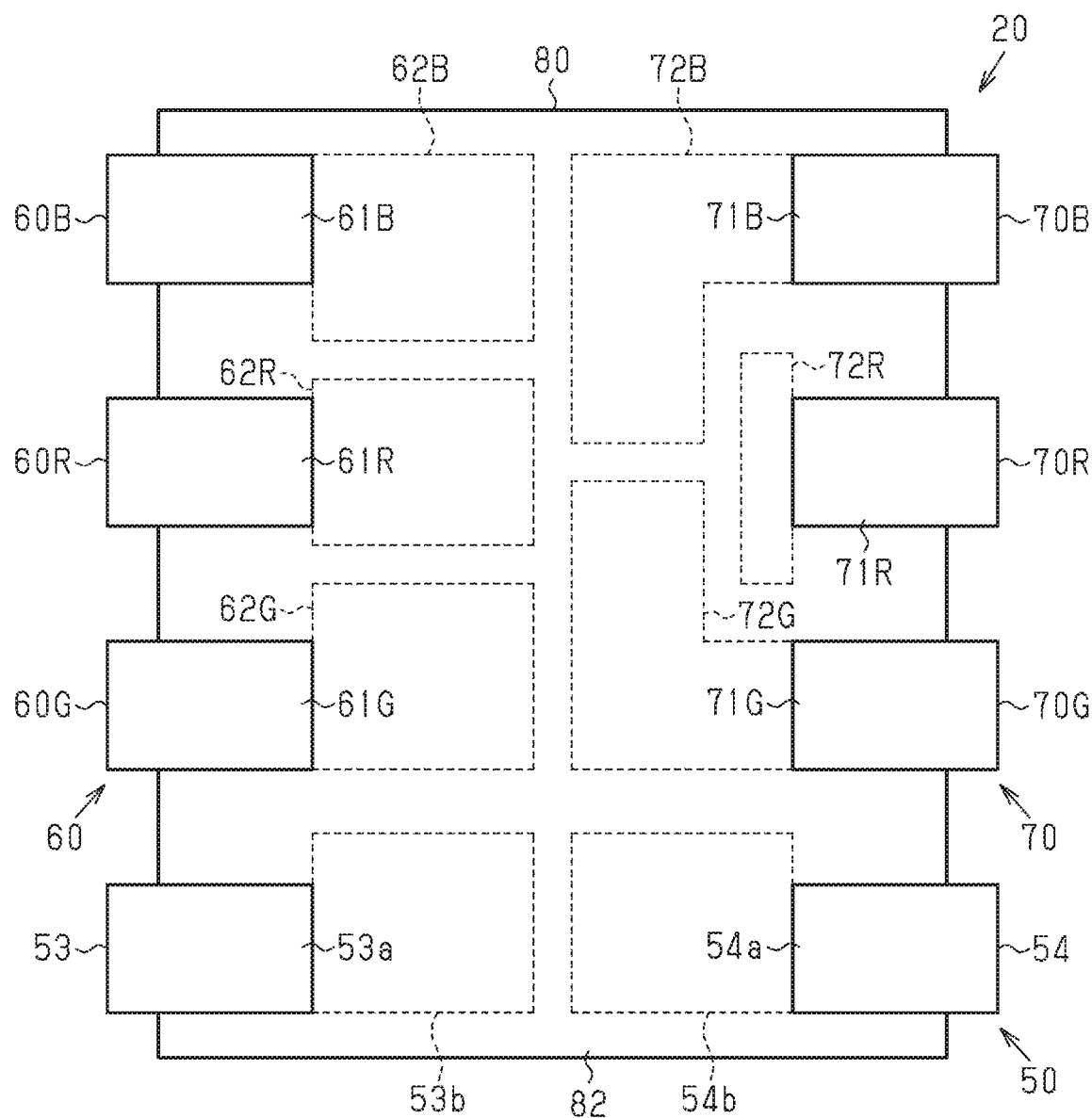
FIG. 6 is a bottom view of the LED module.
Figure 6:
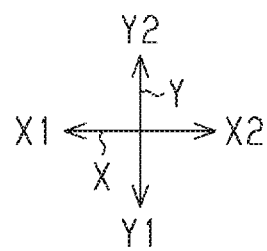

The first anode side lead 60R extends in the first direction X. The first anode side lead 60R includes a first anode terminal 61R and a first anode support 62R. The first anode terminal 61R and the first anode support 62R are integrally formed by a single member. The first anode terminal 61R is located closer to the outer side of the case 80 in the first direction X. The distal end of the first anode terminal 61R projects out of the case 80 in the second direction Y. As shown in FIG. 6, the entire first anode terminal 61R is exposed from a back surface 82 of the case 80.

Figure 7A:
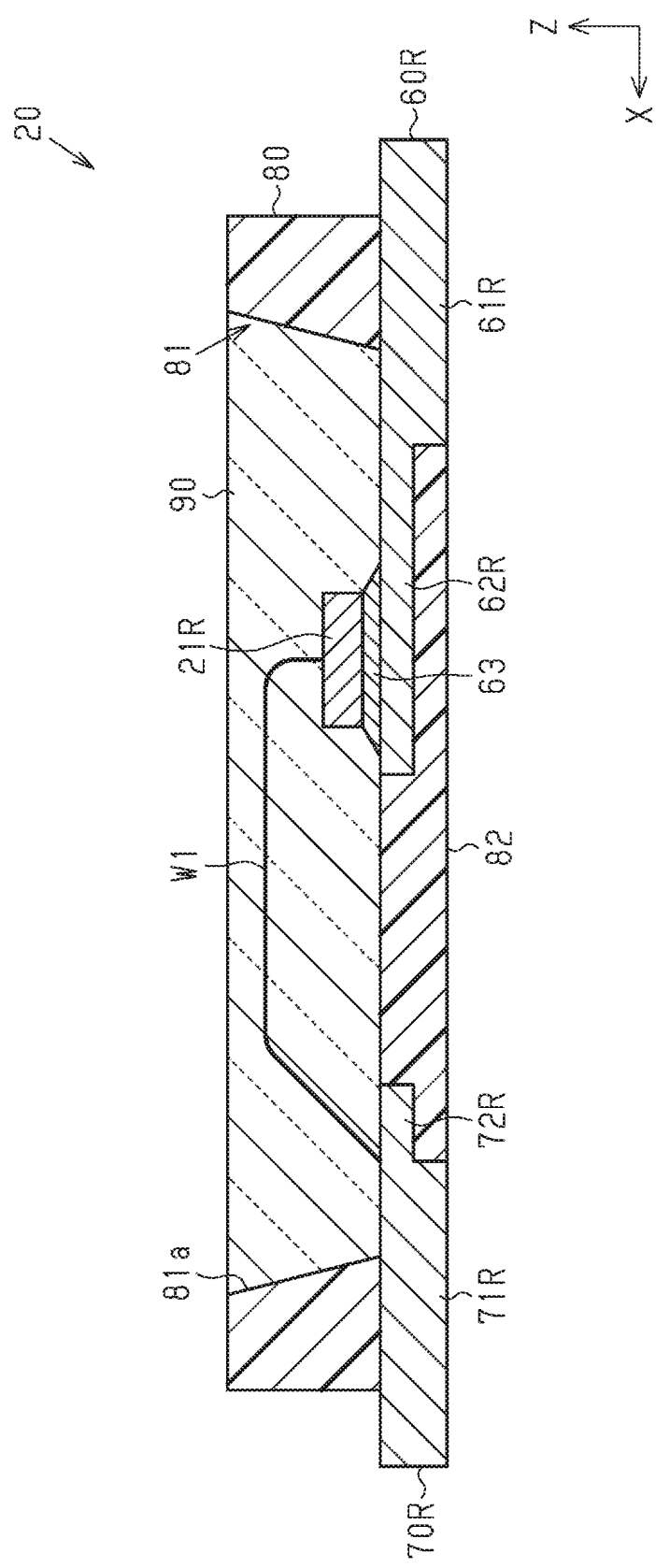
FIG. 7A is a cross-sectional view taken along line 7A-7A in FIG. 5.

As shown in FIG. 5, the first anode support 62R is a shaded portion of the first anode side lead 60R. The first anode support 62R is located further inward in the case 80 than the first anode terminal 61R. The width (dimension in the second direction Y) of the first anode support 62R is larger than the width (dimension in the second direction Y) of the first anode terminal 61R. As shown in FIG. 7A, the thickness of the first anode support 62R is thinner than the thickness of the first anode terminal 61R. In the third direction Z, the position of the surface of the first anode support 62R and the position of the surface of the first anode terminal 61R are equal to each other.

As shown in FIGS. 5 and 7A, the first anode support 62R supports the first light emitting diode 21R. More specifically, the first light emitting diode 21R is mounted on the surface of the first anode support 62R by way of a conductive bonding material 63. For example, silver paste or solder is used as the conductive bonding material 63. The first light emitting diode 21R is located closer to the distal end of the first anode support 62R in the first direction X.

As shown in FIG. 5, the second anode side lead 60G extends in the first direction X. The dimension in the first direction X of the second anode side lead 60G is equal to the dimension in the first direction X of the first anode side lead 60R. The second anode side lead 60G includes a second anode terminal 61G and a second anode support 62G. The second anode terminal 61G and the second anode support 62G are integrally formed by a single member. The second anode terminal 61G is located closer to the outer side of the case 80 in the first direction X. The distal end of the second anode terminal 61G projects to the outside from the case 80 in the first direction X. As shown in FIG. 6, the entire second anode terminal 61G is exposed from the back surface 82 of the case 80. In the first direction X, the position of the second anode terminal 61G is equal to the position of the first anode terminal 61R.

Figure 7B:
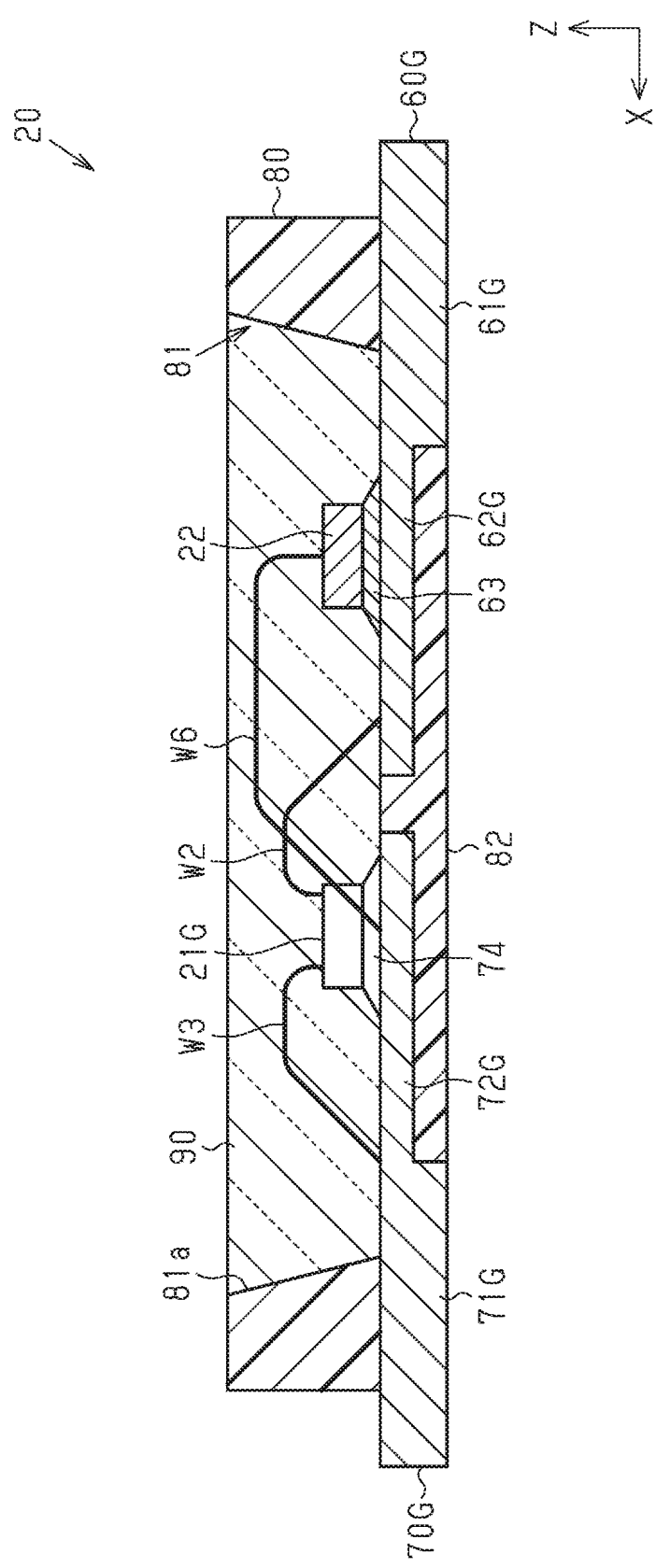
FIG. 7B is a cross-sectional view taken along line 7B-7B in FIG. 5.

As shown in FIG. 5, the second anode support 62G is a shaded portion of the second anode side lead 60G. The second anode support 62G is located further toward the inner side of the case 80 than the second anode terminal 61G. In the first direction X, the position of the second anode support 62G is equal to the position of the first anode support 62R. The width (dimension in the second direction Y) of the second anode support 62G is larger than the width (dimension in the second direction Y) of the second anode terminal 61G. Specifically, the second anode support 62G projects toward the first anode support 62R from the second anode terminal 61G. The second anode support 62G does not project toward the side opposite to the first anode support 62R from the second anode terminal 61G. In the second direction Y, the distance between the second anode support 62G and the first anode support 62R is shorter than the distance between the second anode terminal 61G and the first anode terminal 61R. As shown in FIG. 7B, the thickness of the second anode support 62G is thinner than the thickness of the second anode terminal 61G. In the third direction Z, the position of the surface of the second anode support 62G and the position of the surface of the second anode terminal 61G are equal to each other. The thickness of the second anode support 62G is equal to the thickness of the first anode support 62R (see FIG. 7A). The thickness of the second anode terminal 61G is equal to the thickness of the first anode terminal 61R (see FIG. 7A).

As shown in FIGS. 5 and 7B, the second anode support 62G supports the first Zener diode 22. More specifically, the first Zener diode 22 is mounted on the surface of the second anode support 62G by way of the conductive bonding material 63. The first Zener diode 22 is located closer to the second anode terminal 61G of the second anode support 62G in the first direction X, and closer to the first anode support 62R of the second anode support 62G in the second direction Y.

As shown in FIG. 5, the third anode side lead 60B extends in the first direction X. The dimension in the first direction X of the third anode side lead 60B is equal to the dimension in the first direction X of the first anode side lead 60R. In the second direction Y, the portion on the other side (Y2 side in FIG. 5) in the second direction Y of the third anode side lead 60B overlaps the peripheral wall that forms the opening 81 of the case 80. The third anode side lead 60B includes a third anode terminal 61B and a third anode support 62B. The third anode terminal 61B and the third anode support 62B are integrally formed by a single member. The third anode terminal 61B is located closer to the outer side of the case 80 in the first direction X. The distal end of the third anode terminal 61B projects to the outside from the case 80 in the first direction X. As shown in FIG. 6, the entire third anode terminal 61B is exposed from the back surface 82 of the case 80. In the first direction X, the position of the third anode terminal 61B is equal to the position of the first anode terminal 61R.

Figure 7C:
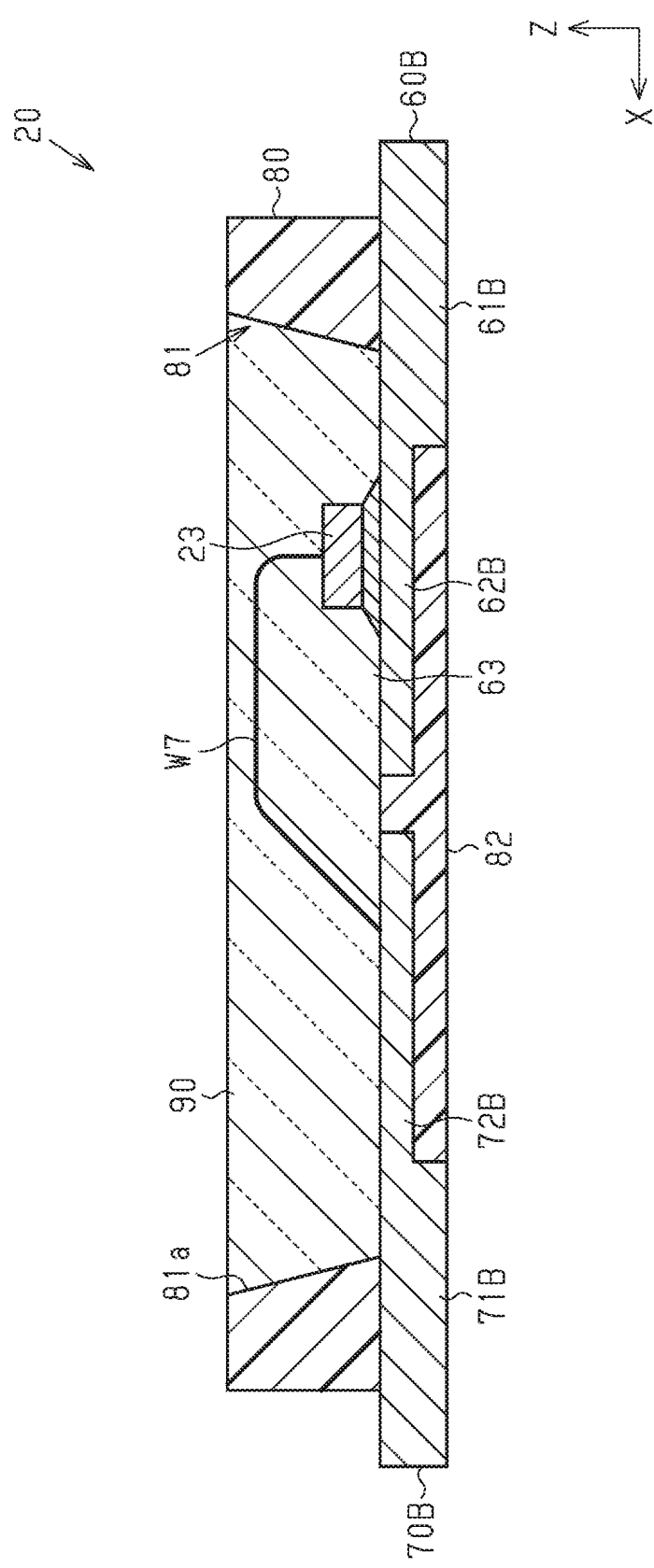
FIG. 7C is a cross-sectional view taken along line 7C-7C in FIG. 5.

As shown in FIG. 5, the third anode support 62B is a shaded portion in the third anode side lead 60B. The third anode support 62B is located further toward the inner side of the case 80 than the third anode terminal 61B. In the first direction X, the position of the third anode support 62B is equal to the position of the first anode support 62R. The width (dimension in the second direction Y) of the third anode support 62B is larger than the width (dimension in the second direction Y) of the third anode terminal 61B. Specifically, the third anode support 62B projects toward the first anode support 62R from the third anode terminal 61B. The third anode support 62B does not project toward the side opposite to the first anode support 62R from the third anode terminal 61B. In the second direction Y, the distance between the third anode support 62B and the first anode support 62R is shorter than the distance between the third anode terminal 61B and the first anode terminal 61R. As shown in FIG. 7C, the thickness of the third anode support 62B is thinner than the thickness of the third anode terminal 61B. In the third direction Z, the position of the surface of the third anode support 62B and the position of the surface of the third anode terminal 61B are equal to each other. The thickness of the third anode support 62B is equal to the thickness of the first anode support 62R (see FIG. 7A). The thickness of the third anode terminal 61B is equal to the thickness of the first anode terminal 61R (see FIG. 7A).

As shown in FIGS. 5 and 7C, the third anode support 62B supports the second Zener diode 23. More specifically, the second Zener diode 23 is mounted on the surface of the third anode support 62B by way of the conductive bonding material 63. The second Zener diode 23 is located closer to the third anode terminal 61B of the third anode support 62B in the first direction X, and closer to the first anode support 62R of the third anode support 62B in the second direction Y.

As shown in FIG. 5, the cathode side lead 70 is a terminal of the LED module 20, and forms a cathode side terminal of each of the light emitting diodes 21R, 21G, 21B. The cathode side lead 70 is located closer to the other side (X2 side in FIG. 5) of the case 80 in the first direction X. The cathode side lead 70 is formed from, for example, copper, nickel, or an alloy thereof. The cathode side lead 70 includes a first cathode side lead 70R, which is an example of a first cathode side electrode connected to the cathode of the first light emitting diode 21R, a second cathode side lead 70G, which is an example of a second cathode side electrode connected to the cathode of the second light emitting diode 21G, and a third cathode side lead 70B, which is an example of a third cathode side electrode connected to the cathode of the third light emitting diode 21B. The first cathode side lead 70R, the second cathode side lead 70G, and the third cathode side lead 70B are arranged spaced apart by intervals in the second direction Y. The second cathode side lead 70G is located on one side (Y1 side in FIG. 5) of the first cathode side lead 70R in the second direction Y, and the third cathode side lead 70B is located on the other side (Y2 side in FIG. 5) of the first cathode side lead 70R.

The first cathode side lead 70R extends in the first direction X. The first cathode side lead 70R is T-shaped in a plan view. The first cathode side lead 70R includes a first cathode terminal 71R and a first cathode support 72R. The first cathode terminal 71R and the first cathode support 72R are integrally formed by a single member. The first cathode terminal 71R is located closer to the outer side of the case 80 in the first direction X. A distal end of the first cathode terminal 71R projects to the outside from the case 80 in the first direction X. As shown in FIG. 6, the entire first cathode terminal 71R is exposed from the back surface 82 of the case 80. In the second direction Y, the position of the first cathode terminal 71R is equal to the position of the first anode terminal 61R.

As shown in FIG. 5, the first cathode support 72R is a shaded portion of the first cathode side lead 70R. The first cathode support 72R is located further toward the inner side of the case 80 than the first cathode terminal 71R. The first cathode support 72R is shaped to project from both sides of the first cathode terminal 71R in the second direction Y. Thus, the width (dimension in the second direction Y) of the first cathode support 72R is larger than the width (width in the second direction Y) of the first cathode terminal 71R. As shown in FIG. 7A, the thickness of the first cathode support 72R is thinner than the thickness of the first cathode terminal 71R. In the third direction Z, the position of the surface of the first cathode support 72R and the position of the surface of the first cathode terminal 71R are equal to each other.

The second cathode side lead 70G is L-shaped in a plan view. The maximum dimension in the first direction X of the second cathode side lead 70G is larger than the maximum dimension in the first direction X of the first cathode side lead 70R, and the maximum dimension in the second direction Y of the second cathode side lead 70G is larger than the maximum dimension in the second direction Y of the first cathode side lead 70R. The second cathode side lead 70G includes a second cathode terminal 71G and a second cathode support 72G. The second cathode terminal 71G and the second cathode support 72G are integrally formed by a single member. The second cathode terminal 71G extends in the first direction X. The second cathode terminal 71G is located closer to the outer side of the case 80 in the first direction X. The distal end of the second cathode terminal 71G projects to the outside from the case 80 in the first direction X. As shown in FIG. 6, the entire second cathode terminal 71G is exposed from the back surface 82 of the case 80. In the first direction X, the position of the second cathode terminal 71G is equal to the position of the first cathode terminal 71R.

As shown in FIG. 5, the second cathode support 72G is a shaded portion of the second cathode side lead 70G and is L-shaped. The second cathode support 72G is located further toward the inner side of the case 80 than the second cathode terminal 71G. The second cathode support 72G includes a first portion 75a that extends along the first direction X from the second cathode terminal 71G, and a second portion 75b that extends along the second direction Y from the first portion 75a toward the third cathode side lead 70B. The second portion 75b is located closer to one side (X1 side in FIG. 5) than the first cathode side lead 70R in the first direction X. Specifically, the second portion 75b is located between the first cathode side lead 70R and the first anode side lead 60R in the first direction X. Furthermore, the second portion 75b is located at a position overlapping the first cathode side lead 70R and the first anode side lead 60R in the second direction Y. As shown in FIG. 7B, the thickness of the second cathode supporting 72G is thinner than the thickness of the second cathode terminal 71G. In the third direction Z, the position of the surface of the second cathode support 72G and the position of the surface of the second cathode terminal 71G are equal to each other. The thickness of the second cathode support 72G is equal to the thickness of the first cathode support 72R (see FIG. 7A). The thickness of the second cathode terminal 71G is equal to the thickness of the first cathode terminal 71R (see FIG. 7A).

As shown in FIGS. 5 and 7B, the second cathode support 72G supports the second light emitting diode 21G. More specifically, the second light emitting diode 21G is mounted on the surface of the distal end of the second portion 75b of the second cathode support 72G by way of a conductive bonding material 74. For example, silver paste or solder is used as the conductive bonding material 74. The second light emitting diode 21G is located closer to one side (X1 side in FIG. 5) than the first cathode side lead 70R in the first direction X and at a position overlapping the first cathode side lead 70R in the second direction Y.

The third cathode side lead 70B is L-shaped in a plan view. The maximum dimension in the first direction X of the third cathode side lead 70B is equal to the maximum dimension in the first direction X of the second cathode side lead 70G, and the maximum dimension in the second direction Y of the third cathode side lead 70B is equal to the maximum dimension in the second direction Y of the second cathode side lead 70G. In the second direction Y, the portion on the other side in the second direction Y (Y2 side in FIG. 5) of the third cathode side lead 70B overlaps the peripheral wall that forms the opening 81 of the case 80. The third cathode side lead 70B includes a third cathode terminal 71B and a third cathode support 72B. The third cathode terminal 71B and the third cathode support 72B are integrally formed by a single member. The third cathode terminal 71B is located closer to the outer side of the case 80 in the first direction X. The distal end of the third cathode terminal 71B projects to the outside from the case 80 in the first direction X. As shown in FIG. 6, the entire third cathode terminal 71B is exposed from the back surface 82 of the case 80. In the first direction X, the position of the third cathode terminal 71B is equal to the position of the first cathode terminal 71R.

As shown in FIG. 5, the third cathode support 72B is a shaded portion of the third cathode side lead 70B and is L-shaped. The third cathode support 72B is located further toward the inner side of the case 80 than the third cathode terminal 71B. The third cathode support 72B includes a first portion 76a that extends along the first direction X from the third cathode terminal 71B, and a second portion 76b that extends along the second direction Y from the first portion 76a toward the second cathode side lead 70G. The second portion 76b is located closer to one side (X1 side in FIG. 5) than the first cathode side lead 70R in the first direction X. Specifically, the second portion 76b is located between the first cathode side lead 70R and the first anode side lead 60R in the first direction X. Furthermore, the second portion 76b is located at a position overlapping the first cathode side lead 70R in the second direction Y. As shown in FIG. 7C, the thickness of the third cathode support 72B is thinner than the thickness of the third cathode terminal 71B. In the third direction Z, the position of the surface of the third cathode support 72B and the position of the surface of the third cathode terminal 71B are equal to each other. The thickness of the third cathode support 72B is equal to the thickness of the first cathode support 72R (see FIG. 7A). The thickness of the third cathode terminal 71B is equal to the thickness of the first cathode terminal 71R (see FIG. 7A).

As shown in FIG. 5, the third cathode support 72B supports the third light emitting diode 21B. More specifically, the third light emitting diode 21B is mounted on the surface of the distal end of the second portion 76b of the third cathode support 72B by way of the conductive bonding material 74. Thus, the cathode of the third light emitting diode 21B and the third cathode support 72B (second cathode side lead 70B) are electrically connected. The third light emitting diode 21B is located closer to one side (X1 side in FIG. 5) than the first cathode side lead 70R in the first direction X and at a position overlapping the first cathode side lead 70R in the second direction Y.

The first light emitting diode 21R is configured as, for example, a single-wire type LED chip having a GaAs substrate and an AlGaInP semiconductor layer. The back electrode (anode) of the first light emitting diode 21R is connected to the first anode support 62R through the conductive bonding material 63. Thus, the anode of the first light emitting diode 21R is electrically connected to the first anode side lead 60R. A first end of a wire W1 is connected to the surface electrode of the first light emitting diode 21R. A second end of the wire W1 is connected to a boundary portion (broken line portion in FIG. 5) of the first cathode terminal 71R and the first cathode support 72R in the first cathode side lead 70R. As the first light emitting diode 21R, for example, a high brightness type light emitting diode in which a conductive substrate such as germanium, silicon or the like and the AlGaInP semiconductor layer are joined by a metal layer (reflection layer) may be used.

The second light emitting diode 21G is configured as, for example, a 2-wire type LED chip having a sapphire substrate or a SiC substrate and a GaN-based semiconductor layer. The surface of the second light emitting diode 21G has two surface electrodes (anode and cathode). A first end of a wire W2 is connected to the anode of the second light emitting diode 21G. A second end of the wire W2 is connected to be closer to the first anode support 62R at the distal end of the second anode support 62G of the second anode side lead 60G. A first end of a wire W3 is connected to the cathode of the second light emitting diode 21G. A second end of the wire W3 is connected to the boundary portion (broken line portion in FIG. 5) of the second cathode terminal 71G and the second cathode support 72G in the second cathode side lead 70G. As the second light emitting diode 21G, for example, a high brightness type light emitting diode in which a conductive substrate made of germanium, silicon or the like and the GaN based semiconductor layer are joined by a metal layer (reflection layer) may be used.

The third light emitting diode 21B is configured, for example, as a 2-wire type LED chip having a sapphire substrate or a SiC substrate and a GaN-based semiconductor layer. The surface of the third light emitting diode 21B has two surface electrodes (anode and cathode). The arrangement positions of the two front surface electrodes of the third light emitting diode 21B and the arrangement positions of the two front surface electrodes of the second light emitting diode 21G are equal to each other. A first end of a wire W4 is connected to the anode of the third light emitting diode 21B. A second end of the wire W4 is connected to be closer to the first anode support 62R at the distal end of the third anode support 62B of the third anode side lead 60B. A first end of a wire W5 is connected to the cathode of the third light emitting diode 21B. A second end of the wire W5 is connected to the boundary portion (broken line portion in FIG. 5) of the third cathode terminal 71B and the third cathode support 72B in the third cathode side lead 70B. As the third light emitting diode 21B, for example, a high brightness type light emitting diode in which a conductive substrate made of germanium, silicon or the like and the GaN based semiconductor layer are joined by a metal layer (reflection layer) may be used.

The first Zener diode 22 includes a front electrode (anode) and a back electrode (cathode). The back surface electrode of the first Zener diode 22 is connected to the second anode support 62G of the second anode side lead 60G through the conductive bonding material 63. The surface electrode of the first Zener diode 22 is connected to a first end of a wire W6. A second end of the wire W6 is connected to the second cathode support 72G of the second cathode side lead 70G. Thus, the first Zener diode 22 is connected in antiparallel with the second light emitting diode 21G so that the application of an excessive reverse voltage to the second light emitting diode 21G can be avoided.

The second Zener diode 23 includes a front electrode (anode) and a back electrode (cathode). The back surface electrode of the second Zener diode 23 is connected to the third anode support 62B of the third anode side lead 60B through the conductive bonding material 63. A first end of a wire W7 is connected to the surface electrode of the second Zener diode 23. A second end of the wire W7 is connected to the third cathode support 72B of the third cathode side lead 70B. Thus, the second Zener diode 23 is connected in antiparallel with the third light emitting diode 21B so that the application of an excessive reverse voltage to the third light emitting diode 21B can be avoided.

The identification unit 50 is arranged spaced apart from the anode side lead 60 and the cathode side lead 70 toward one side (Y1 side in FIG. 5) in the second direction Y. Specifically, the identification unit 50 is located on one side in the second direction Y (Y1 side in FIG. 5) than the second anode side lead 60G and the second cathode side lead 70G. The identification unit 50 includes the resistance element 51 and a support lead 52 which is an example of a support electrode for supporting the resistance element 51.

The support lead 52 is a terminal of the LED module 20, and forms an input terminal and an output terminal with respect to the resistance element 51 (identification unit 50).

The support lead 52 is formed from, for example, copper, nickel, or an alloy thereof. In the second direction Y, the portion on one side (Y1 side in FIG. 5) in the second direction Y of the support lead 52 overlaps the peripheral wall that forms the opening 81 of the case 80. The support lead 52 includes a first support lead 53 which is an example of a first support electrode which configures an input terminal, and a second support lead 54 which is an example of a second support electrode which configures an output terminal. In the first direction X, the first support lead 53 is located on one side (X1 side in FIG. 5) of the case 80, and the second support lead 54 is located on the other side (X2 side in FIG. 5) of the case 80. In the second direction Y, the position of the first support lead 53 and the position of the second support lead 54 are equal. The first support lead 53 and the second support lead 54 face each other spaced apart in the first direction X.

The first support leads 53 extend in the first direction X. The length of the first support lead 53 in the first direction X is equal to the length of the first anode side lead 60R in the first direction X. The first support lead 53 includes a first terminal 53a and a first support 53b. The first terminal 53a and the first support 53b are integrally formed by a single member. The first terminal 53a is located closer to the outer side of the case 80 in the first direction X. The distal end of the first terminal 53a projects to the outside from the case 80 in the first direction X. As shown in FIG. 6, the entire first terminal 53a is exposed from the back surface 82 of the case 80. The position of the first terminal 53a in the first direction X is equal to the position of the first anode terminal 61R.

Figure 7D:
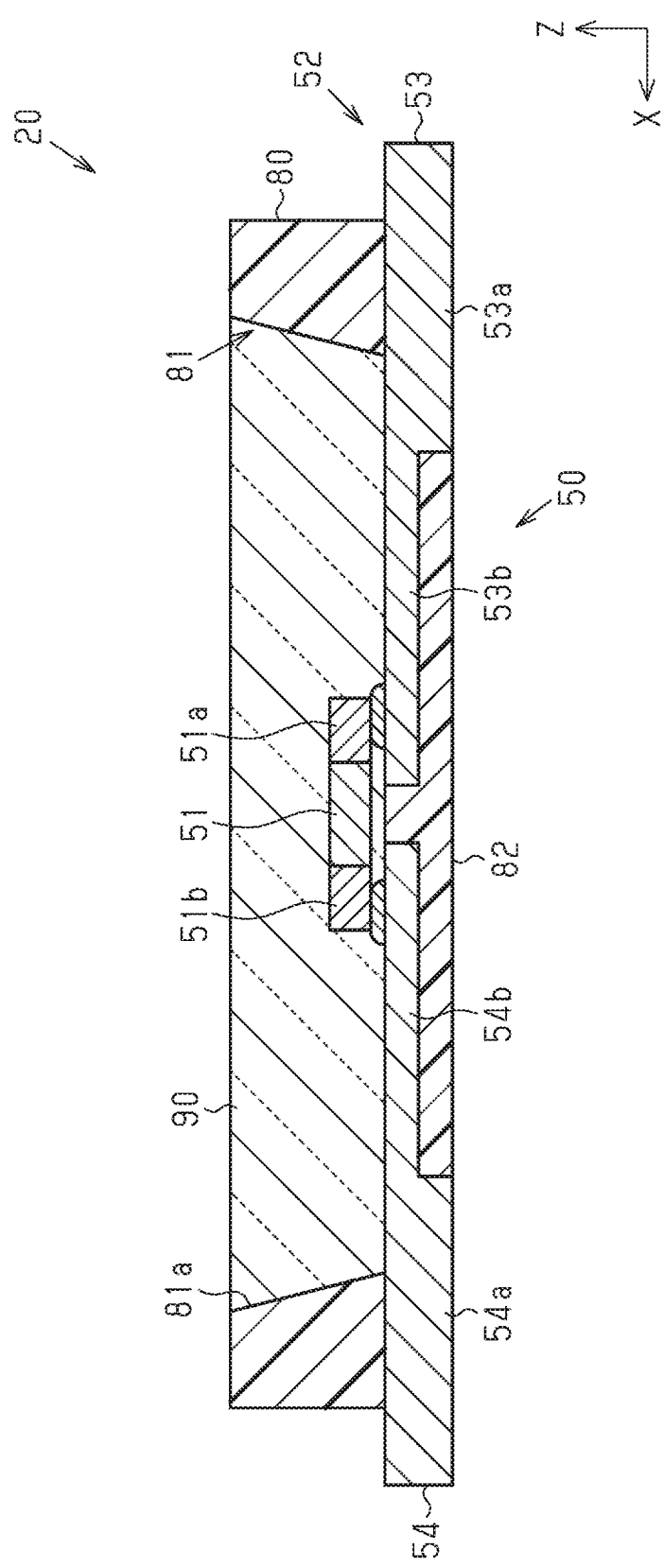
FIG. 7D is a cross-sectional view taken along line 7D-7D in FIG. 5.

The first support 53b is a shaded portion of the first support lead 53. The first support 53b is located further toward the inner side of the case 80 than the first terminal 53a. The position of the first support 53b in the first direction X is equal to the position of the first anode support 62R. The width (dimension in the second direction Y) of the first support 53b is larger than the width (dimension in the second direction Y) of the first terminal 53a. Specifically, the first support 53b projects toward the second anode support 62G from the first terminal 53a. The first support 53b does not project to a side opposite to the second anode support 62G from the first terminal 53a. In the second direction Y, the distance between the first support 53b and the second anode support 62G is shorter than the distance between the first terminal 53a and the second anode terminal 61G. As shown in FIG. 7D, the thickness of the first support 53b is thinner than the thickness of the first terminal 53a. In the third direction Z, the position of the surface of the first support 53b and the position of the surface of the first terminal 53a are equal to each other. The thickness of the first support 53b is equal to the thickness of the first anode support 62R (see FIG. 7A). The thickness of the first terminal 53a is equal to the thickness of the first anode terminal 61R (see FIG. 7A).

The second support lead 54 extends in the first direction X. The length of the second support lead 54 in the first direction X is equal to the length of the first cathode side lead 70R in the first direction X, and the length of the first support lead 53 in the first direction X. The second support lead 54 includes a second terminal 54a and a second support 54b. The second terminal 54a and the second support 54b are integrally formed by a single member. The second terminal 54a is located closer to the outer side of the case 80 in the first direction X. The distal end of the second terminal 54a projects to the outside from the case 80 in the first direction X. As shown in FIG. 6, the entire second terminal 54a is exposed from the back surface 82 of the case 80. The position of the second terminal 54*a* in the first direction X is equal to the position of the first anode terminal 61R.

The second support 54*b* is a shaded portion of the second support lead 54. The second support 54*b* is located further toward the inner side of the case 80 than the second terminal 54*a*. The position of the second support 54*b* in the first direction X is equal to the position of the second cathode support 72G. The width (dimension in the second direction Y) of the second support 54*b* is larger than the width (dimension in the second direction Y) of the second terminal 54*a*. Specifically, the second support 54*b* projects toward the second cathode support 72G from the second terminal 54*a*. The second support 54*b* does not project to a side opposite to the second cathode support 72G from the second terminal 54*a*. In the second direction Y, the distance between the second support 54*b* and the second cathode support 72G is shorter than the distance between the second terminal 54*a* and the second cathode terminal 71G. As shown in FIG. 7D, the thickness of the second support 54*b* is thinner than the thickness of the second terminal 54*a*. In the third direction Z, the positions of the surface of the second support 54*b* and the surface of the second terminal 54*a* are equal. The thickness of the second support 54*b* is equal to the thickness of the first anode support 62R (see FIG. 7A). The thickness of the second terminal 54*a* is equal to the thickness of the first anode terminal 61R (see FIG. 7A).

The resistance element 51 is a chip resistor which is rectangular in a plan view and has the first terminal 51*a* and the second terminal 51*b* at both ends in the longitudinal direction. In the resistance element 51, the first terminal 51*a* and the second terminal 51*b* are formed on both ends of an insulating substrate such as a ceramic substrate by plating or the like, where a resistive film (not shown) is connected between the first terminal 51*a* and the second terminal 51*b*, and the surface of the resistive film is covered with a protective film (not shown). The protective film is preferably white or whitish so as not to absorb the light from the light emitting diodes 21R, 21G, 21B. The protective film may be another color such as black or green. Moreover, in order to prevent the size of the LED module 20 from becoming large, and to reduce absorption of light from each light emitting diode 21R, 21G, 21B, the resistance element 51 is preferably small. For example, in a plan view of the LED module 20, the resistance element 51 preferably has a size of 0.6 mm×0.3 mm or 0.4 mm×0.2 mm or a size less than or equal to that size. The thickness of the resistance element 51 can be in the range of greater than or equal to 100 μm and smaller than or equal to 500 μm. The thickness is preferably 200 μm, and more preferably less than or equal to 150 μm. In the third direction Z, the upper surface of the resistance element 51 is preferably at a position lower than the upper surfaces of the light emitting diodes 21R, 21G, and 21B, that is, a position closer to the support lead 52 in the third direction Z. As a result, the upper surfaces of the light emitting portions of the light emitting diodes 21R, 21G, and 21B are located near the upper end of the LED module 20 in the third direction Z, whereby the resistance element 51 can reduce absorption of light from the light emitting diodes 21R, 21G, 21B as the position in the third direction Z of the upper surface of the resistance element 51 becomes lower. For example, in the third direction Z, the upper surface of the resistance element 51 is preferably lower than the upper surface of the lowest light emitting diode among the light emitting diodes 21R, 21G, and 21B. Furthermore, in the third direction Z, the upper surface of the resistance element 51 is preferably lower than the upper surface of the light emitting diode closest to the resistance element 51 among the light emitting diodes 21R, 21G, 21B.

The resistance element 51 is arranged so as to extend across the first support lead 53 and the second support lead 54, and is electrically connected to the first support lead 53 and the second support lead 54. More specifically, the first terminal 51*a* of the resistance element 51 is connected to the distal end of the first support 53*b* of the first support lead 53 by solder. The second terminal 51*b* of the resistance element 51 is connected to the distal end of the second support 54*b* of the second support lead 54 by solder. The resistance element 51 is located closer to the other side in the second direction Y (Y2 side in FIG. 5) in the first support 53*b* and the second support 54*b*. In addition, since it is necessary to read the resistance value of the resistance element 51, the resistance element 51 is separated in the circuitry from the light emitting diodes 21R, 21G, and 21B. Preferably, the first support lead 53 and the second support lead 54 are separated from the anode side lead 60 and the cathode side lead 70 connected to the light emitting diodes 21R, 21G, 21B.

An example of a manufacturing method of the LED module 20 will now be described with reference to FIGS. 8 and 9A to 9F. The shaded portions in FIGS. 9B to 9F indicate that the thickness is thinner than the thickness of the non-shaded portion.

Figure 8:
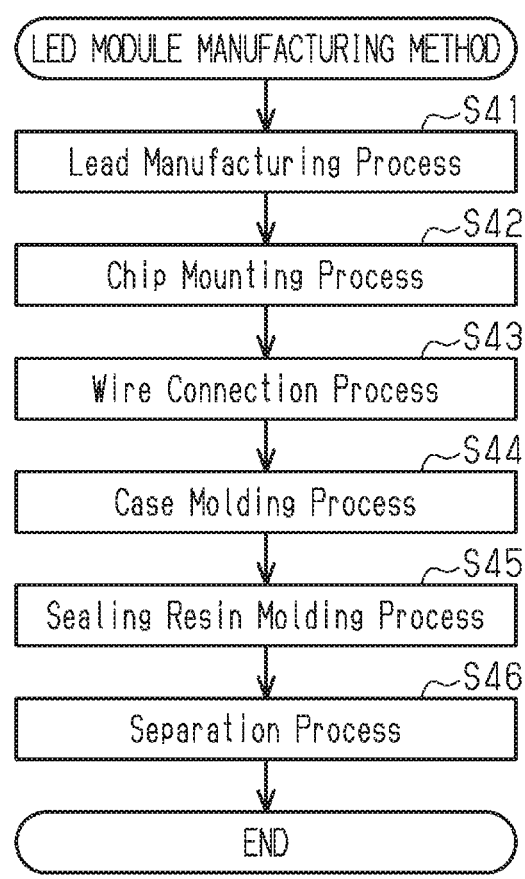
FIG. 8 is a flowchart showing a manufacturing method of the LED module.

As shown in FIG. 8, the manufacturing method of the LED module 20 includes a lead manufacturing process (step S41), a chip mounting process (step S42), a wire connecting process (step S43), a case molding process (step S44), a sealing resin molding process (step S45) and a separating process (step S46).

In the lead manufacturing process, the anode side lead 60, the cathode side lead 70, and the support lead 52 are formed by pressing a metal plate 100.

Figure 9A:
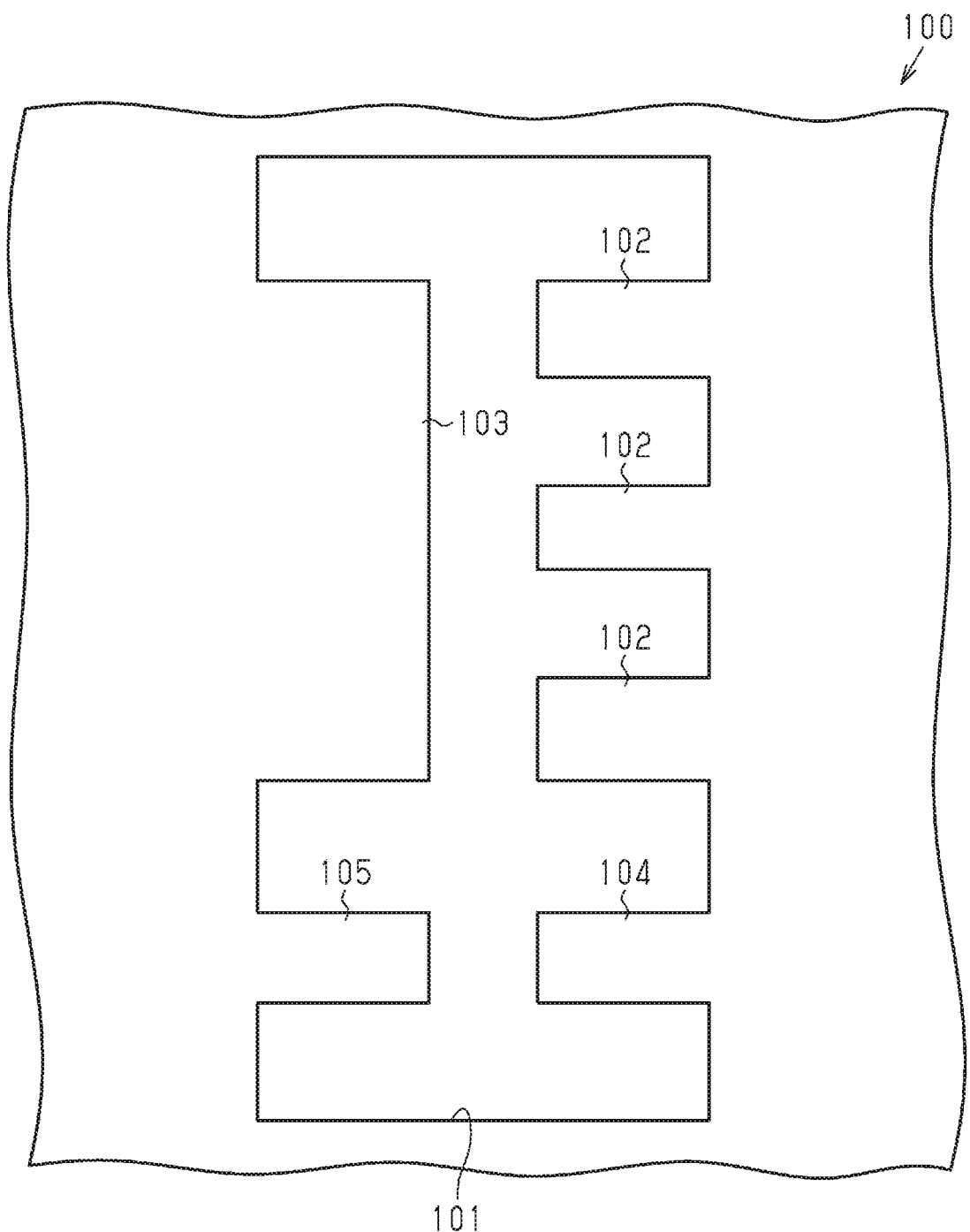
FIG. 9A is a plan view of a metal plate showing a lead manufacturing process.

Specifically, as shown in FIG. 9A, the metal plate 100 is set in the lower die (not shown) of the pressing machine. The metal plate 100 is a material of the anode side lead 60, the cathode side lead 70, and the support lead 52 (both shown in FIG. 5), and is formed of copper, nickel, or an alloy thereof. The metal plate 100 includes an opening 101 that extends through the metal plate 100 in the thickness direction, three anode side protrusions 102, one cathode side protrusion 103, a first protrusion 104, and a second protrusion 105. The three anode side protrusions 102, the one cathode side protrusion 103, the first protrusion 104, and the second protrusion 105 extend in the first direction X in the opening 101. The width (dimension in the second direction Y) of each of the three anode side protrusions 102, the width (dimension in the second direction Y) of the first protrusion 104, and the width (dimension in the second direction Y) of the second protrusion 105 are equal to each other. The width (dimension in the second direction Y) of the cathode side protrusion 103 is larger than the width of one anode side protrusion 102. The three anode side protrusions 102 are portions for forming the supports 62R, 62G, 62B of the anode side leads 60R, 60G, 60B (shown in FIG. 5). The cathode side protrusion 103 is a portion for forming the supports 72R, 72G, 72B of the cathode side leads 70R, 70G, 70B (shown in FIG. 5). The first protrusion 104 is a portion for forming a first support 53*b* (see FIG. 5) of the first support lead 53. The second protrusion 105 is a portion for forming a second support 54*b* (see FIG. 5) of the second support lead 54.

Figure 9B:
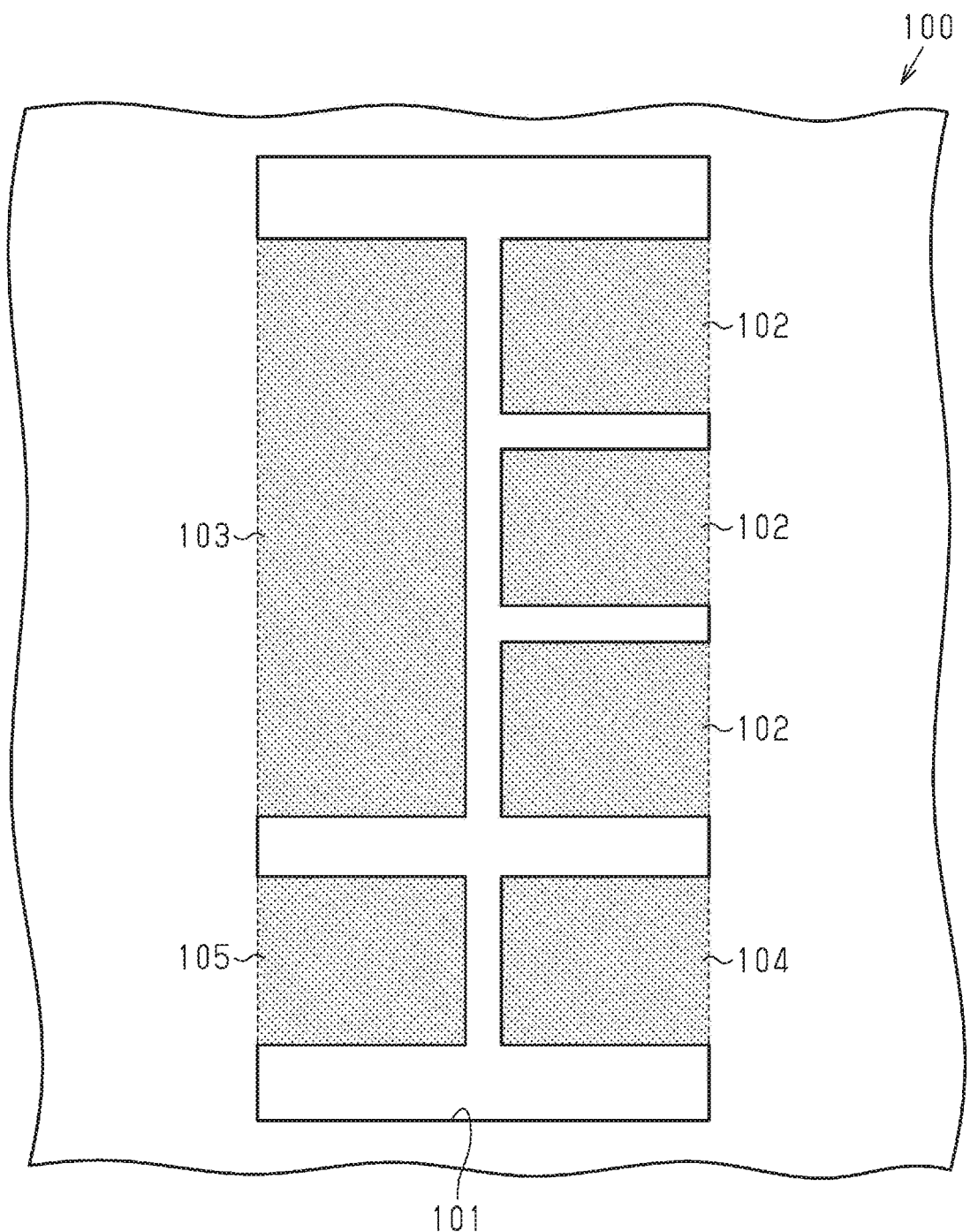
FIG. 9B is a plan view of the metal plate showing the lead manufacturing process.

Next, as shown in FIG. 9B, the three anode-side protrusions 102, the one cathode-side protrusion 103, the first protrusion 104, and the second protrusion 105 are stretched in the first direction X and the second direction Y by the pressing machine. The areas in a plan view of the three anode side protrusions 102, the one cathode side protrusion 103, the first protrusion 104, and the second protrusion 105 thus become large. The thicknesses of the three anode side protrusions 102, the one cathode side protrusion 103, the first protrusion 104, and the second protrusion 105 become thin.

Figure 9C:
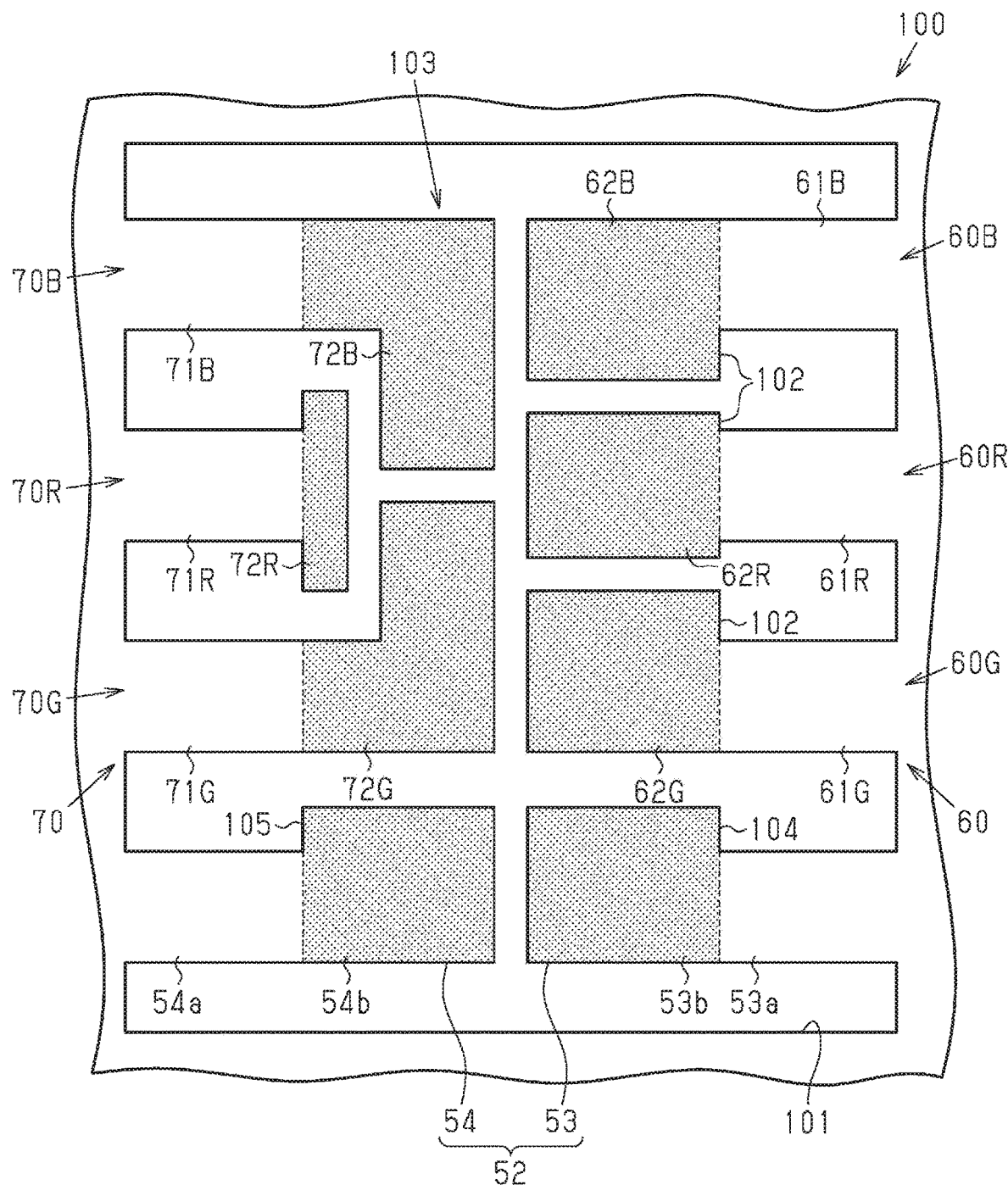
FIG. 9C is a plan view of the metal plate showing the lead manufacturing process.
Figure 9D:
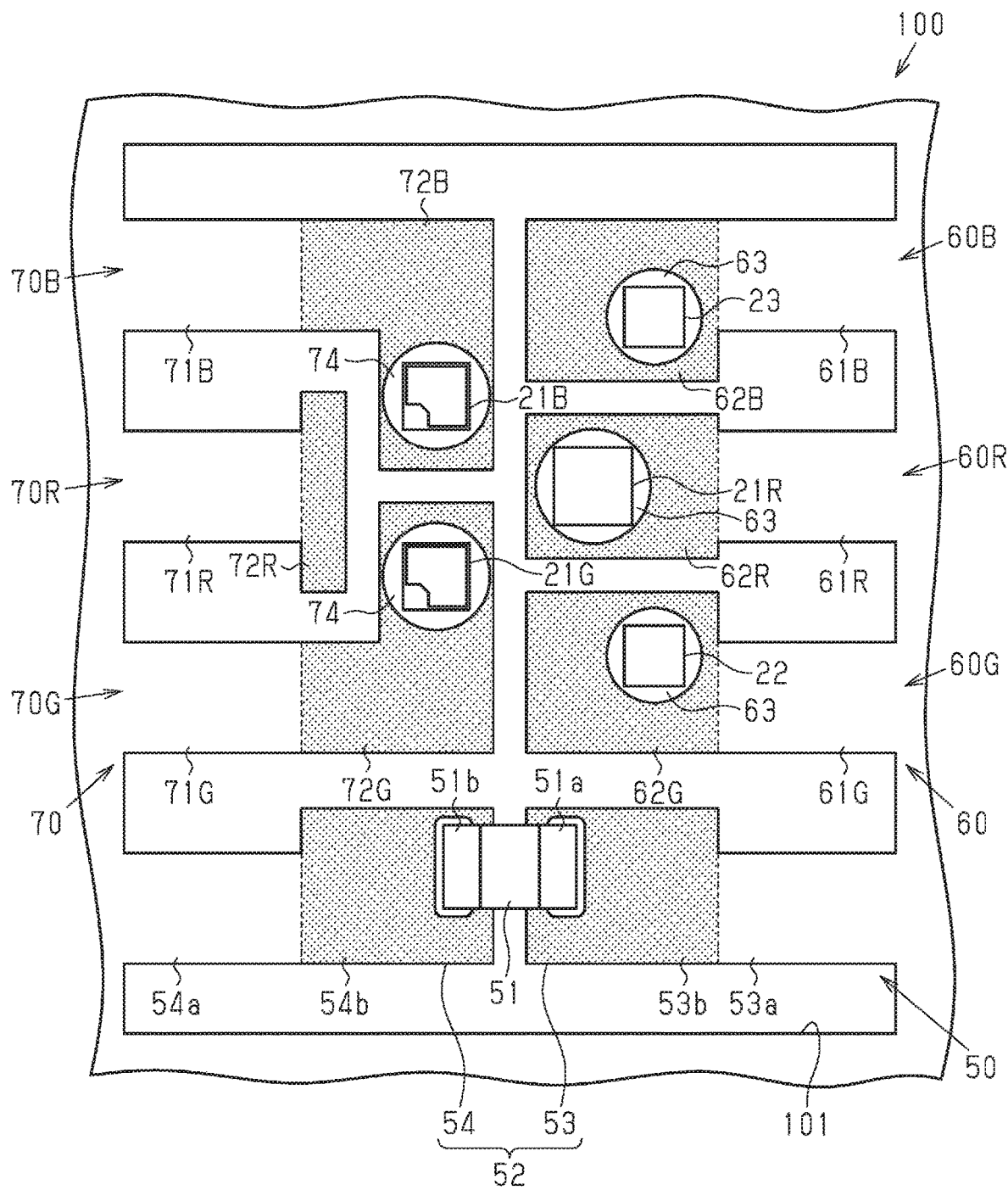
FIG. 9D is a plan view of the metal plate showing a chip mounting process.

Next, as shown in FIG. 9C, part of the three anode side protrusions 102, the one cathode side protrusion 103, the first protrusion 104, and the second protrusions 105 and portions on the outer side of the three anode side protrusions 102, the one cathode side protrusion 103, the first protrusion 104, and the second protrusion 105 are punched out in the metal plate 100 by the pressing machine. The anode side lead 60, the cathode side lead 70, and the support lead 52 are thereby formed. The distal ends of the terminals 61R, 61G, 61B of the anode side leads 60R, 60G, 60B, the distal ends of the terminals 71R, 71G, 71B of the cathode side leads 70R, 70G, 70B, and the terminals 53a, 54a of the support leads 53, 54 are connected to the metal plate 100.

The chip mounting process includes a mounting process of mounting the light emitting diodes 21R, 21G, and 21B on the anode side lead 60 and the cathode side lead 70, and an element arranging process of arranging the resistance element 51. In the mounting process of the present embodiment, the light emitting diodes 21R, 21G, 21B, the first Zener diode 22, and the second Zener diode 23 are mounted on the anode side lead 60 and the cathode side lead 70 of FIG. 9C. More specifically, the conductive bonding material 63 is applied to the first anode support 62R of the first anode side lead 60R. Then, the first light emitting diode 21R is placed on the conductive bonding material 63 of the first anode support 62R. The conductive bonding material 74 is applied to the second cathode support 72G of the second cathode side lead 70G. Then, the second light emitting diode 21G is placed on the conductive bonding material 74 of the second cathode support 72G. The conductive bonding material 74 is applied to the third cathode support 72B of the third cathode side lead 70B. Then, the third light emitting diode 21B is placed on the conductive bonding material 74 of the third cathode support 72B. The conductive bonding material 63 is applied to the second anode support 62G of the second anode side lead 60G. Then, the first Zener diode 22 is placed on the conductive bonding material 63 of the second anode support 62G. The conductive bonding material 63 is applied to the third anode support 62B of the third anode side lead 60B. Then, the second Zener diode 23 is placed on the conductive bonding material 63 of the third anode support 62B.

In the element arranging process of the present embodiment, the resistance element 51 is mounted on the support lead 52 of FIG. 9C. More specifically, solder is applied to the distal end of the first support 53b of the first support lead 53 and the distal end of the second support 54b of the second support lead 54. Then, the resistance element 51 is placed on the solder of the first support 53b and the second support 54b. Preferably, the conductive bonding materials 63, 74 for bonding the resistance element 51, the Zener diodes 22 and 23, and the light emitting diodes 21R, 21G and 21B are the same material.

The element arranging process includes an element selecting process. In the element selecting process of the present embodiment, first, the resistance elements 51 of plural types of resistance values are prepared. Then, among the resistance elements 51 of the plural types of resistance values, the resistance element 51 having a resistance value corresponding to the color rank of the emitted light produced by each of the light emitting diodes 21G, 21R, 21B is selected. More specifically, information indicating the color rank of the emitted light produced by each of the light emitting diodes 21R, 21G, 21B is recognized in advance through a test or the like. The color rank of the emitted light produced by each light emitting diode 21G, 21R, 21B is acquired using the information. Then, resistance elements 51 of eight types of resistance values X1 to X8 corresponding to the color ranks of the emitted light produced by each of the light emitting diodes 21G, 21R, 21B are prepared, and resistance element 51 having a resistance value corresponding to the acquired color ranks is selected. The selected resistance element 51 is mounted on the support lead 52.

Figure 9E:
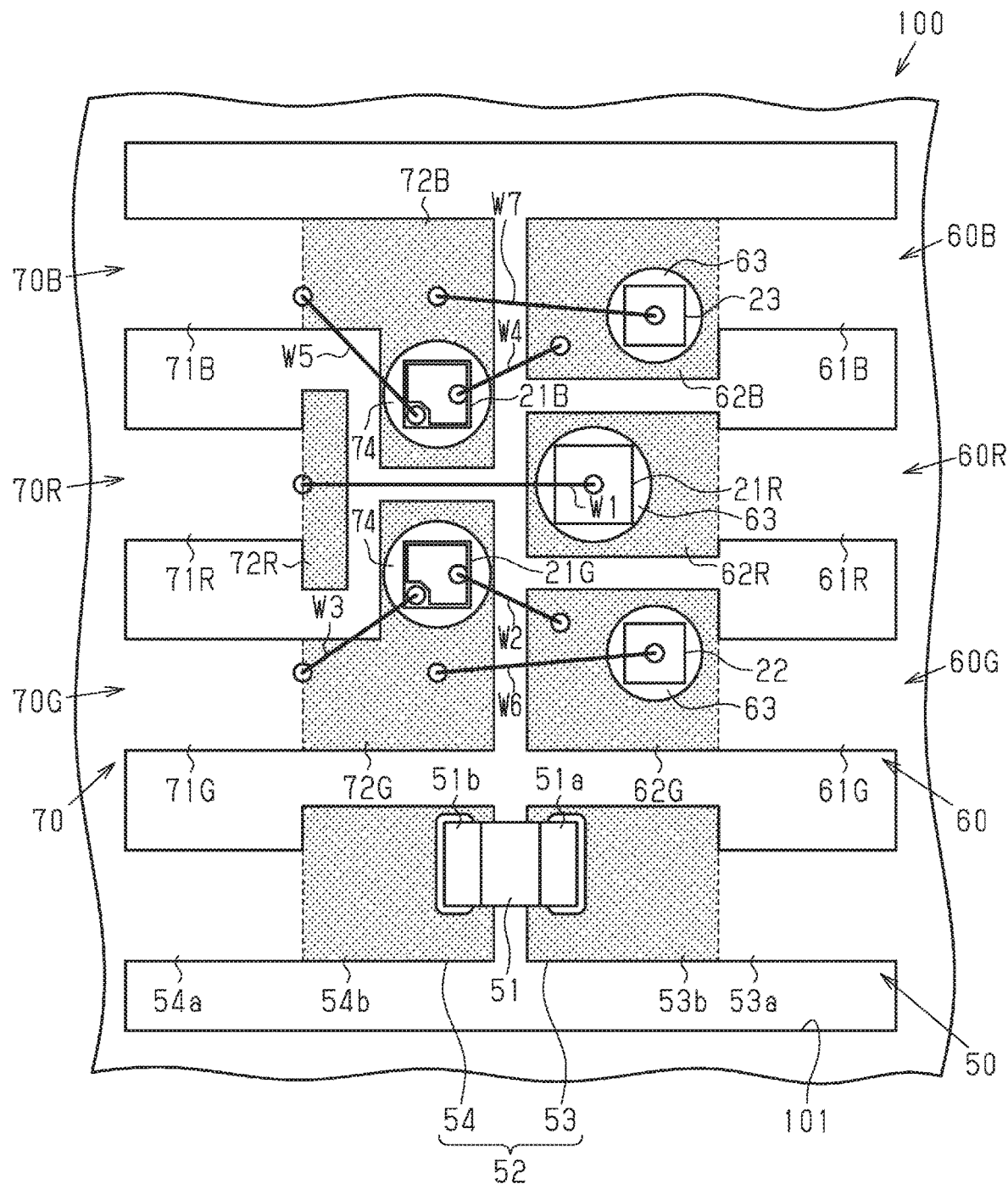
FIG. 9E is a plan view of the metal plate showing a wire connecting process.

As shown in FIG. 9E, the wires W1 to W7 are formed through wire bonding in the wire connecting process. The material of the wires W1 to W7 is, for example, gold or aluminum.

Figure 9F:
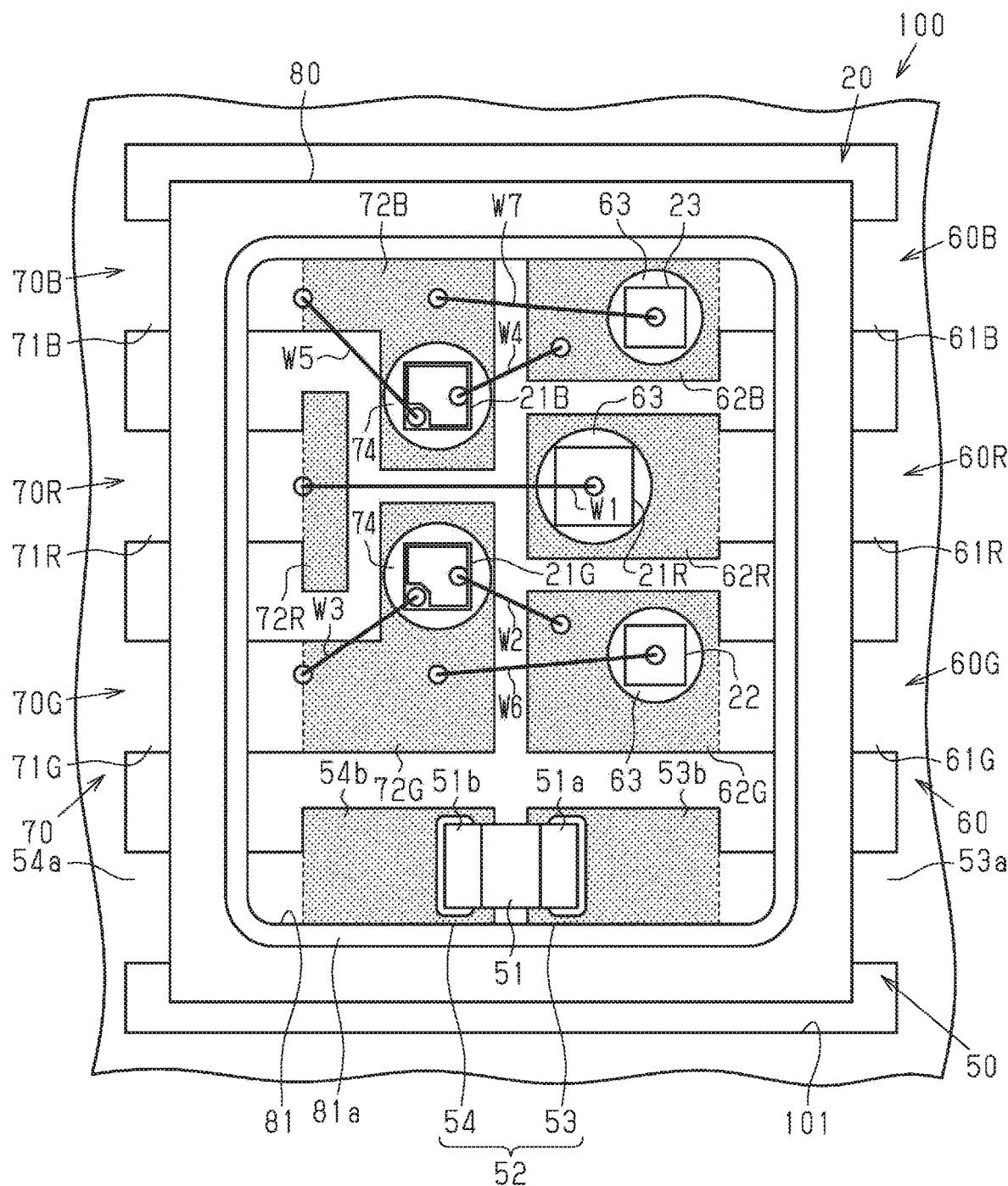
FIG. 9F is a plan view of the metal plate showing a case molding process.

In the case molding process, the metal plate 100 shown in FIG. 9E is placed on the lower die (not shown) of the injection molding machine. The case 80 shown in FIG. 9F is formed through injection molding using the injection molding machine.

In the sealing resin molding process, the sealing resin 90 is molded by feeding an epoxy resin or a silicone resin, which is a material of the sealing resin 90, into the opening 81 of the case 80.

In the separating process, the metal plate 100 on which the sealing resin 90 is molded is placed on the lower die (not shown) of the pressing machine. The connecting portions of the distal ends of the terminals 61R, 61G, 61B of the anode side leads 60R, 60G, 60B, the distal ends of the terminals 71R, 71G, 71B of the cathode side leads 70R, 70G, 70B, and the terminals 53a, 54a of the support leads 53, 54 and the metal plate 100 are then cut. The LED module 20 is thereby manufactured.

In the manufacturing method of the LED module 20, the case molding process may be performed before the chip mounting process (step S42). Furthermore, the resistance element 51 may be mounted on the support lead 52 after or before performing the mounting and the wire bonding of the light emitting diodes 21R, 21G, and 21B, the first Zener diode 22, and the second Zener diode 23 in the chip mounting process (step S42) and the wire connecting process (step S43).

Furthermore, when mounting the resistance element 51 on the support lead 52 after performing the mounting and the wire bonding of the light emitting diodes 21R, 21G, 21B, the first Zener diode 22, and the second Zener diode 23, the color rank of the emitted light produced by causing the light emitting diodes 21R, 21G, and 21B to emit light may be acquired. The resistance element 51 having a resistance value corresponding to the acquired color rank of the emitted light may then be mounted on the support lead 52.

[Advantages]

The LED module 20 according to the present embodiment has the following advantages.

(7) The second cathode support 72G of the second cathode side lead 70G and the third cathode support 72B of the third cathode side lead 70B are located at positions overlapping the first cathode side lead 70R in the first direction X. Thus, the second light emitting diode 21G located on the second cathode support 72G and the third light emitting diode 21B located on the third cathode support 72B can be brought closer to each other and can be brought closer to the first light emitting diode 21R. Therefore, the color mixing property of the first, second, and third light emitting diodes 21R, 21G and 21B can be enhanced.

(8) The LED module 20 includes the first Zener diode 22 connected in anti-parallel to the second light emitting diode 21G, and the second Zener diode 23 connected in anti-parallel to the third light emitting diode 21B. Therefore, an excessive reverse voltage can be avoided from being applied to the second light emitting diode 21G and the third light emitting diode 21B.

(9) Since the resistance element 51 is supported by the support lead 52, the position of the resistance element 51 can be easily determined in the course of manufacturing the LED module 20, and displacement of the resistance element 51 can be reduced in the molding process of the case 80 and the molding process of the sealing resin 90.

(10) The first support lead 53 includes the first terminal 53a exposed from the case 80, and the second support lead 54 includes the second terminal 54a exposed from the case 80. Therefore, by connecting the detection circuit 32X to the support lead 52, characteristic information related to the color rank of the emitted light produced by each of the light emitting diodes 21R, 21G, 21B by the resistance element 51 can be easily retrieved.

(11) Since the resistance element 51 is arranged to extend across the first support 53b of the first support lead 53 and the second support 54b of the second support lead 54, and the resistance element 51, and the first support 53b and the second support 54b are electrically connected, a configuration in which the current flows from the detection circuit 32X to the resistance element 51 can be easily realized.

(12) In the second direction Y, the support lead 52 is arranged at a position different from each anode side lead 60R, 60G, 60B and each cathode side lead 70R, 70G, 70B. That is, the support lead 52 does not overlap each anode side lead 60R, 60G, 60B and each cathode side lead 70R, 70G, 70B in the third direction Z. Thus, the height dimension of the LED module 20 can be reduced.

(13) In the second direction Y, the support lead 52 is located closer to one side (Y1 side in FIG. 5) than the anode side lead 60 and the cathode side lead 70. That is, in the second direction Y, the first support lead 53 is not located between the adjacent anode side leads among the first, second, and third anode side leads 60R, 60G, and 60B. In the second direction Y, the second support lead 54 is not located between the adjacent cathode side leads among the first, second, and third cathode side leads 70R, 70G, 70B. Therefore, increase in the distance between the adjacent anode side leads among the first, second, and third anode side leads 60R, 60G and 60B, and increase in the distance between the cathode side leads among the first, second, and third cathode side leads 70R and 70G and 70B are limited. Therefore, the first, second, and third light emitting diodes 21R, 21G and 21B can be brought closer to each other, whereby color mixing property can be enhanced.

(14) The width of the first support 53b of the first support lead 53 is larger than the width of the first terminal 53a, and the width of the second support 54b of the second support lead 54 is larger than the width of the second terminal 54a, so that the resistance element 51 can be easily attached to the first support 53b and the second support 54b. Therefore, the workability in the attachment of the resistance element 51 to the support lead 52 is enhanced.

(15) The first terminal 53a of the first support lead 53 is exposed from the back surface 82 of the case 80, while the first support 53b is not exposed from the back surface 82 of the case 80. The second terminal 54a of the second support lead 54 is exposed from the back surface 82 of the case 80, while the second support 54b is not exposed from the back surface 82 of the case 80. Thus, in the first direction X, the distance between the portion exposed from the back surface 82 of the case 80 in the first support lead 53 and the portion exposed from the back surface 82 of the case 80 in the second support lead 54 can be lengthened. Therefore, the electrical insulation between the first support lead 53 and the second support lead 54 when the LED module 20 is mounted on a land or the like of the circuit board can be improved.

(16) The plate thickness of the first support 53b of the first support lead 53 is thinner than the plate thickness of the first terminal 53a, and the plate thickness of the second support 54b of the second support lead 54 is thinner than the plate thickness of the second terminal 54a. Therefore, the resin of the case 80 is filled on the back surface side of the first support 53b and the back surface side of the second support 54b, whereby the contact area between the case 80 and the support lead 52 is increased. Thus, the adhesion between the case 80 and the support lead 52 is enhanced. Therefore, separation of the support lead 52 from the case 80 can be restricted.

(17) In the second direction Y, the first support 53b of the first support lead 53 projects only toward the second anode side lead 60G side from the first terminal 53a. In the second direction Y, the second support 54b of the second support lead 54 projects only toward the second cathode side lead 70G from the second terminal 54a. Thus, the distance from the end on the other side (Y2 side in FIG. 5) of the third anode side lead 60B to the end on one side (Y1 side in FIG. 5) of the first support lead 53 can be shortened in the state in which the first anode terminal 61R, the second anode terminal 61G, the third anode terminal 61B, and the first terminal 53a are arranged at an equal pitch in the second direction Y. Furthermore, the distance from the end on the other side (Y2 side in FIG. 5) of the third cathode side lead 70B to the end on one side (Y1 side in FIG. 5) of the second support lead 54 can be shortened in the state in which the first cathode terminal 71R, the second cathode terminal 71G, the third cathode terminal 71B, and the second terminal 54a arranged at an equal pitch. Therefore, the degradation of the aesthetic appeal of the LED module 20 resulting from the terminals arranged at an unequal pitch can be reduced, and the size of the LED module 20 in the second direction Y can be reduced.

(18) The end on one side (Y1 side in FIG. 5) of each of the first support lead 53 and the second support lead 54 in the second direction Y is embedded in the peripheral wall of the case 80. Therefore, the size of the LED module 20 can be reduced in the second direction Y as compared with a configuration in which the first support lead 53 and the second support lead 54 are arranged in the opening 81 of the case 80.

(19) The second anode support 62G of the second anode side lead 60G projects only toward the first anode support 62R side. The second cathode support 72G of the second cathode side lead 70G projects only toward the third cathode support 72B side. Thus, the identification unit 50 can be brought close to the second anode side lead 60G and the second cathode side lead 70G, and hence the LED module 20 can be reduced in size in the second direction Y.

(20) The third anode support 62B of the third anode side lead 60B projects only toward the first anode support 62R side. The third cathode support 72B of the third cathode side lead 70B projects only toward the second cathode support 72G side. Thus, the third anode side lead 60B and the third cathode side lead 70B can be located closer to the other side (Y2 side in FIG. 5) in the second direction Y, and hence the LED module 20 can be reduced in size in the second direction Y.

(21) The second cathode support 72G of the second cathode side lead 70G and the third cathode support 72B of the third cathode side lead 70B extend along the second direction Y so as to approach each other. Therefore, the first light emitting diode 21R arranged in the first anode support 62R of the first anode side lead 60R, the second light emitting diode 21G arranged in the second cathode support 72G, and the third light emitting diode 21B arranged in the third cathode support 72B can be brought closer to each other. Therefore, the color mixing property of the light emitting diodes 21R, 21G, 21B can be enhanced.

(22) The first Zener diode 22 is arranged in the second anode side lead 60G, and the second light emitting diode 21G is arranged in the second cathode side lead 70G. Thus, the length of the lead in which the first Zener diode 22 and the second light emitting diode 21G are arranged can be shortened as compared with a configuration in which the first Zener diode 22 and the second light emitting diode 21G are arranged in only one of the second anode side lead 60G and the second cathode side lead 70G. Therefore, in the lead manufacturing process or the mounting process of the first Zener diode 22 and the second light emitting diode 21G, the second anode side lead 60G in which the first Zener diode 22 is arranged and the second cathode side lead 70G in which the second light emitting diode 21G is arranged can be reduced from deforming in the third direction Z.

(23) The second Zener diode 23 is arranged in the third anode side lead 60B, and the third light emitting diode 21B is arranged in the third cathode side lead 70B. Thus, the length of the lead in which the second Zener diode 23 and the third light emitting diode 21B are arranged can be shortened as compared with a configuration in which the second Zener diode 23 and the third light emitting diode 21B are arranged in only one of the third anode side lead 60B and the third cathode side lead 70B. Therefore, in the lead manufacturing process or the mounting process of the second Zener diode 23 and the third light emitting diode 21B, the third anode side lead 60B in which the second Zener diode 23 is arranged and the third cathode side lead 70B in which the third light emitting diode 21B is arranged are not deformed in the third direction Z.

(24) The anode side lead 60, the cathode side lead 70, and the support lead 52 are integrally formed from one metal plate 100. Therefore, displacement of the anode side lead 60, the cathode side lead 70, and the support lead 52 in the third direction Z is limited. In addition, as compared with when the anode side lead 60, the cathode side lead 70 and the support lead 52 are formed separately, the process of arranging each of the anode side lead 60, the cathode side lead 70 and the support lead 52 can be omitted, and thus the manufacturing of the LED module 20 can be facilitated and the cost of the LED module 20 can be reduced.

(25) As shown in FIGS. 9B and 9C, each of the anode supports 62R, 62G, 62B of the anode side lead 60, each of the cathode supports 72R, 72G, 72B of the cathode side lead 70, and each of the supports 53b and 54b of the support leads 52 are formed by stretching the metal plate 100. Therefore, each anode support 62R, 62G, 62B, each cathode support 72R, 72G, 72B, and each support 53b, 54b can be easily formed.

(26) The plate thickness of each anode support 62R, 62G, 62B of the anode side lead 60 is thinner than the plate thickness of each anode terminal 61R, 61G, 61B, and the plate thickness of each cathode support 72R, 72G, 72B of the cathode side lead 70 is thinner than the plate thickness of each cathode terminal 71R, 71G, 71B. Therefore, the resin of the case 80 is filled on the back surface side of each of the anode supports 62R, 62G, and 62B and the back surface side of each of the cathode supports 72R, 72G, and 72B, whereby the contact area of the anode side lead 60 and the cathode side lead 70 and the case 80 is increased. The adhesion between the anode side lead 60 and the cathode side lead 70 and the case 80 is thereby enhanced. Therefore, the anode side lead 60 and the cathode side lead 70 can be reduced from detaching from the case 80.

Second Embodiment

A configuration of the LED driving system 1 according to a second embodiment will now be described. The LED driving system 1 according to the present embodiment differs from the LED driving system 1 according to the first embodiment in the contents of the table stored in the storage 42 of the control device 40. In the following description, same reference numerals are given to those components that are the same as the corresponding components of LED driving system 1 according to the first embodiment. Such components will not be described in detail. Furthermore, the configuration of the LED driving system 1 according to the second embodiment is the same as the configuration of the LED driving system 1 according to the first embodiment. Thus, the elements of the LED driving system 1 described below indicate the elements of the LED driving system 1 of FIGS. 1 and 2.

In the storage 42, as shown in Table 3, a table showing the relationship between a combination of the color rank of the emitted light of the first light emitting diode 21R, the color rank of the emitted light of the second light emitting diode 21G, and the color rank of the emitted light of the third light emitting diode 21B, and the resistance value of the resistance element 51 is stored. Since the color rank of the emitted light of each light emitting diode 21R, 21G, 21B is divided into four stages, there are 64 combinations of color ranks of the emitted light of each light emitting diode 21R, 21G, 21B. Therefore, 64 types of resistance elements 51 having different resistance values are prepared. The range of the minimum value and the maximum value of the resistance values Y1 to Y64 of the resistance element 51 is preferably be set in the range of greater than or equal to 100Ω and less than or equal to 10Ω.

TABLE 3

| Resistance value of resistance element | Color rank | | |
|---|---|---|---|
| | R | G | B |
| Y1 | A | A | A |
| Y2 | A | A | B |
| Y3 | A | B | B |
| . | . | . | . |
| . | . | . | . |
| . | . | . | . |
| Y63 | C | C | D |
| Y64 | C | D | D |
| Y64 | D | D | D |

The color rank of the emitted light of the first light emitting diode 21R is checked in the manufacturing stage of the first light emitting diode 21R. The color rank of the emitted light of the second light emitting diode 21G is checked in the manufacturing stage of the second light emitting diode 21G. The color rank of the emitted light of the third light emitting diode 21B is checked in the manufacturing stage of the third light emitting diode 21B. Thus, the combination of the color rank of each emitted light of each light emitting diode 21R, 21G, 21B forming the LED module 20 can be easily recognized.

In the manufacturing process of the LED module 20, in the chip mounting process, the resistance element 51 having a resistance value corresponding to the combination of the color rank of the emitted light of the respective light emitting diode 21R, 21G, 21B is selected among the resistance elements 51 of 64 types of resistance values. Then, the selected resistance element 51 is mounted on the support lead 52.

In the storage 42, a table showing the relationship between the resistance value of the resistance element 51 and the DUTY value of each of the light emitting diodes 21R, 21G, and 21B as shown in Table 4 is stored in advance. A table showing the relationship between the resistance value of the resistance element 51 and the DUTY value of each of the light emitting diodes 21R, 21G, 21B shown in Table 4 is determined in advance through tests or the like. The control device 40 acquires the first DUTY value, the second DUTY value, and the third DUTY value from the resistance value of the resistance element 51 using the table of Table 4.

TABLE 4

| Resistance value of resistance element | DUTY value | | |
| --- | --- | --- | --- |
| | 1st DUTY value (R) | 2nd DUTY value (G) | 3rd DUTY value (B) |
| Y1 | DR1 | DG1 | DB1 |
| Y2 | DR2 | DG2 | DB2 |
| Y3 | DR3 | DG3 | DB3 |
| . | . | . | . |
| . | . | . | . |
| . | . | . | . |
| Y62 | DR62 | DG62 | DB62 |
| Y63 | DR63 | DG63 | DB63 |
| Y64 | DR64 | DG64 | DB64 |

The setting process of the present embodiment is performed through a procedure In the same manner as the setting process of the first embodiment. That is, the control device 40 calculates the resistance value of the resistance element 51 based on the voltage value (characteristic information) output from the detector 32, and thereafter, acquires the first DUTY value, the second DUTY value, and the third DUTY value using the table of Table 4 from the calculated resistance value. The LED driving circuit 30 drives each of the light emitting diodes 21R, 21G, 21B based on the first DUTY value, the second DUTY value, and the third DUTY value.

The LED driving system 1 according to the present embodiment has the following advantages in addition to advantages (2), (4), (5), and (7) to (26) of the first embodiment.

(27) According to the LED driving circuit 30 and the LED driving device 10, the detector 32 detects the characteristic information related to the combination of the color rank of the emitted light of the first, second, and third light emitting diodes 21R, 21G and 21B. Thus, quantitative information related to the combination of the color ranks of the emitted lights of the respective light emitting diodes 21R, 21G and 21B can be acquired. Then, the color unevenness of the emitted light produced by each light emitting diode 21R, 21G, 21B is reduced and the light of a desired color is obtained by supplying a drive current corresponding to the information to each of the light emitting diodes 21R, 21G, 21B. Thus, the resistance value of the resistance element 51 accommodated in the LED module 20 merely needs to be read out, and an operation in which the technician adjusts the color of the emitted light produced by each of the light emitting diodes 21R, 21G, 21B to a desired color becomes unnecessary. Therefore, light of a desired color can be easily obtained.

(28) When current flows to the resistance element 51, the characteristic information related to the combination of the color ranks of the emitted lights of the respective light emitting diodes 21R, 21G, 21B can be detected by the detection circuit 32X. Therefore, the characteristic information can be easily detected by the detection circuit 32X.

(29) It is possible to identify 64 combinations of the color ranks of the emitted lights of the respective light emitting diodes 21R, 21G, 21B by the resistance value of the resistance element 51. Thus, as compared with the first embodiment, the color unevenness of the emitted light produced by each of the light emitting diodes 21R, 21G, 21B can be further reduced. Therefore, light of a desired color can be easily obtained.

Third Embodiment

A configuration of the LED driving system 1 according to a third embodiment will now be described with reference to FIGS. 10 and 11. The LED driving system 1 according to the present embodiment differs from the LED driving system 1 according to the first embodiment in the configurations of the LED module 20 and the LED driving circuit 30. In the following description, same reference numerals are given to those components that are the same as the corresponding components of LED driving system 1 according to the first embodiment. Such components will not be described in detail.

[LED Driving System]

Figure 10:
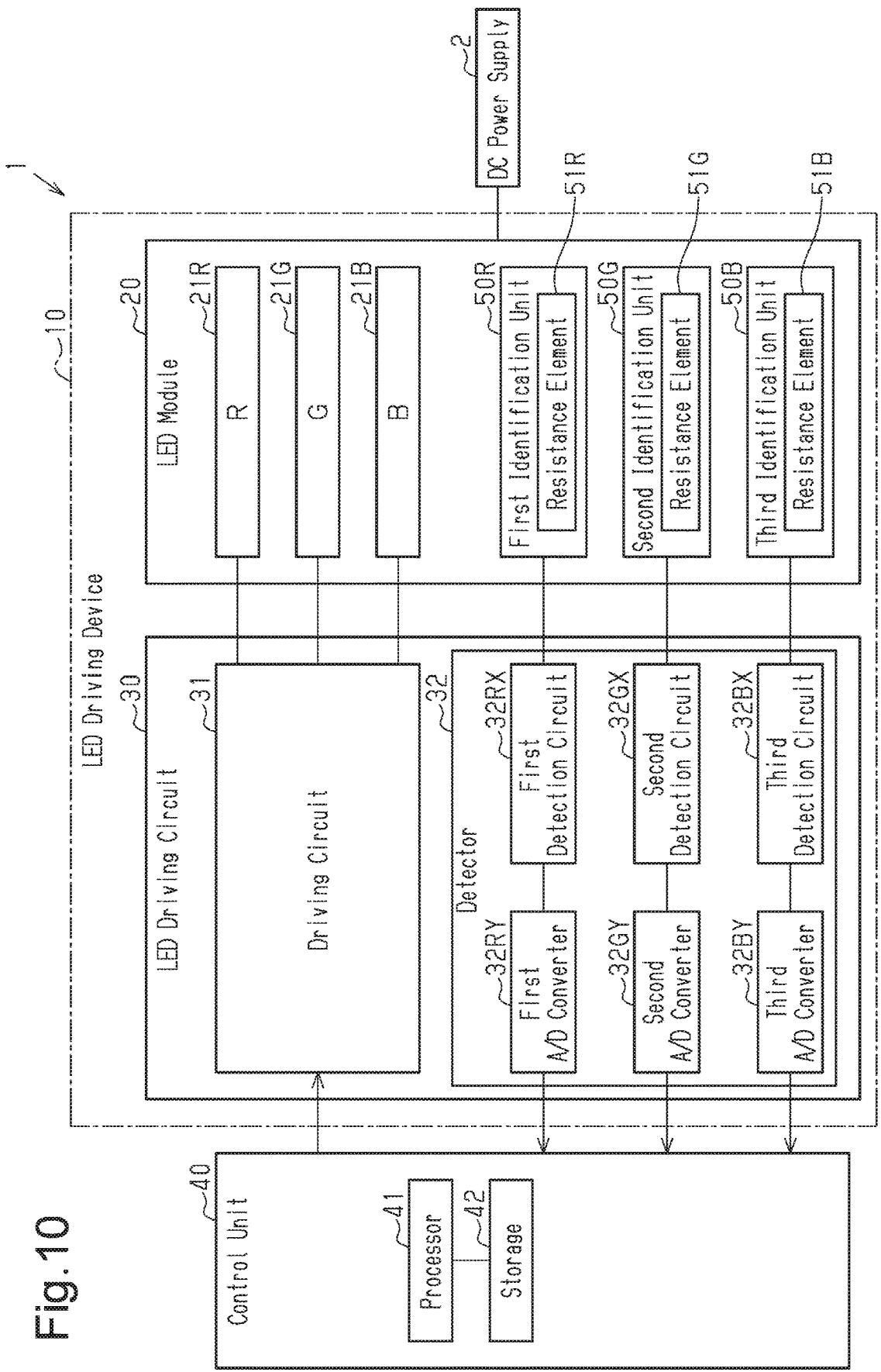
FIG. 10 is a schematic diagram of a third embodiment of the LED driving system.

As shown in FIG. 10, the LED module 20 of the LED driving system 1 includes a first identification unit 50R having a characteristic value corresponding to the light emission characteristics of the first light emitting diode 21R, a second identification unit 50G having a characteristic value corresponding to the light emission characteristics of the second light emitting diode 21G, and a third identification unit 50B having a characteristic value corresponding to the light emission characteristics of the third light emitting diode 21B.

The first identification unit 50R includes a resistance element 51R having a resistance value (hereinafter referred to as "first resistance value") corresponding to the color rank of the emitted light of the first light emitting diode 21R as a characteristic value corresponding to the light emission characteristics of the first light emitting diode 21R. More specifically, since the color rank of the first light emitting diode 21R is in four stages, the resistance element 51R of the first resistance value of the four types of resistance values is prepared. Then, the resistance element 51R of the first resistance value corresponding to the color rank of the first light emitting diode 21R among the resistance elements 51R of four types of resistance values is selected.

The second identification unit 50G includes a resistance element 51G having a resistance value (hereinafter referred to as "second resistance value") corresponding to the color rank of the emitted light of the second light emitting diode 21G as a characteristic value corresponding to the light emission characteristics of the second light emitting diode 21G. In the same manner as the resistance element 51R, resistance elements of four types of second resistance values are prepared for the resistance element 51G. The method of selecting the resistance element 51G is the same as that of the resistance element 51R. The resistance element 51G of the second resistance value of the four types of second resistance values may use the same chip resistor as the resistance element 51R of the four types of first resistance values.

The third identification unit 50B includes a resistance element 51B having a resistance value (hereinafter referred to as "third resistance value") corresponding to the color rank of the emitted light of the third light emitting diode 21B as a characteristic value corresponding to the light emission characteristics of the third light emitting diode 21B. In the same manner as the resistance elements 51R and 51G, resistance elements of four types of third resistance values are prepared for the resistance element 51B. The method of selecting the resistance element 51B is also similar to that of the resistance elements 51R and 51G. The resistance element 51B of the four types of third resistance values may use the same chip resistor as the resistance element 51R of the four types of first resistance values.

The detector 32 of the LED driving circuit 30 includes a first detection circuit 32RX, a second detection circuit 32GX, a third detection circuit 32BX, a first A/D converter 32RY, a second A/D converter 32GY, and a third A/D converter 32BY.

The first detection circuit 32RX is electrically connected to the first identification unit 50R. The first detection circuit 32RX detects the characteristic information related to the color rank of the emitted light of the first light emitting diode 21R in the first identification unit 50R. The first detection circuit 32RX generates a voltage (voltage of the first A/D converter 32RY) corresponding to the resistance element 51R as a detection signal, and outputs the same to the first A/D converter 32RY. The second detection circuit 32GX is electrically connected to the second identification unit 50G. The second detection circuit 32GX detects the characteristic information related to the color rank of the emitted light of the second light emitting diode 21G in the second identification unit 50G. The second detection circuit 32GX generates a voltage (voltage of the second A/D converter 32GY) corresponding to the resistance element 51G as a detection signal, and outputs the same to the second A/D converter 32GY. The third detection circuit 32BX is electrically connected to the third identification unit 50B. The third detection circuit 32BX detects the characteristic information related to the color rank of the emitted light of the third light emitting diode 21B in the third identification unit 50B. The third detection circuit 32BX generates a voltage (voltage of the third A/D converter 32BY) corresponding to the resistance element 51B as a detection signal, and outputs the same to the third A/D converter 32BY.

The first A/D converter 32RY is electrically connected to the first detection circuit 32RX. The first A/D converter 32RY digitally converts an analog signal (detection signal) by the first detection circuit 32RX. The first A/D converter 32RY outputs, to the control device 40, a digital signal indicating the detection result of the first detection circuit 32RX (characteristic information related to the color rank of the emitted light of the first light emitting diode 21R). The second A/D converter 32GY is electrically connected to the second detection circuit 32GX. The second A/D converter 32GY digitally converts an analog signal (detection signal) by the second detection circuit 32GX. The second A/D converter 32GY outputs, to the control device 40, a digital signal indicating the detection result of the second detection circuit 32GX (characteristic information related to the color rank of the second light emitting diode 21G). The third A/D converter 32BY is electrically connected to the third detection circuit 32BX. The third A/D converter 32BY digitally converts an analog signal (detection signal) by the third detection circuit 32BX. The third A/D converter 32BY outputs, to the control device 40, a digital signal indicating the detection result of the third detection circuit 32BX (characteristic information related to the color rank of the third light emitting diode 21B).

In the storage 42 of the control device 40, for example, a table showing the relationship between the first resistance value and the color rank of the emitted light of the first light emitting diode 21R, a table showing the relationship between the second resistance value and the color rank of the emitted light of the second light emitting diode 21G, and a table showing the relationship between the third resistance value and the color rank of the emitted light of the third light emitting diode 21B as shown in Table 5 are stored. The storage 42 also stores a table showing the relationship between the combination of the first resistance value, the second resistance value, and the third resistance value and the first DUTY value, the second DUTY value, and the third DUTY value as shown in Table 6.

TABLE 5

| 1st resistance value of 1st resistance element | Color rank R | 2nd resistance value of 2nd resistance element | Color rank G | 3rd resistance value of 3rd resistance element | Color rank B |
|---|---|---|---|---|---|
| WA1 | A | WB1 | A | WC1 | A |
| WA2 | B | WB2 | B | WC2 | B |
| WA3 | C | WB3 | C | WC3 | C |
| WA4 | D | WB4 | D | WC4 | D |

TABLE 6

| Combination of 1st to 3rd resistance values | | | DUTY value | | |
|---|---|---|---|---|---|
| | | | R | G | B |
| WA1 | WB1 | WC1 | DR1 | DG1 | DB1 |
| WA1 | WB1 | WC2 | DR2 | DG2 | DB2 |
| WA1 | WB2 | WC2 | DR3 | DG3 | DB3 |
| . | . | . | . | . | . |
| . | . | . | . | . | . |
| . | . | . | . | . | . |
| WA3 | WB3 | WC4 | DR62 | DG62 | DB62 |
| WA3 | WB4 | WC4 | DR63 | DG63 | DB63 |
| WA4 | WB4 | WC4 | DR64 | DG64 | DB64 |

In the setting process, control device 40 controls first detection circuit 32RX, the second detection circuit 32GX, and the third detection circuit 32BX such that a predetermined amount of current (standard amount of current) flows to each of the resistance elements 51R, 51G, 51B. The control device 40 then calculates the first resistance value from the voltage value of the first A/D converter 32RY, calculates the second resistance value from the voltage value of the second A/D converter 32GY, and calculates the third resistance value from the voltage value of the third A/D converter 32BY. Then, the control device 40 acquires the first DUTY value, the second DUTY value, and the third DUTY value from the calculated first to third resistance values using Table 6. The LED driving circuit 30 supplies drive currents by the drive signals of the first DUTY value, the second DUTY value, and the third DUTY value to the respective light emitting diodes 21R, 21G, and 21B. The color of the emitted light produced by each light emitting diode 21R, 21G, 21B thus becomes a desired color.

[LED Module]

Figure 11:
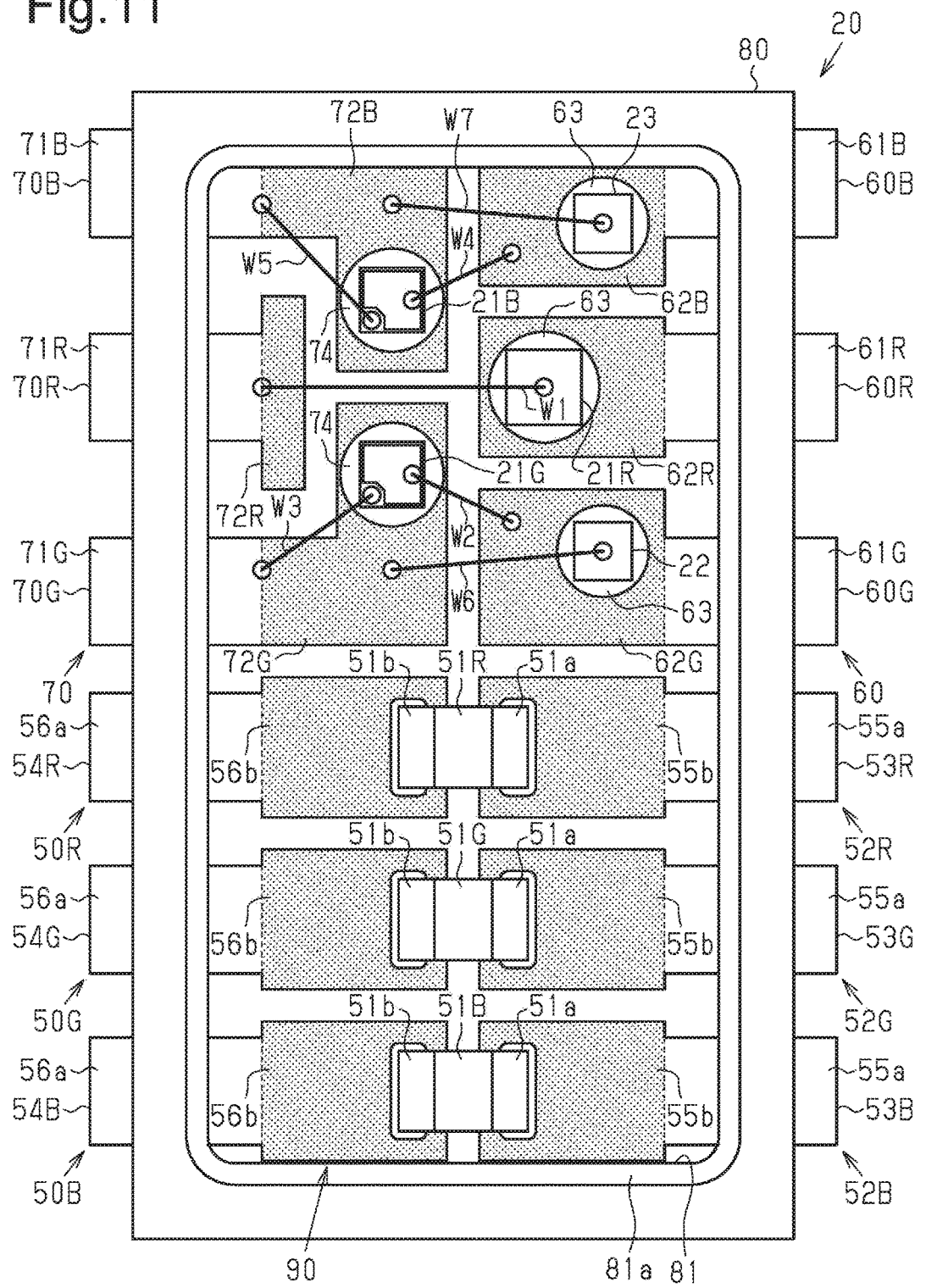
FIG. 11 is a plan view of an LED module.

As shown in FIG. 11, the LED module 20 includes a support lead 52R for supporting the resistance element 51R, a support lead 52G for supporting the resistance element 51G, and a support lead 52B for supporting the resistance element 51B. The support lead 52R, the support lead 52G, and the support lead 52B are an example of a support electrode, and are located on one side (Y1 side in FIG. 11) in the second direction Y than the anode side lead 60 and the cathode side lead 70. The support lead 52R, the support lead 52G, and the support lead 52B are arranged spaced apart in the second direction Y. The support lead 52B is located on one side (Y1 side in FIG. 11) in the second direction Y of the support lead 52G, and the support lead 52R is located on the other side (Y2 side in FIG. 11) in the second direction Y of the support lead 52G. The arrangement mode of the support leads 52R, 52G, 52B can be freely changed. For example, In the same manner as the arrangement mode of the anode side lead 60 and the cathode side lead 70, the support lead 52G may be located on one side (Y1 side in FIG. 11) in the second direction Y of the support lead 52R, and the support lead 52B may be located on the other side (Y2 side in FIG. 11) in the second direction Y of the support lead 52R.

The support lead 52R is a terminal of the LED module 20, and forms an input terminal and an output terminal of the resistance element 51R (first identification unit 50R). The support lead 52G is a terminal of the LED module 20, and forms an input terminal and an output terminal of the resistance element 51G (second identification unit 50G). The support lead 52B is a terminal of the LED module 20, and forms an input terminal and an output terminal of the resistance element 51B (third identification unit 50B). Each support lead 52R, 52G, 52B is formed from, for example, copper, nickel, or an alloy thereof. The support lead 52R, the support lead 52G, and the support lead 52B have the same shape.

The support lead 52R includes a first support lead 53R, which is an example of a first support electrode that configures an input terminal, and a second support lead 54R, which is an example of a second support electrode that configures an output terminal. The first support lead 53R is located on one side (X1 side in FIG. 11) of the case 80 in the first direction X, and the second support lead 54R is located on the other side (X2 side in FIG. 11) of the case 80. In the second direction Y, the position of the first support lead 53R and the position of the second support lead 54R are equal. The first support lead 53R and the second support lead 54R face each other spaced apart in the first direction X.

The first support lead 53R extends in the first direction X. The length of the first support lead 53R in the first direction X is equal to the length of the first anode side lead 60R in the first direction X. The first support lead 53R includes a first terminal 55a and a first support 55b. The first terminal 55a and the first support 55b are integrally formed by a single member. The first terminal 55a is located closer to the outer side of the case 80 in the first direction X. The distal end of the first terminal 55a projects to the outside from the case 80 in the first direction X. The entire first terminal 55a is exposed from the back surface 82 (see FIG. 6) of the case 80. The position of the first terminal 55a in the first direction X is equal to the position of the first anode terminal 61R.

The first support 55b is a shaded portion of the first support lead 53R. The first support 55b is located further toward the inner side of the case 80 than the first terminal 55a. The position of the first support 55b in the first direction X is equal to the position of the first anode support 62R. The width (dimension in the second direction Y) of the first support 55b is larger than the width (dimension in the second direction Y) of the first terminal 55a. Specifically, the first support 55b projects from both sides of the first terminal 53a in the second direction Y. The thickness of the first support 55b is thinner than the thickness of the first terminal 55a. In the third direction Z, the position of the surface of the first support 55b and the position of the surface of the first terminal 55a are equal to each other. The thickness of the first support 55b is equal to the thickness of the first anode support 62R (see FIG. 7A). The thickness of the first terminal 55a is equal to the thickness of the first anode terminal 61R (see FIG. 7A).

The second support lead 54R extends in the first direction X. The length of the second support lead 54R in the first direction X is equal to the length of the second cathode side lead 70G in the first direction X, and the length of the first support lead 53R in the first direction X. The second support lead 54R includes a second terminal 56a and a second support 56b. The second terminal 56a and the second support 56b are integrally formed by a single member. The second terminal 56a is located closer to the outer side of the case 80 in the first direction X. The distal end of the second terminal 56a projects to the outside from the case 80 in the first direction X. The entire second terminal 56a is exposed from the back surface 82 (see FIG. 6) of the case 80. The position of the second terminal 56a in the first direction X is equal to the position of the first anode terminal 61R.

The second support 56b is a shaded portion of the second support lead 54R. The second support 56b is located further toward the inner side of the case 80 than the second terminal 56a. The position of the second support 56b in the first direction X is equal to the position of the first anode support 62R. The width (dimension in the second direction Y) of the second support 56b is larger than the width (dimension in the second direction Y) of the second terminal 56a. Specifically, the second support 56b projects from both sides of the second terminal 56a in the second direction Y. The thickness of the second support 56b is thinner than the thickness of the second terminal 56a. In the third direction Z, the position of the surface of the second support 56b and the position of the surface of the second terminal 56a are equal to each other. The thickness of the second support 56b is equal to the thickness of the first anode support 62R (see FIG. 7A). The thickness of the second terminal 56a is equal to the thickness of the first anode terminal 61R (see FIG. 7A).

The resistance element 51R is arranged so as to extend across the first support lead 53R and the second support lead 54R, and is electrically connected to the first support lead 53R and the second support lead 54R. The first terminal 51a of the resistance element MR is placed on the solder applied to the distal end of the first support 55b of the first support lead 53R. The second terminal 51b of the resistance element 51R is placed on the solder applied to the distal end of the second support 56b of the second support lead 54R. The first terminal 51a is electrically connected to the first support lead 53R through the solder, and the second terminal 51b is electrically connected to the second support lead 54R through the solder.

The support lead 52G includes a first support lead 53G, which is an example of a first support electrode, and a second support lead 54G, which is an example of a second support electrode. The resistance element 51G is arranged so as to extend across the first support lead 53G and the second support lead 54G, and is electrically connected to the first support lead 53G and the second support lead 54G. The first terminal 51a of the resistance element 51G is placed on the solder applied to the distal end of the first support 55b of the first support lead 53G. The second terminal 51b of the resistance element 51G is placed on the solder applied to the distal end of the second support 56b of the second support lead 54G.

The support lead 52B includes a first support lead 53B, which is an example of a first support electrode, and a second support lead 54B, which is an example of a second support electrode. The resistance element 51B is arranged so as to extend across the first support lead 53B and the second support lead 54G, and is electrically connected to the first support lead 53B and the second support lead 54B. The first terminal 51a of the resistance element 51B is placed on the solder applied to the distal end of the first support 55b of the first support lead 53B. The second terminal 51b of the resistance element 51B is placed on the solder applied to the distal end of the second support 56b of the second support lead 54B.

In the manufacturing method of the LED module 20, the support leads 52R, 52G, and 52B are formed integrally with the anode side lead 60 and the cathode side lead 70 from the metal plate 100 (see FIG. 9A), in the same manner as the support lead 52 of the first embodiment. Thus, displacement of the anode side lead 60, the cathode side lead 70, and the support leads 52R, 52G, 52B in the third direction Z can be limited. In addition, as compared with when the anode side lead 60, the cathode side lead 70 and the support leads 52R, 52G, 52B are formed separately, the process of arranging each of the anode side lead 60, the cathode side lead 70 and the support leads 52R, 52G, 52B can be omitted. Thus, the manufacturing of the LED module 20 can be facilitated, and the cost of the LED module 20 can be reduced.

The LED driving system 1 according to the present embodiment has the following advantage in addition to advantages (2), (4), (5), (7) to (17), and (19) to (26) of the first embodiment and advantages (27) and (29) of the second embodiment.

(30) The resistance elements of four common types of resistance values are used as the resistance elements of the four types of resistance values of the resistance elements 51R, 51G, and 51B. Thus, the types of resistance values of the resistance elements can be reduced, and cost reduction can be achieved.

Fourth Embodiment

A configuration of the LED driving system 1 according to a fourth embodiment will now be described with reference to FIGS. 12, 13, 14A, and 14B. The LED driving system 1 according to the present embodiment differs from the LED driving system 1 according to the first embodiment in the configuration of the LED module 20. In the following description, same reference numerals are given to those components that are the same as the corresponding components of LED driving system 1 according to the first embodiment. Such components will not be described in detail.

Figure 12:
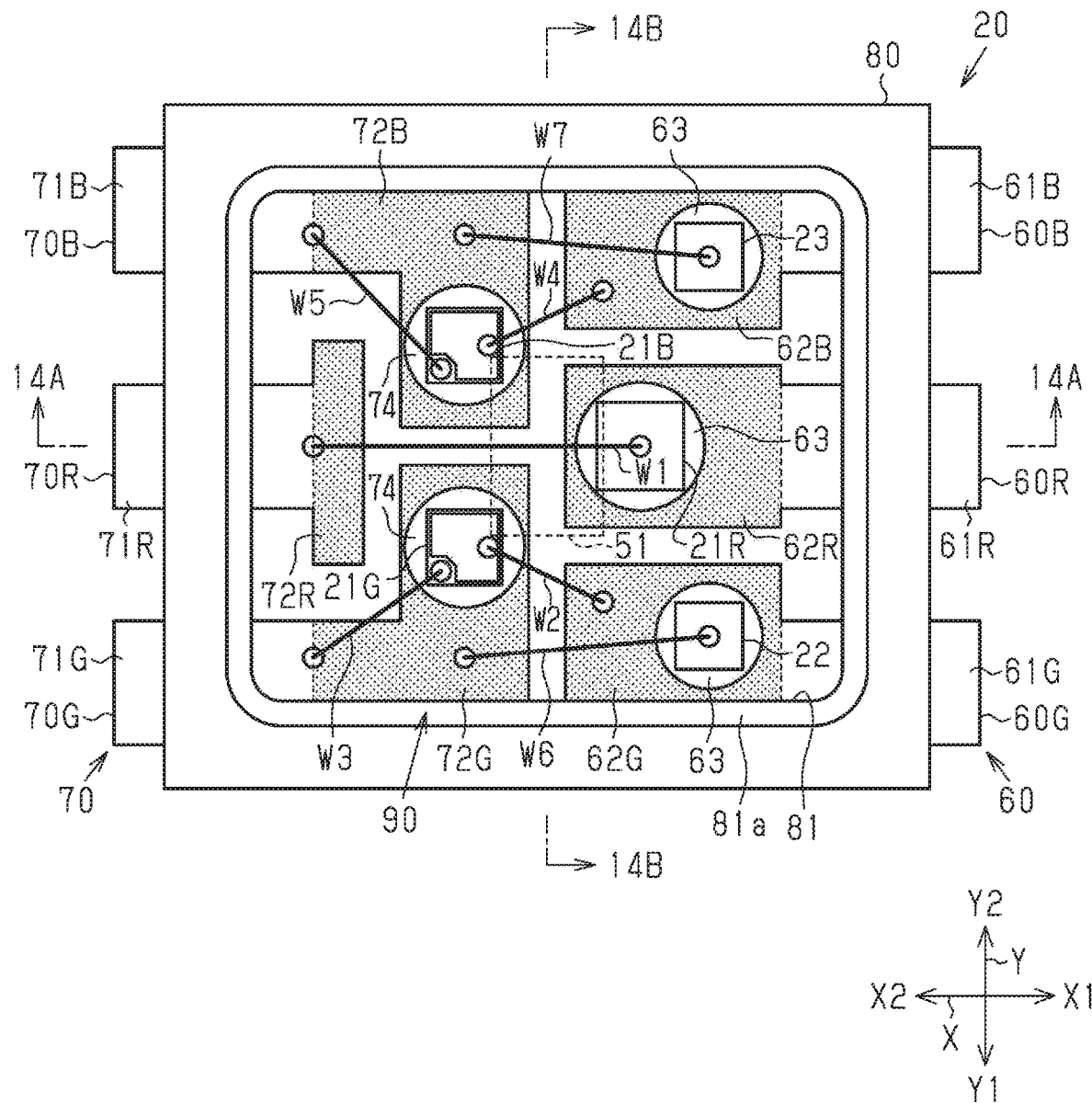
FIG. 12 is a plan view of a LED module in a fourth embodiment of the LED driving system.

As shown in FIG. 12, the size of the case 80 of the LED module 20 according to the present embodiment is smaller than the size of the case 80 of the LED module 20 of the first to third embodiments. The outer dimension of the case 80 in the first direction X is, for example, 3.1 mm, and the outer dimension of the case 80 in the second direction Y is, for example, 2.8 mm. The outer dimension of the case 80 in the third direction Z is, for example, 1.0 mm.

Figure 14A:
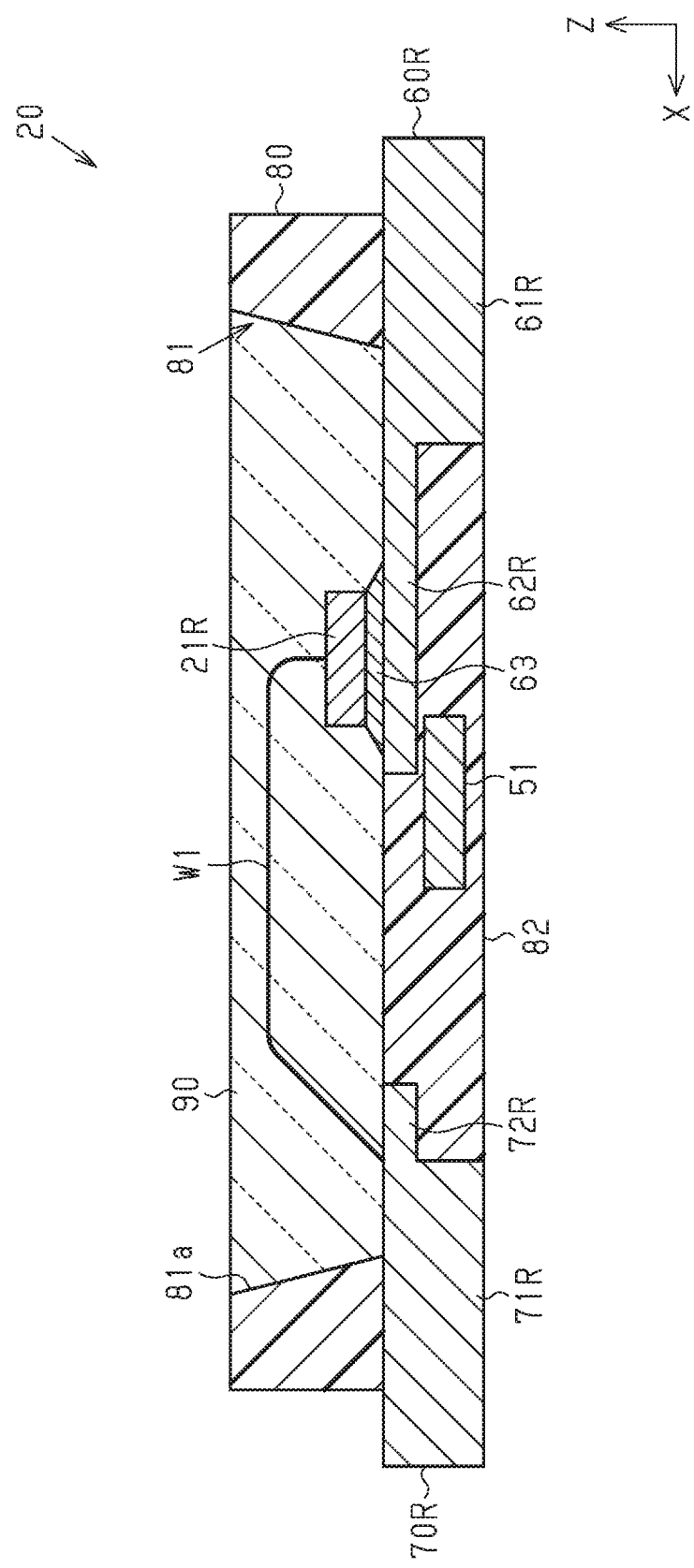
FIG. 14A is a cross-sectional view taken along line 14A-14A in FIG. 12.

The resistance element 51 is located at the center of the opening 81 of the case 80 in the first direction X and the second direction Y. The resistance element 51 is embedded in the case 80. The resistance element 51 has, in the third direction Z, a portion overlapping the first anode support 62R of the first anode side lead 60R, the second cathode support 72G of the second cathode side lead 70G, and the third cathode support 72B of the third cathode side lead 70B. As shown in FIG. 14A, the resistance element 51 is located on the back surface 82 side of the case 80 than the first anode support 62R. That is, the resistance element 51 is located on the back surface 82 side of the case 80 than the second cathode support 72G and the third cathode support 72B (see FIG. 12).

Figure 13:
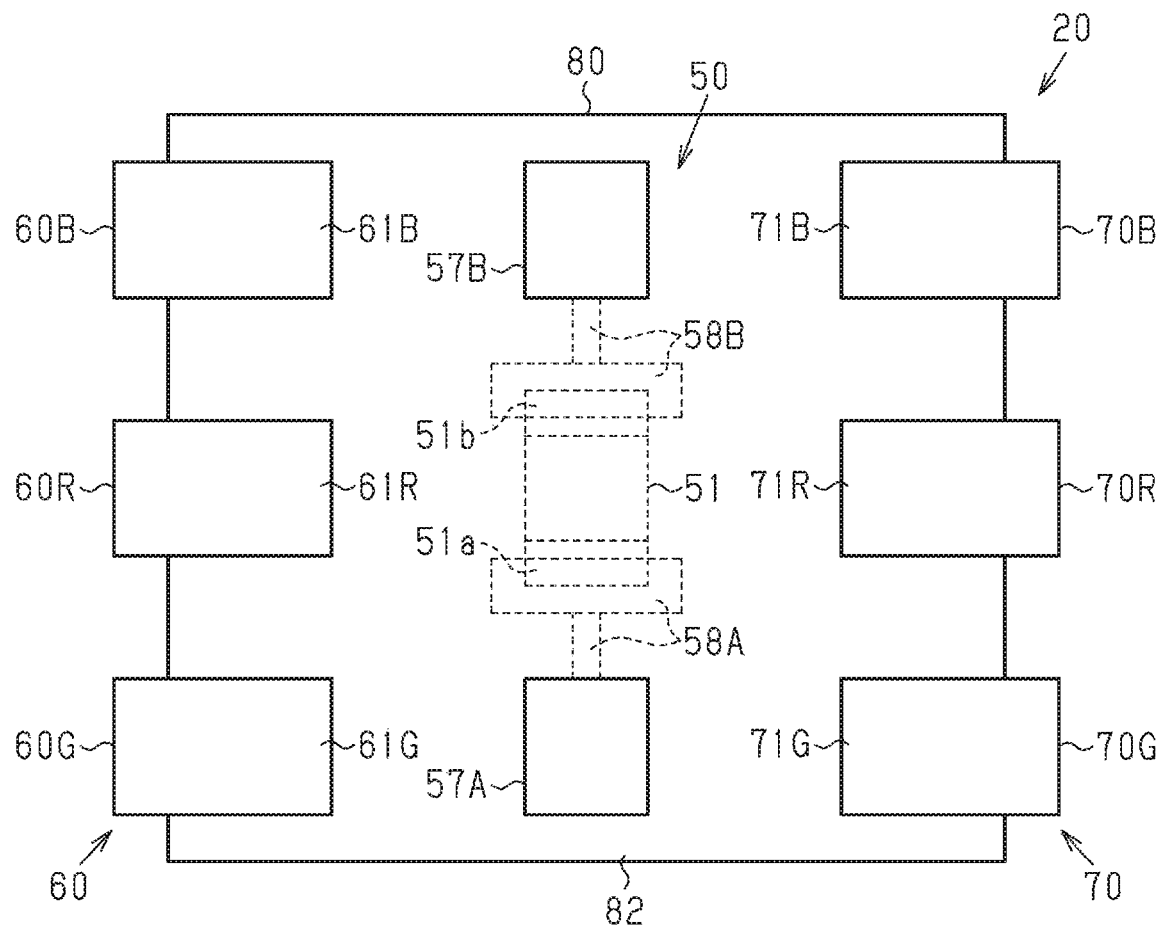
FIG. 13 is a bottom view of the LED module.
Figure 13:
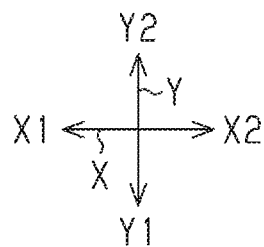

As shown in FIG. 13, the LED module 20 includes a first detection terminal 57A, a second detection terminal 57B, a first wiring 58A, and a second wiring 58B. The first detection terminal 57A, the second detection terminal 57B, the first wiring 58A, and the second wiring 58B are embedded in the case 80 and arranged in a line along the second direction Y. The first detection terminal 57A and the second detection terminal 57B are exposed from the back surface 82 of the case 80, while the first wiring 58A and the second wiring 58B are not exposed from the back surface 82 of the case 80. The first wiring 58A and the second wiring 58B are formed from, for example, copper, nickel, or an alloy thereof.

The first detection terminal 57A is electrically connected to the first terminal 51a of the resistance element 51 and forms an input terminal of the resistance element 51. The first detection terminal 57A is exposed from the back surface 82 of the case 80. The first detection terminal 57A has a rectangular shape when viewed from the back surface 82 of the case 80. The first detection terminal 57A is located between the second anode terminal 61G and the second cathode terminal 71G in the second direction Y with a gap from each of the terminals 61G and 71G.

The second detection terminal 57B is electrically connected to the second terminal 51b of the resistance element 51 and forms an output terminal of the resistance element 51. The second detection terminal 57B is exposed from the back surface 82 of the case 80. The second detection terminal 57B has a rectangular shape when viewed from the back surface 82 of the case 80. The second detection terminal 57B is located between the third anode terminal 61B and the third cathode terminal 71B in the second direction Y with a gap from each of the terminals 61B and 71B.

The first wiring 58A connects the first terminal 51a of the resistance element 51 and the first detection terminal 57A. The first wiring 58A is T-shaped and includes a first portion, which is connected to the first terminal 51a and longer than the first terminal 51a in the first direction X, and a second portion, which is extended in the second direction Y from a central portion in the first direction X at the first portion and connected to the first detection terminal 57A. The plate thickness of the first wiring 58A is smaller than the plate thickness of the first detection terminal 57A and the plate thickness of the second detection terminal 57B.

The second wiring 58B connects the second terminal 51b of the resistance element 51 and the second detection terminal 57B. The second wiring 58B is formed to a T-shape including a first portion connected to the second terminal 51b and which is longer than the second terminal 51b in the first direction X, and a second portion extended in the second direction Y from a central portion in the first direction X at the first portion and connected to the second detection terminal 57B. The plate thickness of the second wiring 58B is equal to the plate thickness of the first wiring

58A. The width (dimension in the first direction X) of the first portion of the second wiring 58B is equal to the width (dimension in the first direction X) of the first portion of the first wiring 58A. The width (dimension in the first direction X) of the second portion of the second wiring 58B is equal to the width (dimension in the first direction X) of the first portion of the first wiring 58A.

Figure 14B:
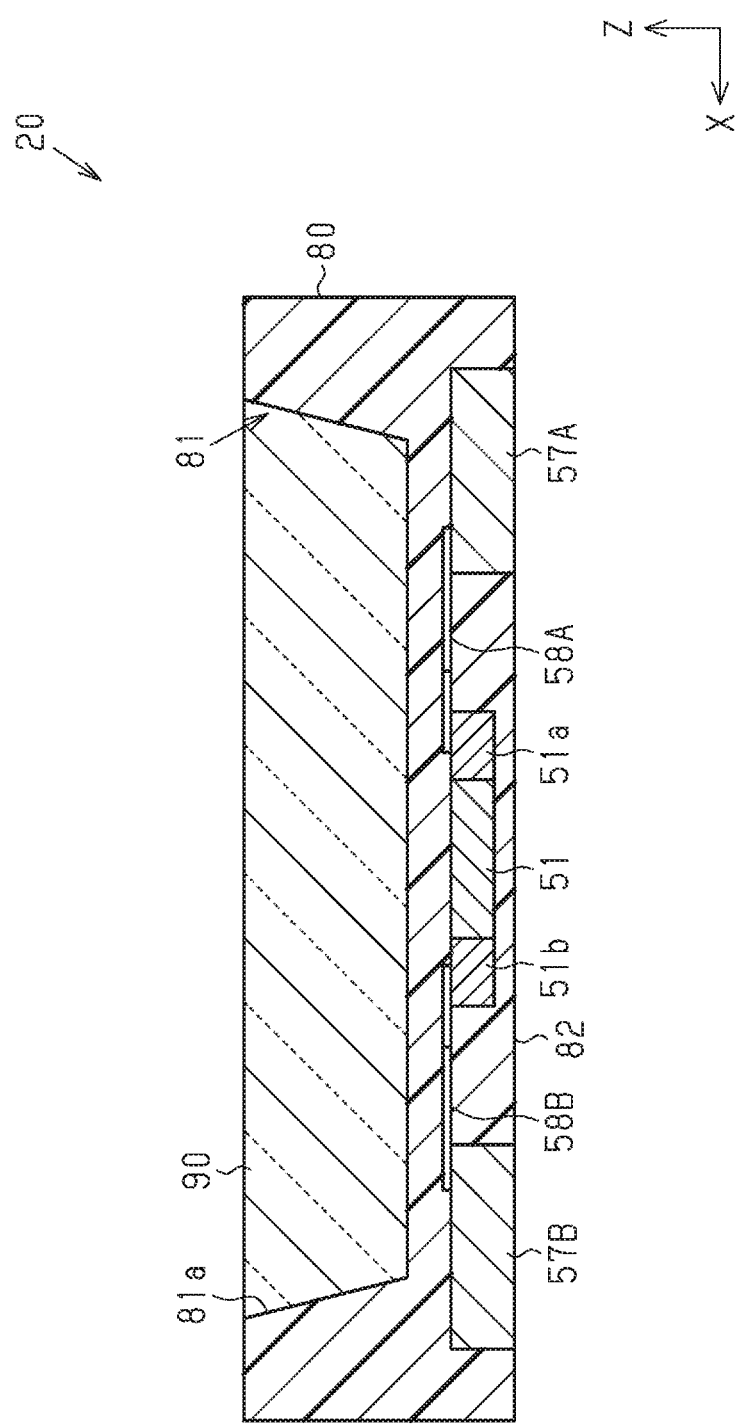
FIG. 14B is a cross-sectional view taken along line 14B-14B in FIG. 12.

As shown in FIGS. 13 and 14B, the resistance element 51, the first detection terminal 57A, and the second detection terminal 57B are located closer to the back surface 82 side of the case 80 than the first wiring 58A and the second wiring 58B. The position of the surface of the resistance element 51, the position of the surface of the first detection terminal 57A, and the position of the surface of the second detection terminal 57B are equal to each other. The resistance element 51 is not exposed from the back surface 82 of the case 80.

The LED driving system 1 according to the present embodiment has the following advantages in addition to advantages (1) to (8), (19) to (23), and (26) of the first embodiment.

(31) The resistance element 51 is embedded in the case 80 between the second cathode side lead 70G and the third cathode side lead 70B and the back surface 82 of the case 80 in the third direction Z. The resistance element 51 is embedded in the case 80 between the first anode side lead 60R and the back surface 82 of the case 80 in the third direction Z. Therefore, compared to the configuration in which the resistance element 51 is arranged at a position different from the anode side lead 60 and the cathode side lead 70 in the first direction X and the second direction Y, the size of the LED module 20 can be reduced in the plan view of the LED module 20.

In addition, the resin material forming the case 80 is located between the resistance element 51 and the second cathode side lead 70G, the third cathode side lead 70B, and the first anode side lead 60R in the third direction Z. Therefore, the electrical insulation of the resistance element 51 and the second cathode side lead 70G, the third cathode side lead 70B, and the first anode side lead 60R when the LED module 20 is mounted on the land of the circuit substrate, and the like can be enhanced.

(32) The resistance element 51 is arranged at a position overlapping with the thin second cathode support 72G having a thin plate thickness and the third cathode support 72B having a thin plate thickness in the third direction Z. The height dimension of the LED module 20 thus can be reduced.

(33) Since the first detection terminal 57A, the second detection terminal 57B, and the resistance element 51 are lined in the second direction Y, the arrangement space of the first detection terminal 57A, the second detection terminal 57B, and the resistance element 51 in the first direction X can be reduced. Therefore, the size of the LED module 20 in the first direction X can be reduced.

(34) The first detection terminal 57A is arranged at a position overlapping the second anode support 62G and the second cathode support 72G in a plan view of the LED module 20, and the second detection terminal 57B is arranged at a position overlapping the third anode support 62B and the third cathode support 72B in a plan view of the LED module 20. Thus, the size of the LED module 20 in the second direction Y can be reduced as compared with a structure in which the first detection terminal 57A is located between the second anode support 62G and the second cathode support 72G in the second direction Y, and the second detection terminal 57B is located between the third anode support 62B and the third cathode support 72B in the second direction.

(35) The first detection terminal 57A and the first terminal 51a of the resistance element 51 are connected by the first wiring 58A, and the second detection terminal 57B and the second terminal 51b of the resistance element 51 are connected by the second wiring 58B. Thus, the distance between the first detection terminal 57A and the second detection terminal 57B can be increased in the second direction Y. Therefore, the electrical insulation between the first detection terminal 57A and the second detection terminal 57B when the LED module 20 is mounted on a land or the like of the circuit board can be improved.

(36) In the first direction X, the first detection terminal 57A is arranged at the central position between the second anode terminal 61G and the second cathode terminal 71G. Thus, the distance between the first detection terminal 57A and the second anode terminal 61G and the distance between the first detection terminal 57A and the second cathode terminal 71G can be increased. Therefore, the electrical insulation between the first detection terminal 57A and the second anode terminal 61G and the second cathode terminal 71G can be enhanced. Furthermore, in the first direction X, the second detection terminal 57B is arranged at the central position between the third anode terminal 61B and the third cathode terminal 71B. Thus, the distance between the second detection terminal 57B and the third anode terminal 61B and the distance between the second detection terminal 57B and the third cathode terminal 71B can be increased. Therefore, the electrical insulation between the second detection terminal 57B and the third anode terminal 61B and the third cathode terminal 71B when the LED module 20 is mounted on a land or the like of the circuit board can be enhanced.

Fifth Embodiment

A configuration of the LED driving system 1 according to a fifth embodiment will now be described with reference to FIGS. 15 and 16. The LED driving system 1 according to the present embodiment differs from the LED driving system 1 according to the first embodiment in the configurations of the LED module 20 and the LED driving circuit 30. In the following description, same reference numerals are given to those components that are the same as the corresponding components of LED driving system 1 according to the first embodiment. Such components will not be described in detail.

[LED Driving System]

Figure 15:
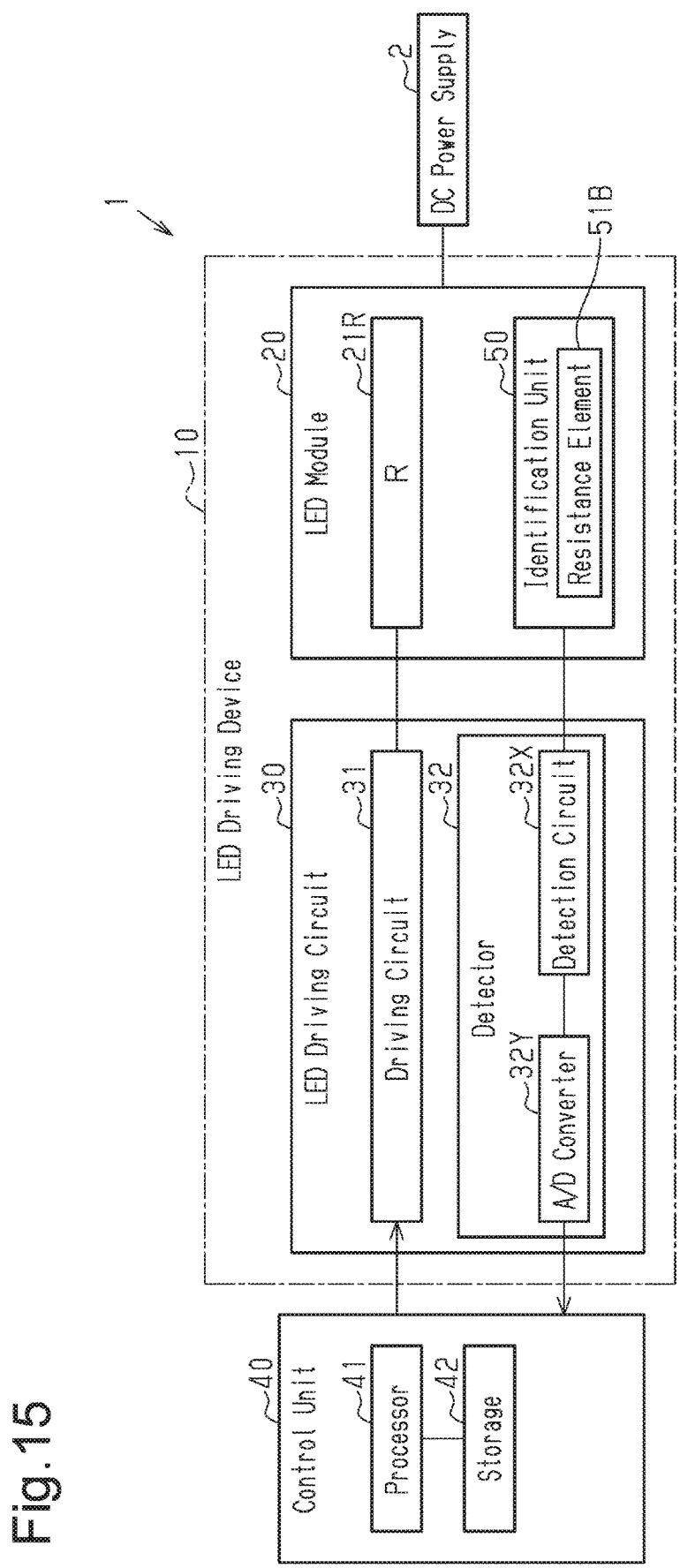
FIG. 15 is a schematic diagram of a fifth embodiment of the LED driving system.

As shown in FIG. 15, the LED module 20 includes one light emitting diode. The LED module 20 according to the present embodiment includes the first light emitting diode 21R as one light emitting diode. The second light emitting diode 21G or the third light emitting diode 21B may be used as one light emitting diode instead of the first light emitting diode 21R.

The identification unit 50 includes the resistance element 51 having a resistance value corresponding to the brightness of the first light emitting diode 21R. More specifically, since the brightness of the first light emitting diode 21R is in two stages, resistance elements 51 of two types of resistance values are prepared. Then, the resistance element 51 having the resistance value corresponding to the brightness of the emitted light of the first light emitting diode 21R is selected among the resistance elements 51 of the two types of resistance values. In the present embodiment, when the light flux of the emitted light of the first light emitting diode 21R is greater than or equal to a predetermined threshold value, the brightness of the emitted light of the first light emitting diode 21R is referred to as "bright", whereas when the light flux of the emitted light of the first light emitting diode 21R is less than the predetermined threshold value, the brightness of the emitted light of the first light emitting diode 21R is referred to as "dark". Furthermore, the brightness of the emitted light of the first light emitting diode 21R may be measured by light intensity, luminance, or illumination instead of measuring by light flux.

The driving circuit 31 of the LED driving circuit 30 includes only the first driving circuit 31R for driving the first light emitting diode 21R. Accordingly, the terminals of the LED driving circuit 30 include only the power supply voltage terminal VDD, the ground terminal GND, the first signal terminal VCR, the first input terminal TRin, the detection output terminal TCN1, the detection input terminal TCN2, the control input terminal Scnt, and the control output terminal Sid.

The detection circuit 32X is electrically connected to the identification unit 50. The detection circuit 32X detects characteristic information (voltage of A/D converter 32Y) related to the brightness of the emitted light of the first light emitting diode 21R in the identification unit 50, and outputs the same to the A/D converter 32Y. The A/D converter 32Y digitally converts the analog signal (detection signal) from the detection circuit 32X. The A/D converter 32Y outputs a digital signal indicating the characteristic information obtained by the detection circuit 32X to the control device 40.

The storage 42 of the control device 40 stores, for example, a table showing the relationship between the resistance value of the resistance element 51 and the brightness of the emitted light of the first light emitting diode 21R as shown in Table 7. Furthermore, the storage 42 stores, for example, a table showing the relationship between the resistance value of the resistance element 51 and the DUTY value of the first light emitting diode 21R as shown in Table 8.

TABLE 7

| Resistance value of resistance element | Brightness |
|---|---|
| V1 | Bright |
| V2 | Dark |

TABLE 8

| Resistance value of resistance element | DUTY value |
|---|---|
| V1 | DX |
| V2 | DY |

In the setting process, the control device 40 controls the detection circuit 32X such that a predetermined amount of current (e.g., standard amount of current) flows to the resistance element 51, and calculates the resistance value from the voltage value of A/D converter 32Y. Then, the control device 40 obtains a DUTY value from the calculated resistance value using Table 8. The LED driving circuit 30 causes the first light emitting diode 21R to emit light based on the DUTY value. The first light emitting diode 21R thus can emit light with a desired brightness.

[LED Module]

Figure 16:
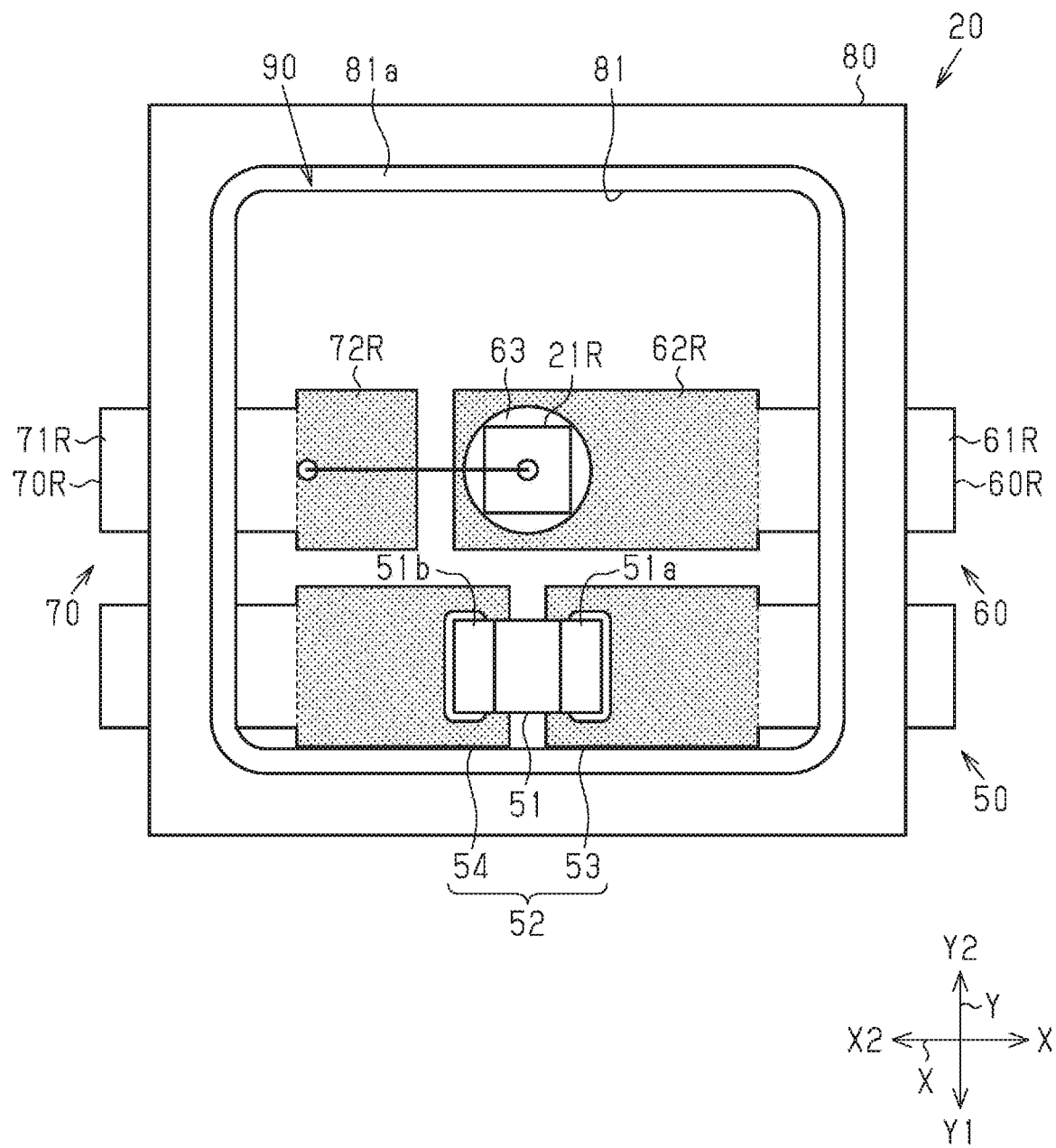
FIG. 16 is a plan view of the LED module.

As shown in FIG. 16, the LED module 20 has a first anode side lead 60R as the anode side lead 60 and a first cathode side lead 70R as the cathode side lead 70.

The first anode side lead 60R and the first cathode side lead 70R are located at the center of the opening 81 of the case 80 in the second direction Y. The first anode support 62R of the first anode side lead 60R is extended toward the first cathode side lead 70R side from the center of the opening 81 of the case 80 in the first direction X. Thus, the first light emitting diode 21R supported by the first anode support 62R is located at the center of the opening 81 of the case 80 in the first direction X and the second direction Y. The mounting structure of the first light emitting diode 21R to the first anode side lead 60R and the electrical connection structure with the first cathode side lead 70R are similar to the first embodiment.

Furthermore, the LED module 20 includes the support lead 52 in the same manner as the LED module 20 of the first embodiment. The mounting structure of the resistance element 51 on the support lead 52 is the same as that of the first embodiment. The identification unit 50 may be located on the other side (Y2 side in FIG. 16) in the second direction Y than the first anode side lead 60R, the first cathode side lead 70R, and the first light emitting diode 21R.

The LED driving system 1 according to the present embodiment has the following advantages.

(37) According to the LED driving circuit 30 and the LED driving device 10, the characteristic information related to the brightness of the emitted light of the first light emitting diode 21R is detected by the detector 32, and thus the quantitative information related to the brightness of the emitted light of the first light emitting diode 21R can be acquired. Then, light of a desired brightness can be obtained by supplying current corresponding to the information to the first light emitting diode 21R. As described above, it is only necessary to read out the resistance value of the resistance element 51 accommodated in the LED module 20, and the technician does not have to adjust the brightness of the emitted light of the first light emitting diode 21R to a desired brightness. Therefore, light of desired brightness can be easily obtained.

(38) According to the LED driving system 1, the control device 40 controls the driving circuit 31 so that the brightness of the emitted light of the first light emitting diode 21R becomes a desired brightness based on the information related to the brightness of the emitted light of the first light emitting diode 21R. Thus, since the brightness of the emitted light of the first light emitting diode 21R is automatically adjusted by the control device 40 to a desired brightness, the technician does not have to adjust the brightness of the emitted light of the first light emitting diode 21R to a desired brightness.

(39) The LED module 20 is obtained by integrating the first light emitting diode 21R and the identification unit 50 into one package. Thus, compared with when the LED module 20 and the identification unit 50 are provided separately, the number of components of the LED driving device 10 and the LED driving system 1 can be reduced.

Sixth Embodiment

A configuration of the LED driving system 1 according to a sixth embodiment will now be described. The LED driving system 1 according to the present embodiment differs from the LED driving system 1 according to the first embodiment in the contents of the table stored in the storage 42 of the control device 40. In the following description, same reference numerals are given to those components that are the same as the corresponding components of LED driving system 1 according to the first embodiment. Such components will not be described in detail. Furthermore, the configuration of the LED driving system 1 according to the second embodiment is the same as the configuration of the LED driving system 1 according to the first embodiment, and thus the elements of the LED driving system 1 described below indicate the elements of the LED driving system 1 of FIGS. 1 and 2.

The storage 42 stores, for example, a table showing the relationship between the resistance value of the resistance element 51 and the first to eighth regions R1 to R8 of the white region R and the brightness as shown in Table 9. Furthermore, the storage 42 stores, for example, a table showing the relationship between the resistance value of the resistance element 51 and the DUTY value of each of the light emitting diodes 21R, 21G, and 21B as shown in Table 10. First, data of the color rank and the brightness of the emitted light of each of the light emitting diodes 21R, 21G, and 21B are recognized in advance by a test or the like. The data of the color rank and the brightness of the emitted light produced by each light emitting diode 21R, 21G, 21B in all combinations of the color rank and the brightness of the emitted light of each of the light emitting diodes 21R, 21G, 21B are recognized in advance by a test or the like. Then, the resistance value corresponding to the respective color rank and brightness of the emitted light produced by each light emitting diode 21R, 21G, 21B of all combinations is set. In the present embodiment, when the light flux of the emitted light of the first light emitting diode 21R is greater than or equal to a predetermined threshold value, the brightness of the emitted light of the first light emitting diode 21R is assumed as "bright", whereas when the light flux of the emitted light of the first light emitting diode 21R is less than the predetermined threshold value, the brightness of the emitted light of the first light emitting diode 21R is assumed as "dark". The brightness of each emitted light of the second light emitting diode 21G and the third light emitting diode 21B is similarly defined. Furthermore, the brightness of the emitted light of each light emitting diode 21R, 21G, 21B may be measured by light intensity, luminance, or illumination instead of measuring by light flux.

As shown in Tables 9 and 10, in the present embodiment, resistance elements 51 of 16 types of resistance values are prepared. A range between the minimum value and the maximum value of the resistance value of the resistance element 51 is preferably set in the range of greater than or equal to 100Ω and less than or equal to 10 kΩ.

TABLE 9

| Resistance value of resistance element | White region | Brightness |
|---|---|---|
| XA1 | R1 | Bright |
| XB1 |  | Dark |
| XA2 | R2 | Bright |
| XB2 |  | Dark |
| XA3 | R3 | Bright |
| XB3 |  | Dark |
| XA4 | R4 | Bright |
| XB4 |  | Dark |
| XA5 | R5 | Bright |
| XB5 |  | Dark |
| XA6 | R6 | Bright |
| XB6 |  | Dark |
| XA7 | R7 | Bright |
| XB7 |  | Dark |

TABLE 9-continued

| Resistance value of resistance element | White region | Brightness |
|---|---|---|
| XA8 | R8 | Bright |
| XB8 |  | Dark |

TABLE 10

| Resistance value of resistance element | 1st DUTY value (R) | 2nd DUTY value (G) | 3rd DUTY value (B) |
|---|---|---|---|
| XA1 | DRA | DGA | DBA |
| XB1 | DRA' | DGA' | DBA' |
| XA2 | DRB | DGB | DBB |
| XB2 | DRB' | DGB' | DBB' |
| XA3 | DRC | DGC | DBC |
| XB3 | DRC' | DGC' | DBC' |
| XA4 | DRD | DGD | DBD |
| XB4 | DRD' | DGD' | DBD' |
| XA5 | DRE | DGE | DBE |
| XB5 | DRE' | DGE' | DBE' |
| XA6 | DRF | DGF | DBF |
| XB6 | DRF' | DGF' | DBF' |
| XA7 | DRG | DGG | DBG |
| XB7 | DRG' | DGG' | DBG' |
| XA8 | DRH | DGH | DBH |
| XB8 | DRH' | DGH' | DBH' |

The DUTY values of each of the light emitting diodes 21R, 21G, and 21B when the brightness is dark in the same region among the first to eighth regions R1 to R8 are larger than the DUTY values of each of the light emitting diodes 21R, 21G, and 21B when the brightness is bright in the same region. The relationship of the magnitude of the DUTY value of each light emitting diode 21R, 21G, 21B when the brightness is dark is the same as the relationship of the magnitude of the DUTY value of each light emitting diode 21R, 21G, 21B when the brightness is bright in the same region. The setting process of the present embodiment is the same as the setting process of the first embodiment.

The LED driving system 1 of the present embodiment has the following advantages in addition to the advantages of the first embodiment.

(40) According to the LED driving circuit 30 and the LED driving device 10, quantitative information related to the color and brightness of the emitted light produced by each of the light emitting diodes 21R, 21G, 21B can be acquired as the characteristic information related to the color and brightness of the emitted light produced by each of the light emitting diodes 21R, 21G, 21B is detected by the detector 32. Then, the color unevenness of the emitted light produced by each of the light emitting diodes 21R, 21G, 21B can be reduced by supplying a drive current corresponding to the information to each of the light emitting diodes 21R, 21G, 21B. Therefore, light of desired color and brightness can be obtained. Then, the resistance value of the resistance element 51 accommodated in the LED module 20 is merely read out, and an operation in which the technician adjusts the color and brightness of the emitted light produced by each of the light emitting diodes 21R, 21G, 21B to a desired color and brightness becomes unnecessary. Therefore, light of a desired color and brightness can be easily obtained.

(41) According to the LED driving system 1, the control device 40 controls the driving circuit 31 so that the color and brightness of the emitted light produced by each of the light emitting diodes 21R, 21G, 21B becomes a desired color and brightness based on the information related to the color and brightness of the emitted light produced by each of the light emitting diodes 21R, 21G, 21B. Thus, the color and brightness of the emitted light produced by each of the light emitting diodes 21R, 21G, 21B are automatically adjusted by the control device 40 to be the desired color and brightness. For this reason, the technician does not have to adjust the color and brightness of the emitted light of each of the light emitting diodes 21R, 21G and 21B to a desired color and brightness. Furthermore, color unevenness of the emitted light produced by each of the light emitting diodes 21R, 21G, 21B can be reduced.

Other Embodiments

The description of each embodiment is an illustration of forms that can be taken by the LED module, the LED driving circuit, the LED driving device, and the LED driving system of the present invention, and is not intended to limit the form. The LED module, the LED driving circuit, the LED driving device, and the LED driving system according to the present invention may be in the form of, for example, a modified example of the above-described embodiments shown below and a form in which at least two non-contradicting modified examples are combined.

Combination of Embodiments

The configuration of the LED module 20 according to the second and sixth embodiments may be changed to the configuration of the LED module 20 according to the fourth embodiment. The configuration of the identification unit 50 of the LED module 20 according to the fourth embodiment may be applied to the identification unit 50 of the LED module 20 according to the fifth embodiment.

The brightness parameters of each light emitting diode 21R, 21G, 21B of the sixth embodiment may be combined with the second and third embodiments.

[LED Driving System]

In the first, second and fourth to sixth embodiments, the control device 40 and the storage 42 may be formed separately. In this case, the control device 40 reads a control program or a table by accessing the storage 42.

In the third embodiment, in place of the control device 40, a first control device for controlling the first light emitting diode 21R, a second control device for controlling the second light emitting diode 21G, and a third control device for controlling the third light emitting diode 21B may be arranged. Each control device includes a processor and storage. The storage may be provided separately from each control device. A table showing the relationship between the combination of the resistance values of the resistance elements 51R, 51G, 51B and the respective DUTY values of the respective light emitting diodes 21R, 21G, 21B is stored in the storage of any of the first to third control devices. The storage of the first control device may store a table showing the relationship between the first resistance value of the resistance element 51R and the color rank of the first light emitting diode 21R. The storage of the second control device may store a table showing the relationship between the second resistance value of the resistance element MG and the color rank of the second light emitting diode 21G. The storage of the third control device may store a table showing the relationship between the third resistance value of the resistance element 51B and the color rank of the third light emitting diode 21B.

In the first embodiment, a table showing the relationship between the voltage value of the A/D converter 32Y and the DUTY value of each light emitting diode 21R, 21G, 21B instead of the resistance value of the resistance element 51 in Table 2 may be stored in storage 42. Thus, the control device 40 can omit calculation of the resistance value from the voltage value of the A/D converter 32Y. The second to sixth embodiments can be changed in the same manner.

In the first embodiment, the number of regions for dividing the white region R shown in FIG. 3 can be freely changed. For example, the white region R may be divided into four regions. In this case, the resistance elements 51 of four types of resistance values corresponding to the four regions are prepared. Also, for example, the white region R may be divided into 16 regions. In this case, the resistance elements 51 of 16 types of resistance values corresponding to the 16 regions are prepared.

In the first embodiment, the storage 42 may store a table showing the relationship between the color rank of light formed by the emitted light of two of the light emitting diodes 21R, 21G and 21B and the resistance value of the color mixing resistance element. This table includes a first table, a second table, and a third table. The first table shows the relationship between the color rank of light formed by the emitted light of the first light emitting diode 21R and the emitted light of the second light emitting diode 21G, and the resistance value of the first color mixing resistance element. The second table shows the relationship between the color rank of light formed by the emitted light of the first light emitting diode 21R and the emitted light of the third light emitting diode 21B, and the resistance value of the second color mixing resistance element. The third table shows the relationship between the color rank of the light formed by the emitted light of the second light emitting diode 21G and the emitted light of the third light emitting diode 21B, and the resistance value of the third color mixing resistance element. The first to third color mixing resistance elements are preferably provided integrally with the LED module 20. Furthermore, the first to third color mixing resistance elements may be mounted separately from the LED module 20, that is, mounted on a substrate on which the LED module 20 and the LED driving circuit 30 are mounted. In this case, the first to third color mixing resistance elements are electrically connected to the detection circuit 32X of the LED driving circuit 30 through the wiring of the substrate.

The color rank of the emitted light produced by the two light emitting diodes of the light emitting diodes 21R, 21G, 21B is divided into, for example, four stages through tests or the like. Each of the first to third color mixing resistance elements is prepared with resistance elements of four types of resistance values according to the color rank. The type of resistance value of each color mixing resistance element can be freely changed. For example, the type of resistance value of each color mixing resistance element may be two types of resistance values or five or more types of resistance values according to the number of color ranks.

According to this configuration, since the information regarding the color rank of the emitted light produced by the two light emitting diodes of the light emitting diodes 21R, 21G, and 21B is detected by the detector 32, the quantitative information related to the color rank of the emitted light produced by the two light emitting diodes of the light emitting diodes 21R, 21G, and 21B can be acquired. Then, by supplying a drive current corresponding to the information to each of the plurality of light emitting diodes, the color unevenness of the emitted light produced by the two light emitting diodes can be reduced. Thus, light of a desired color is obtained.

Furthermore, the control device 40 controls the driving circuit 31 so that the color of the emitted light produced by the two light emitting diodes becomes a desired color based on the information related to the color rank of the emitted light produced by the two light emitting diodes of the light emitting diodes 21R, 21G, 21B. Thus, the color of the emitted light produced by the two light emitting diodes is automatically adjusted to a desired color by the control device 40. Thus, there is no need for the technician to adjust the color of the emitted light produced by the two light emitting diodes to a desired color.

In the above modified example, the storage 42 may store a table showing the relationship between the color rank and the brightness of the emitted light produced by the two light emitting diodes of the light emitting diodes 21R, 21G and 21B and the resistance value of the color mixing resistance element. The brightness is divided into two stages, for example, bright and dark. Each of the first to third color mixing resistance elements is prepared with resistance elements of eight types of resistance values according to the color rank and the brightness. The brightness may be divided into three or more stages. The number of types of resistance values of the color mixing resistance elements is changed according to the number of brightness levels.

According to this configuration, the detector 32 detects the information related to the color rank and the brightness of the emitted light produced by the two light emitting diodes of the light emitting diodes 21R, 21G, and 21B. Thus, quantitative information related to the color rank and the brightness of the emitted light produced by two light emitting diodes of the light emitting diodes 21R, 21G and 21B can be acquired. Then, by supplying a drive current corresponding to the information to each of the two light emitting diodes, the color unevenness of the emitted light produced by the two light emitting diodes can be reduced. Light of the desired color and brightness is thereby obtained.

Furthermore, the control device 40 controls the driving circuit 31 so that color and the brightness of the emitted light produced by the two light emitting diodes becomes a desired color and brightness based on the information related to the color rank and the brightness of the emitted light produced by the two light emitting diodes of each of the light emitting diodes 21R, 21G, 21B. Thus, the color and brightness of the emitted light produced by the two light emitting diodes are automatically adjusted by the control device 40 to be the desired color and brightness. Thus, there is no need for the technician to adjust the color and brightness of the emitted light produced by the two light emitting diodes to the desired color and brightness.

In the above modified example, the storage 42 may store a table showing the relationship between the brightness of the emitted light produced by two light emitting diodes of the light emitting diodes 21R, 21G, and 21B and the resistance value of the color mixing resistance element. The brightness is divided into two stages, for example, bright and dark. Each of the first to third color mixing resistance elements is prepared with resistance elements of two types of resistance values according to the brightness. The brightness may be divided into three or more stages. The number of types of resistance values of the color mixing resistance elements is changed according to the number of brightness levels.

According to this configuration, since the information regarding the brightness of the emitted light produced by the two light emitting diodes of the light emitting diodes 21R, 21G, and 21B is detected by the detector 32, the quantitative information related to the brightness of the emitted light produced by the two light emitting diodes of the light emitting diodes 21R, 21G, and 21B can be acquired. Then, by supplying a drive current corresponding to the information to each of the two light emitting diodes, the color unevenness of the emitted light produced by the two light emitting diodes can be reduced. Therefore, light of a desired brightness can be obtained.

Moreover, the control device 40 controls the driving circuit 31 so that the brightness of the emitted light produced by the two light emitting diodes becomes a desired brightness based on the information related to the brightness of the emitted light produced by the two light emitting diodes of the light emitting diodes 21R, 21G, 21B. Thus, the brightness of the emitted light produced by the two light emitting diodes is automatically adjusted by the control device 40 to be the desired brightness. The work for the worker to adjust the brightness of the emitted light produced by the two light emitting diodes to the desired brightness thus becomes unnecessary.

In the sixth embodiment, the brightness of each of the light emitting diodes 21R, 21G, and 21B is divided into two levels, but the number of brightness levels can be freely changed. For example, the brightness of each of the light emitting diodes 21R, 21G, and 21B may be divided into three or more levels. Furthermore, the brightness of the light emitting diodes of the fifth embodiment can be changed freely as well, and, for example, can be divided into three or more levels.

In each of the above embodiments described above, the color rank of the light emitting diode is divided into four stages, but the number of stages of the color rank can be freely changed. For example, the color rank of the light emitting diode may be divided into two stages, three stages, or five or more stages.

In the setting process of each of the above-described embodiments, the detection circuit 32X (first detection circuit 32RX, second detection circuit 32GX, and third detection circuit 32BX) may flow current to the resistance element 51 (resistance elements 51R, MG, 51B) over a plurality of times to acquire voltage values of a plurality of times. In this case, the control device 40 uses, for example, the average value of the voltage values of a plurality of times to calculate the resistance value (first resistance value, second resistance value, and third resistance value) of the resistance element 51 (resistance elements 51R, 51G, 51B).

In the first to fourth embodiments, each of the DUTY values of each of the light emitting diodes 21R, 21G, and 21B may be adjusted so that the brightness of the emitted light produced by the light emitting diodes 21R, 21G, and 21B becomes a desired brightness. Here, when only the brightness of each light emitting diode 21R, 21G, 21B is to be changed, each DUTY value is increased when brightening and each DUTY value is decreased when darkening without changing the proportion of each DUTY value of each light emitting diode 21R, 21G, 21B. In this case, information related to the combination of the brightness of each of the light emitting diodes 21R, 21G, 21B is included as the characteristic information. For example, in when there are eight combinations in the brightness of each of the light emitting diodes 21R, 21G and 21B, eight types of resistance elements 51 having different resistance values are prepared. A range between the minimum value and the maximum value of the resistance value of the resistance element 51 is preferably set in the range of greater than or equal to 100Ω and less than or equal to 10Ω.

According to the LED driving circuit 30 and the LED driving device 10 having such a configuration, since the characteristic information related to the brightness of the emitted light produced by the light emitting diodes 21R, 21G, 21B is detected by the detector 32, quantitative information related to the brightness of the emitted light produced by each of the light emitting diodes 21R, 21G, 21B can be acquired. Then, the brightness of the emitted light produced by each of the light emitting diodes 21R, 21G, 21B is easily made to a desired brightness by supplying current corresponding to the information to each of the light emitting diodes 21R, 21G, 21B. Therefore, the brightness of the emitted light produced by each of the light emitting diodes 21R, 21G, 21B can be easily adjusted to emit light with a desired brightness.

Furthermore, the control device 40 controls the driving circuit 31 so that the brightness of the emitted light produced by each of the light emitting diodes 21R, 21G, 21B becomes a desired brightness based on the characteristic information related to the brightness of the emitted light produced by each of the light emitting diodes 21R, 21G, 21B. Thus, the brightness of the emitted light produced by each of the light emitting diodes 21R, 21G, 21B are automatically adjusted by the control device 40 to be the desired brightness. The work for the worker to adjust the brightness of the emitted light produced by the two light emitting diodes to the desired brightness thus becomes unnecessary.

[LED Module]

In the first to fourth and sixth embodiments, the LED module 20 may further include a third Zener diode connected in parallel to the first light emitting diode 21R to avoid the application of an excessive reverse voltage to the first light emitting diode 21R. In this case, the third Zener diode is mounted on the first anode side lead 60R. The electrical connection structure between the third Zener diode and the first cathode side lead 70R is similar to, for example, the electrical connection structure between the first Zener diode 22 and the second cathode side lead 70G. The third Zener diode may be mounted on the first cathode side lead 70R. In this case, the bottom electrode of the third Zener diode is a cathode, and the surface electrode is an anode. The surface electrode is connected to the first anode side lead 60R by wire bonding.

In the first to fourth and sixth embodiments, at least one of the first Zener diode 22 and the second Zener diode 23 may be omitted. In this case, the LED module 20 may include the third Zener diode of the modified example described above.

In the fifth embodiment, the LED module 20 may include the third Zener diode of the modified example described above.

In the first to fourth and sixth embodiments, the LED module 20 may have a configuration including two light emitting diodes among the first light emitting diode 21R, the second light emitting diode 21G, and the third light emitting diode 21B. In this case, the anode side lead and the cathode side lead corresponding to the omitted light emitting diode are omitted. When one of the second light emitting diode 21G and the third light emitting diode 21B is omitted, the Zener diode corresponding to the omitted light emitting diode is also omitted. In this case, in the first, fourth, and sixth embodiments, a color mixing resistance element having a resistance value corresponding to the color rank of the color mixing of the modified example is prepared as the resistance element 51. In the second embodiment, the resistance element 51 having a resistance value corresponding to a combination of color ranks of the emitted light of the two light emitting diodes is prepared. In the third embodiment, the resistance element corresponding to the omitted light emitting diode among the resistance elements 51R, 51G, and 51B is omitted. The support lead corresponding to the omitted resistance element of the support lead 52R, the support lead 52G, and the support lead 52B is omitted.

Figure 17A:
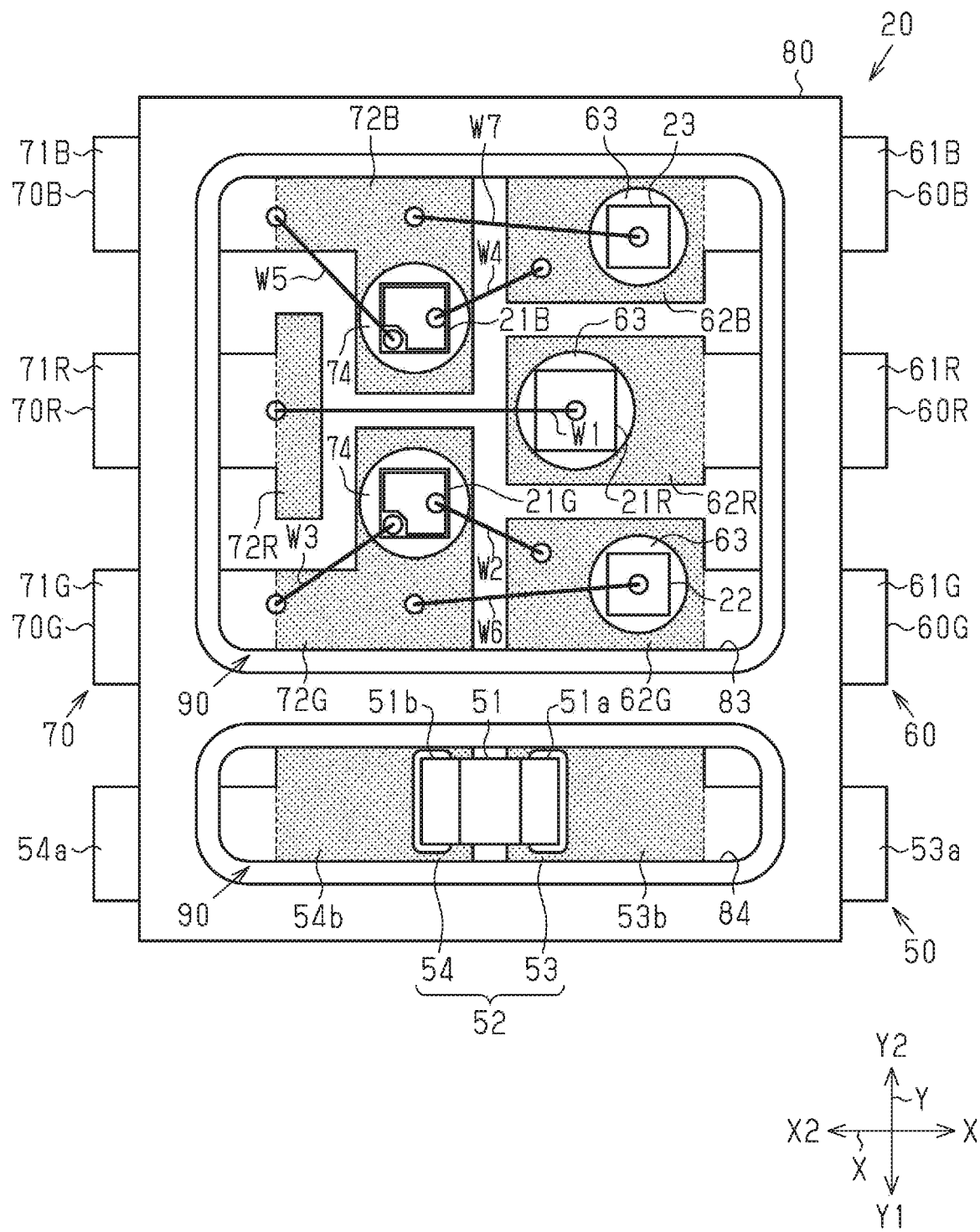
FIG. 17A is a plan view of an LED module according to a modified example.
Figure 17B:
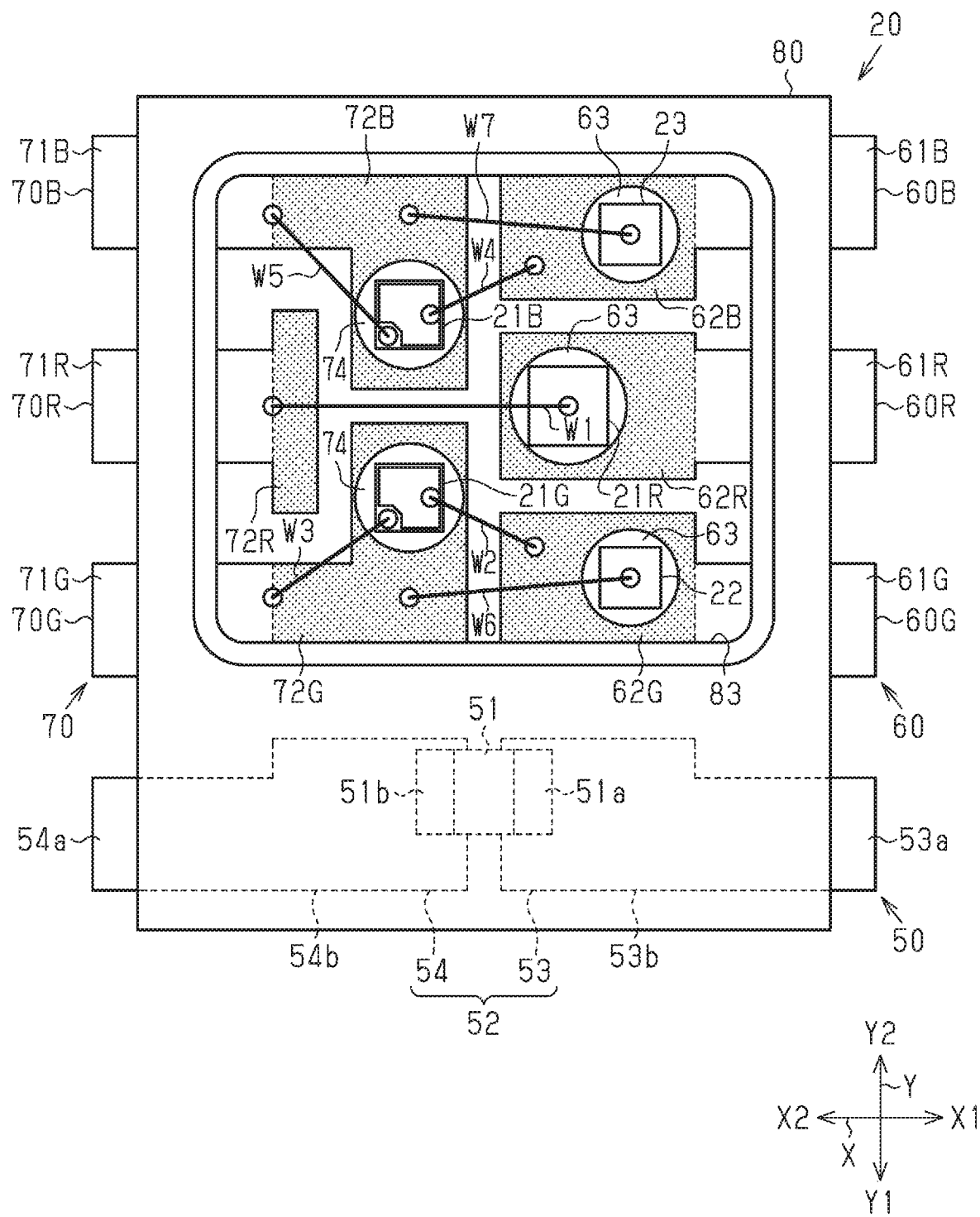
FIG. 17B is a plan view of an LED module according to a modified example.

In the first, second, and sixth embodiments, as shown in FIG. 17A, the case 80 has a first opening 83 and a second opening 84. The first opening 83 and the second opening 84 are aligned in the second direction Y. The first opening 83 is formed to a substantially square shape in a plan view of the LED module 20. The first opening 83 accommodates the light emitting diodes 21R, 21G, 21B, the first Zener diode 22, and the second Zener diode 23. The light emitting diodes 21R, 21G, and 21B are arranged in the vicinity of the center of the first opening 83 in the first direction X and the second direction Y, respectively. The second opening 84 is substantially rectangular in which the first direction X is a longitudinal direction in a plan view of the LED module 20. The second opening 84 accommodates the resistance element 51. Each of the first opening 83 and the second opening 84 is filled with a sealing resin 90. The second opening 84 does not have to be filled with the sealing resin 90. Furthermore, as shown in FIG. 17B, only the first opening 83 may be formed in the case 80. That is, the resistance element 51 may be embedded in the peripheral wall of the case 80. According to the configuration shown in FIGS. 17A and 17B, the light emitting diodes 21R, 21G, and 21B can be arranged near the center of the first opening 83 in the first direction X and the second direction Y.

Furthermore, in the third embodiment as well, the case 80 may be changed to a case having the first opening 83 and the second opening 84. In this case, the second opening 84 is substantially square in a plan view of the LED module 20 or substantially rectangular in which the second direction Y is a longitudinal direction. In the third embodiment as well, the case 80 can be changed to a case 80 in which only the first opening 83 is formed. Moreover, in the fifth embodiment as well, the case 80 may be changed to a case 80 having the first opening 83 and the second opening 84. In this case, the first opening 83 accommodates one light emitting diode, and the second opening 84 accommodates the resistance element 51. In the fifth embodiment as well, the case 80 can be changed to a case 80 in which only the first opening 83 is formed.

Figure 18:
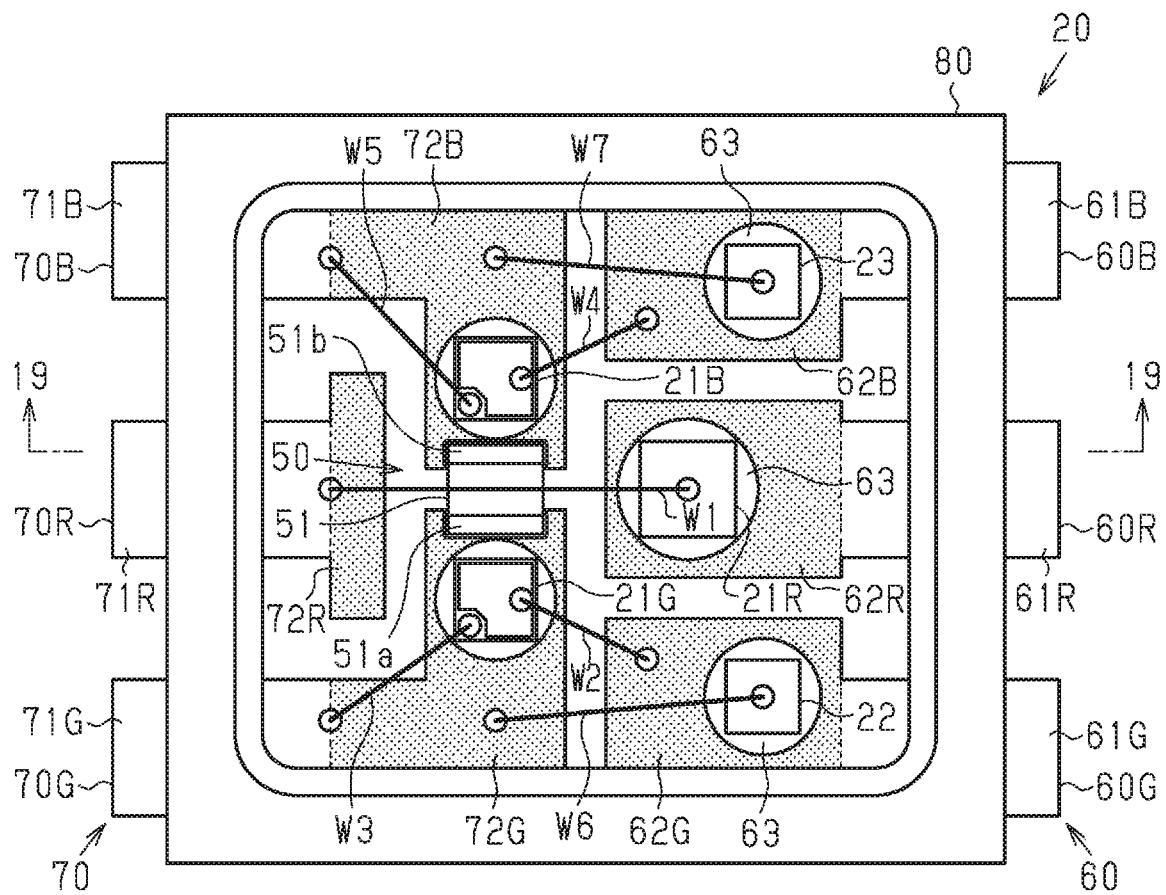
FIG. 18 is a plan view of an LED module according to a modified example.
Figure 18:
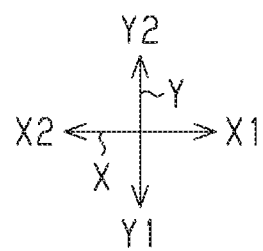
Figure 19:
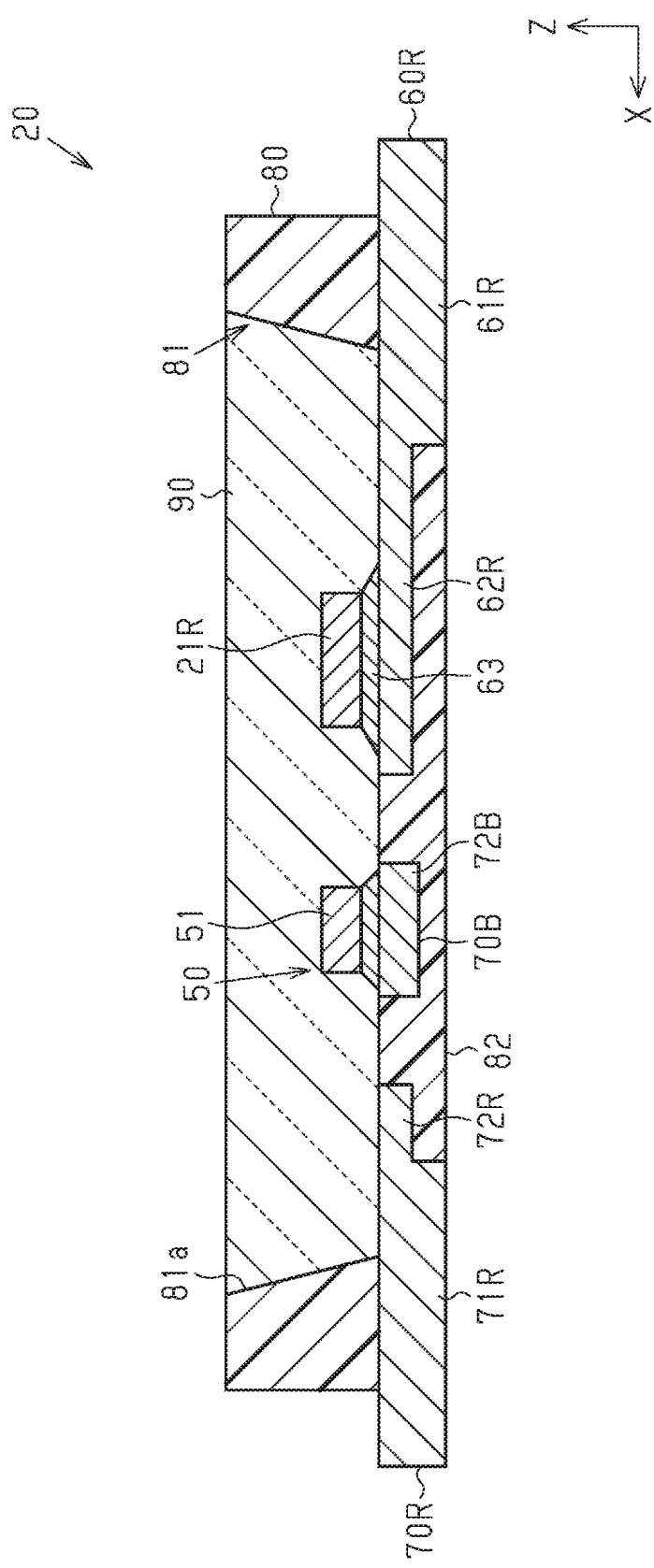
FIG. 19 is a cross-sectional view taken along line 19-19 in FIG. 18.

In the first, second, fourth, and sixth embodiments, as shown in FIG. 18, the resistance element 51 may be arranged to cross the second cathode support 72G of the second cathode side lead 70G and the third cathode support 72B of the third cathode side lead 70B, and may be electrically connected to the second cathode support 72G and the third cathode support 72B. As shown in FIG. 19, the resistance element 51 is located on the surface of the second cathode support 72G and the surface of the third cathode support 72B, that is, the resistance element 51 is located on a side opposite to the back surface 82 of the case 80 with respect to the second cathode support 72G and the third cathode support 72B. In this case, the wire W1 connected to the first light emitting diode 21R is formed to extend across the resistance element 51.

The detection circuit 32X (see FIG. 2) is electrically connected to the second cathode terminal 71G of the second cathode side lead 70G and the third cathode terminal 71B of the third cathode side lead 70B. Thus, the second cathode terminal 71G forms a first detection terminal, and the third cathode terminal 71B forms a second detection terminal.

Figure 20:
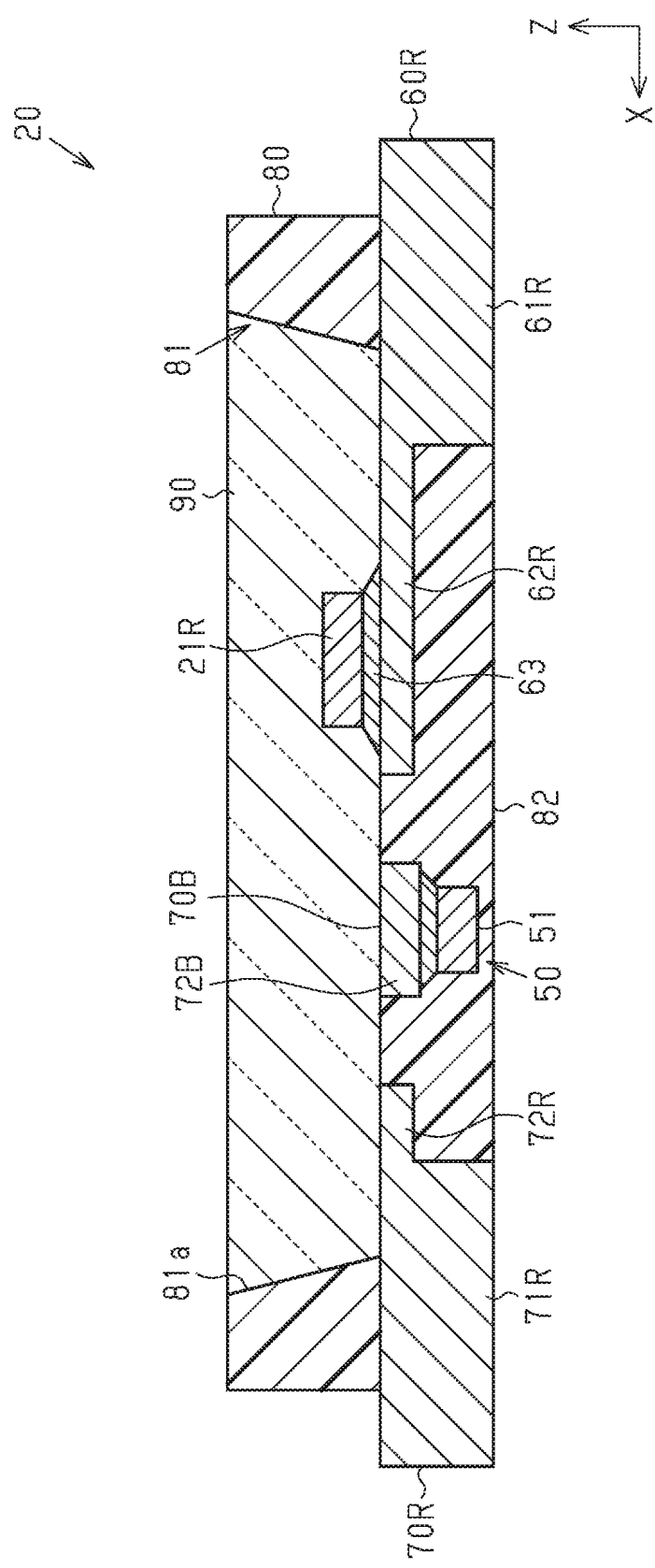
FIG. 20 is a cross-sectional view of the LED module according to the modified example of FIG. 19.

In the modified example shown in FIGS. 18 and 19, as shown in FIG. 20, the resistance element 51 may be embedded in case 80. More specifically, the resistance element 51 is located on the back surface 82 side of the case 80 with respect to the second cathode support 72G and the third cathode support 72B, and electrically connected to the second cathode support 72G and the third cathode support 72B.

In the fourth embodiment, the resistance element 51 may be arranged to overlap with one of the second anode support 62G and the second cathode support 72G in a plan view of the LED module 20, and not to overlap with the other one of the second anode support 62G and the second cathode support 72G. Furthermore, the resistance element 51 may be arranged to overlap with one of the third anode support 62B and the third cathode support 72B in a plan view of the LED module 20, and to not overlap with the other one of the third anode support 62B and the third cathode support 72B. In addition, the resistance element 51 may be arranged so as to overlap both the first anode support 62R and the first cathode support 72R in a plan view of the LED module 20.

In each embodiment, the first light emitting diode 21R may be a 2-wire type LED chip.

In the first to fourth and sixth embodiments, at least one of the second light emitting diode 21G and the third light emitting diode 21B may be a single-wire type LED chip.

In each embodiment, a Zener diode or a capacitor may be used instead of the resistance element 51 as a passive element of the identification unit 50 (first identification unit 50R, second identification unit 50G, and third identification unit 50B).

In each of the above embodiments, the LED module 20 of the type in which the anode side lead 60, the cathode side lead 70, and the support lead 52 are molded with resin has been described as an example, but the present invention is also applicable to other types of LED module. For example, the present invention is also applicable to an LED module in which a light emitting diode and a resistance element are mounted on an insulating substrate having a wiring pattern formed on the surface and the light emitting diode is protected by being covered with a translucent resin. Here, the wiring pattern corresponds to the anode side lead 60, the cathode side lead 70, and the support lead 52 in each of the above embodiments. Examples of the insulating substrate include a glass epoxy substrate and a ceramic substrate. The translucent resin may cover the resistance element in addition to the light emitting diode.

In the first to fourth and sixth embodiments, the configuration in which the identification unit 50 is provided to the LED module 20 incorporating one set of light emitting diode 21R, 21G, 21B has been described, but the present invention is not limited in such a manner. The number of light emitting diodes and the number of identification units to be mounted on one LED module 20 can be freely changed. For example, one or two identification units 50 may be provided on an LED module in which two sets of light emitting diodes 21R, 21G, and 21B are incorporated in one package.

In each embodiment, the LED module 20 and the identification unit 50 (first identification unit 50R, second identification unit 50G, and third identification unit 50B) may be provided separately. In this case, the identification unit 50 (first identification unit 50R, second identification unit 50G, and third identification unit 50B) is mounted on a substrate on which the LED module 20 and the LED driving circuit 30 are mounted. In this case, the identification unit 50 is electrically connected to the detector 32 of the LED driving circuit 30 through the wiring of the substrate. The first identification unit 50R, the second identification unit 50G, and the third identification unit 50B are electrically connected to the first detection circuit 32RX, the second detection circuit 32GX, and the third detection circuit 32BX of the LED driving circuit 30 through the wiring of the substrate.

[LED Driving Circuit]

Figure 21:
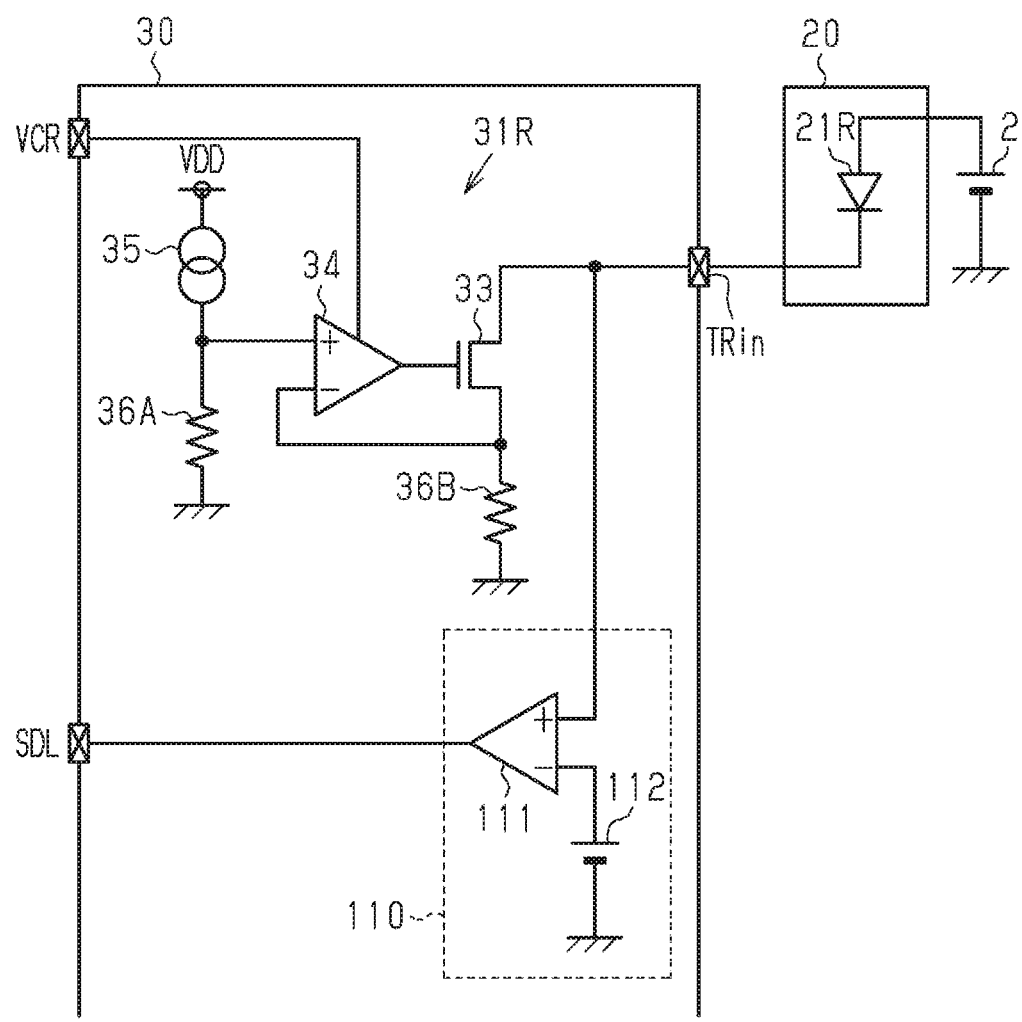
FIG. 21 is a circuit diagram of part of an LED driving circuit according to a modified example.

In each embodiment, the LED driving circuit 30 may further include a protective circuit 110. As shown in FIG. 21, the protective circuit 110 is provided in the first driving circuit 31R. The protective circuit 110 includes an operational amplifier 111 and a power supply 112 that generates a detection voltage (e.g., 0.1 V). The non-inverted input terminal (+) of the operational amplifier 111 is connected to the first input terminal TRin. The inverted input terminal (−) of the operational amplifier 111 is connected to the positive electrode of the power supply 112. The negative electrode of the power supply 112 is connected to ground. The output terminal of the operational amplifier 111 is connected to the detection terminal SDL. The detection terminal SDL is electrically connected to the control device 40. Thus, the protective circuit 110 detects a short circuit of the first light emitting diode 21R based on the comparison between the voltage of the cathode of the first light emitting diode 21R and the detection voltage by the operational amplifier 111, and outputs an abnormality signal to the control device 40 via the detection terminal SDL when short circuit is detected in the first light emitting diode 21R. Although not shown in FIG. 21, the protective circuit 110 is similarly provided in the second driving circuit 31G and the third driving circuit 31B.

When receiving an abnormality signal from one of the protective circuit 110 of the first driving circuit 31R, the protective circuit 110 of the second driving circuit 31G, and the protective circuit 110 of the third driving circuit 31B, the control device 40 may stop the light emission of all the light emitting diodes 21R, 21G, 21B. Furthermore, the control device 40 may stop only the light emission of the light emitting diode corresponding to the protective circuit 110 which has output the abnormal signal among the protective circuits 110 of the driving circuits 31R, 31G, 31B.

Embodiments

The technical ideas which can be recognized from each of the embodiments described above and each of the modified examples described above will now be described.

Embodiment A1

An LED module including:
at least one light emitting diode; and
an identification unit including characteristic information related to light emission characteristics of the light emitting diode.

Embodiment A2

The LED module according to embodiment A1, wherein
the light emitting diode includes a plurality of the light emitting diodes, and
the identification unit includes at least one of information related to a color rank of emitted light produced by the plurality of light emitting diodes and information related to a brightness of the emitted light produced by the plurality of light emitting diodes as the characteristic information.

Embodiment A3

The LED module according to embodiment A2, wherein
the light emitting diodes include a first light emitting diode that emits red light, a second light emitting diode that emits green light, and a third light emitting diode that emits blue light, and
the identification unit includes, as the characteristic information, at least one of information related to a color rank of emitted light produced by the first light emitting diode, the second light emitting diode, and the third light emitting diode and information related to a brightness of emitted light produced by the first light emitting diode, the second light emitting diode and the third light emitting diode.

Embodiment A4

The LED module according to any one of embodiments A1 to A3, wherein the identification unit includes a resistance element as a passive element having a characteristic value corresponding to the light emission characteristic.

Embodiment B1

A manufacturing method of an LED module including at least one light emitting diode and a passive element, the manufacturing method including an element selecting process of preparing passive elements of plural types of characteristic values being prepared as the passive element and selecting one passive element from the passive elements of the plural types of characteristic values based on the light emission characteristic of the light emitting diode.

Embodiment B2

The manufacturing method of the LED module according to embodiment B1, wherein
the light emitting diode includes a first light emitting diode that emits red light, a second light emitting diode that emits green light, and a third light emitting diode that emits blue light, and
in the element selecting process, passive elements of plural types of characteristic values are prepared as the passive element, and one passive element from the passive elements of plural types of characteristic values is selected based on information related to at least one of a color rank and a brightness of emitted light produced by the first light emitting diode, the second light emitting diode, and the third light emitting diode.

Embodiment B3

A manufacturing method of an LED module, wherein the LED module includes:
a first light emitting diode that emits red light; a second light emitting diode that emits green light; and a third light emitting diode that emits blue light; and
a passive element having a characteristic value corresponding to at least one of information related to a combination of a color rank of emitted light of the first light emitting diode, a color rank of emitted light of the second light emitting diode, and a color rank of emitted light of a third light emitting diode and information related to a combination of a brightness of emitted light of the first light emitting diode, a brightness of emitted light of the second light emitting diode, and a brightness of emitted light of a third light emitting diode, the manufacturing method including
an element selecting process of preparing passive elements of plural types of characteristic values as the passive element and selecting one passive element from the passive elements having plural types of characteristic values based on at least one of the information related to a combination of a color rank of emitted light of the first light emitting diode, a color rank of emitted light of the second light emitting diode, and a color rank of emitted light of a third light emitting diode and the information related to a combination of a brightness of emitted light of the first light emitting diode, a brightness of emitted light of the second light emitting diode, and a brightness of emitted light of a third light emitting diode.

Embodiment C1

The LED driving circuit according to claim 1, wherein
the drive signal is provided as a pulse signal of a DUTY corresponding to the characteristic information, and
the driving circuit includes a switching element connected to the light emitting diode and activates and deactivates the switching element in accordance with the drive signal to supply a drive current corresponding to the characteristic information to the light emitting diode.

Embodiment C2

The LED driving device according to claim 7, wherein
the drive signal is provided as a pulse signal of a DUTY corresponding to the characteristic information, and
the driving circuit includes a switching element connected to the light emitting diode and activates and deactivates the switching element in accordance with the drive signal to supply a drive current corresponding to the characteristic information to the light emitting diode.

Embodiment C3

The LED driving system according to claim 15, wherein
the control device stores a duty value corresponding to the characteristic information and outputs a pulse signal of the DUTY value corresponding to the characteristic information as the drive signal, and
the driving circuit includes a switching element connected to the light emitting diode and activates and deactivates the switching element in accordance with the drive signal to supply a drive current corresponding to the characteristic information to the light emitting diode.

Embodiment D1

An LED module including:
a plurality of light emitting diodes;
an anode side electrode connected to an anode of the light emitting diode;
a cathode side electrode connected to a cathode of the light emitting diode;
a passive element;
a support member that supports the light emitting diode, the anode side electrode, the cathode side electrode, and the passive element; and
a translucent protective member that covers the plurality of light emitting diodes, wherein the passive element is arranged spaced apart from the anode side electrode and the cathode side electrode in a height direction of the LED module, and part of a case is located between the passive element and the anode side electrode and the cathode side electrode in the height direction.

Embodiment E1

A manufacturing method of an LED module, wherein the LED module includes:

a plurality of light emitting diodes;

an anode side electrode connected to an anode of the light emitting diode;

a cathode side electrode connected to a cathode of the light emitting diode;

a passive element; and a support member that supports the light emitting diode, the anode side electrode, the cathode side electrode, and the passive element, the manufacturing method including:

an electrode manufacturing process of forming the anode side electrode and the cathode side electrode;

a mounting process of mounting the light emitting diode on the anode side electrode or the cathode side electrode formed in the electrode manufacturing process;

an element arranging process of arranging the passive element; and a support member molding process of forming the support member.

Embodiment E2

The manufacturing method of the LED module according to embodiment E1, wherein a support electrode that supports the passive element is further provided, the support electrode is formed in the electrode manufacturing process, and the passive element is mounted on the support electrode in the element arranging process.

Embodiment E3

The manufacturing method of the LED module according to embodiment E2, wherein the anode side electrode, the cathode side electrode, and the support electrode are integrally formed in the electrode manufacturing process.

Embodiment E4

The manufacturing method of the LED module according to any one of embodiments E1 to E3, wherein in the element arranging process, passive elements of plural types of characteristic values are prepared as the passive element, and one passive element among the passive elements having the plural types of characteristic values is selected based on information related to at least one of a color rank and a brightness of the light emitting diode.

Embodiment E5

The manufacturing method of the LED module according to embodiments E1 to E3, wherein the light emitting diode includes a first light emitting diode that emits red light, a second light emitting diode that emits green light, and a third light emitting diode that emits blue light, and in the element arranging process, passive elements of plural types of characteristic values are prepared as the passive element, and one passive element from the passive elements of plural types of characteristic values is selected based on information related to at least one of a color rank and a brightness of emitted light produced by the first light emitting diode, the second light emitting diode, and the third light emitting diode.

Embodiment E6

The manufacturing method of the LED module according to embodiments E1 to E3, wherein the light emitting diode includes a first light emitting diode that emits red light, a second light emitting diode that emits green light, and a third light emitting diode that emits blue light, and in the element arranging process, passive elements of plural types of characteristic values are prepared as the passive element, and one passive element from the passive elements of plural types of characteristic values is selected based on at least one of information related to a combination of a color rank of emitted light of the first light emitting diode, a color rank of emitted light of the second light emitting diode, and a color rank of emitted light of the third light emitting diode and information related to a combination of a brightness of emitted light of the first light emitting diode, a brightness of emitted light of the second light emitting diode, and a brightness of emitted light of the third light emitting diode.

Embodiment E7

A manufacturing method of a LED module, wherein the LED module includes:

at least one light emitting diode; and a passive element having a characteristic value corresponding to a light emission characteristic of the light emitting diode, the manufacturing method including an element selecting process of, preparing passive elements of plural types of characteristic values as the passive element and selecting one passive element from the passive elements of the plural types of characteristic values based on the light emission characteristic of the light emitting diode.

Embodiment E8

A manufacturing method of an LED module, wherein the LED module includes:

a first light emitting diode that emits red light; a second light emitting diode that emits green light; and a third light emitting diode that emits blue light; and a passive element having a characteristic value corresponding to at least one of information related to a combination of a color rank of emitted light of the first light emitting diode, a color rank of emitted light of the second light emitting diode, and a color rank of emitted light of a third light emitting diode, and information related to a combination of a brightness of emitted light of the first light emitting diode, a brightness of emitted light of the second light emitting diode, and a brightness of emitted light of a third light emitting diode, the manufacturing method including an element selecting process of preparing passive elements of plural types of characteristic values as the passive element and selecting a passive element from the passive elements having plural types of characteristic values based on at least one of the information related to a combination of a color rank of emitted light of the first light emitting diode, a color rank of emitted light of the second light emitting diode, and a color rank of emitted light of a third light emitting diode and information related to a combination of a brightness of emitted light of the first light emitting diode, a brightness of emitted light of the second light emitting diode, and a brightness of emitted light of a third light emitting diode.

DESCRIPTION OF REFERENCE CHARACTERS

1) LED driving system
10) LED driving device
20) LED module
21R) first light emitting diode (light emitting diode)
21G) second light emitting diode (light emitting diode)
21B) third light emitting diode (light emitting diode)
22) first Zener diode (Zener diode)
23) second Zener diode (Zener diode)
30) LED driving circuit
31) driving circuit
31R) first driving circuit
31G) second driving circuit
31B) third driving circuit
32) detector
32X) detection circuit
32RX) first detection circuit (detection circuit)
32GX) second detection circuit (detection circuit)
32BX) third detection circuit (detection circuit)
32Y) A/D converter (conversion circuit)
32RY) first A/D converter (conversion circuit)
32GY) second A/D converter (conversion circuit)
32BY) third A/D converter (conversion circuit)
40) control device
50) identification unit
50R) first identification unit (identification unit)
50G) second identification unit (identification unit)
50B) third identification unit (identification unit)
51, 51R, 51G, 51B) resistance element (passive element)
51a) first terminal
51b) second terminal
52, 52R, 52G, 52B) support lead (support electrode)
53, 53R, 53G, 53B) first support lead (first support electrode)
53a) first terminal
53b) first support
54, 54R, 54G, 54B) second support lead (second support electrode)
54a) second terminal
54b) second support
55a) first terminal
55b) first support
56a) second terminal
56b) second support
57A) first detection terminal
57B) second detection terminal
58A) first wiring
58B) second wiring
60) anode side lead (anode side electrode)
60R) first anode side lead (first anode side electrode)
60G) second anode side lead (second anode side electrode)
60B) third anode side lead (third anode side electrode)
61R) first anode terminal (anode terminal)
61G) second anode terminal (anode terminal)
61B) third anode terminal (anode terminal)
62R) first anode support (anode support)
62G) second anode support (anode support)
62B) third anode support (anode support)
70) cathode side lead (cathode side electrode)
70R) first cathode side lead (first cathode side electrode)
70G) second cathode side lead (second cathode side electrode)
70B) third cathode side lead (third cathode side electrode)
71R) first cathode terminal (cathode terminal)
71G) second cathode terminal (cathode terminal)
71B) third cathode terminal (cathode terminal)
72R) first cathode support (cathode support)
72G) second cathode support (cathode support)
72B) Third cathode support (cathode support)
80) case (support member)
82) back surface
83) first opening
84) second opening
90) sealing member (protective member)
X) first direction
Y) second direction
Z) third direction (height direction)

The invention claimed is:

1. An LED driving circuit that drives an LED module including a light emitting diode and an identification unit having characteristic information related to light emission characteristics of the light emitting diode, the LED driving circuit comprising:
a detector that detects the characteristic information and generates a detection signal corresponding to the characteristic information; and
a driving circuit that generates a drive current with a drive signal provided in accordance with the characteristic information based on the detection signal and supplies the drive current to drive the light emitting diode, wherein
the identification unit includes a resistance element having a resistance value corresponding to the characteristic information,
the detector detects the characteristic information from a voltage value when current flows to the resistance element, and
the detector includes:
a detection circuit that generates a voltage corresponding to the resistance element; and
a conversion circuit that converts the voltage into the characteristic information.

2. The LED driving circuit according to claim 1, wherein the LED module includes a plurality of the light emitting diodes,
the characteristic information includes at least one of information related to a color rank of emitted light produced by the plurality of light emitting diodes and information related to a brightness of emitted light produced by the plurality of light emitting diodes, and
the driving circuit generates the drive current based on the characteristic information for each of the plurality of light emitting diodes and supplies the drive current to drive each of the plurality of light emitting diodes.

3. The LED driving circuit according to claim 1, wherein:
the light emitting diode includes a first light emitting diode that emits red light, a second light emitting diode that emits green light, and a third light emitting diode that emits blue light;
the characteristic information includes at least one of information related to a color rank of emitted light produced by the first light emitting diode, the second light emitting diode, and the third light emitting diode and information related to a brightness of emitted light produced by the first light emitting diode, the second light emitting diode, and the third light emitting diode; and the driving circuit generates a first drive current supplied to the first light emitting diode, a second drive current supplied to the second light emitting diode, and a third drive current supplied to the third light emitting diode as the drive current based on the characteristic information, and the driving circuit supplies the first drive current, the second drive current, and the third drive current to respectively drive the first light emitting diode, the second light emitting diode, and the third light emitting diode.

4. The LED driving circuit according to claim 1, wherein:
the light emitting diode includes a first light emitting diode that emits red light, a second light emitting diode that emits green light, and a third light emitting diode that emits blue light;

the characteristic information includes at least one of information related to a combination of a color rank of emitted light of the first light emitting diode, a color rank of emitted light of the second light emitting diode, and a color rank of emitted light of the third light emitting diode and information related to a combination of a brightness of emitted light of the first light emitting diode, a brightness of emitted light of the second light emitting diode, and a brightness of emitted light of the third light emitting diode; and the driving circuit generates a first drive current supplied to the first light emitting diode, a second drive current supplied to the second light emitting diode, and a third drive current supplied to the third light emitting diode as the drive current based on the characteristic information, and the driving circuit supplies the first drive current, the second drive current, and the third drive current to respectively drive the first light emitting diode, the second light emitting diode, and the third light emitting diode.

5. An LED driving device comprising:
an LED module including a light emitting diode; and
an LED driving circuit that drives the light emitting diode, wherein
the LED module includes an identification unit having characteristic information related to light emission characteristics of the light emitting diode,
the LED driving circuit includes
a detector that detects the characteristic information and generates a detection signal corresponding to the characteristic information, and
a driving circuit that generates a drive current with a drive signal provided in accordance with the characteristic information based on the detection signal and supplies the drive current to drive the light emitting diode,
the identification unit includes a resistance element having a resistance value corresponding to the characteristic information,
the detector detects the characteristic information from a voltage value when current flows to the resistance element, and
the detector includes:
  a detection circuit that generates a voltage corresponding to the resistance element; and
  a conversion circuit that converts the voltage into the characteristic information.

6. The LED driving device according to claim 5, wherein the resistance value of the resistance element is greater than or equal to 100Ω and less than or equal to 10 kΩ.

7. The LED driving device according to claim 5, wherein the LED module is a package of the light emitting diode and the identification unit.

8. The LED driving device according to claim 5, wherein the LED module includes a plurality of the light emitting diodes,
the characteristic information includes at least one of information related to a color rank of emitted light produced by the plurality of light emitting diodes and information related to a brightness of emitted light produced by the plurality of light emitting diodes, and
the driving circuit generates the drive current based on the characteristic information for each of the plurality of light emitting diodes and supplies the drive current to drive each of the plurality of light emitting diodes.

9. The LED driving device according to claim 5, wherein:
the light emitting diode includes a first light emitting diode that emits red light, a second light emitting diode that emits green light, and a third light emitting diode that emits blue light;

the characteristic information includes at least one of information related to a color rank of emitted light produced by the first light emitting diode, the second light emitting diode, and the third light emitting diode and information related to a brightness of emitted light produced by the first light emitting diode, the second light emitting diode, and the third light emitting diode; and the driving circuit generates a first drive current supplied to the first light emitting diode, a second drive current supplied to the second light emitting diode, and a third drive current supplied to the third light emitting diode as the drive current based on the characteristic information, and the driving circuit supplies the first drive current, the second drive current, and the third drive current to respectively drive the first light emitting diode, the second light emitting diode, and the third light emitting diode.

10. The LED driving device according to claim 5, wherein:
the light emitting diode includes a first light emitting diode that emits red light, a second light emitting diode that emits green light, and a third light emitting diode that emits blue light, the characteristic information includes at least one of information related to a combination of a color rank of emitted light of the first light emitting diode, a color rank of emitted light of the second light emitting diode, and a color rank of emitted light of the third light emitting diode and information related to a combination of a brightness of emitted light of the light emitting diode, a brightness of emitted light of the second light emitting diode, and a brightness of emitted light of the third light emitting diode; and the driving circuit generates a first drive current supplied to the first light emitting diode, a second drive current supplied to the second light emitting diode, and a third drive current supplied to the third light emitting diode as the drive current based on the characteristic information, and the driving circuit supplies the first drive current, the second drive current, and the third drive current to respectively drive the first light emitting diode, the second light emitting diode, and the third light emitting diode.

11. An LED driving system comprising:
an LED module including a light emitting diode, an LED driving circuit that drives the light emitting diode, and a control device that controls the LED driving circuit, wherein
the LED module includes an identification unit having characteristic information related to light emission characteristics of the light emitting diode,
the LED driving circuit includes
a detector provided to detect the characteristic information, generate a detection signal corresponding to the characteristic information, and output the detection signal to the control device, and
a driving circuit that drives the light emitting diode,
the control device generates a drive signal corresponding to the characteristic information based on the detection signal, and the control device outputs the drive signal to the driving circuit,
the driving circuit generates a drive current with the drive signal and supplies the drive current to drive the light emitting diode,
the identification unit includes a resistance element having a resistance value corresponding to the characteristic information,
the detector is connected to the resistance element and detects the characteristic information from a voltage value when current flows to the resistance element, and
the control device generates the drive signal based on the voltage value of the detector, and
the detector includes
a detection circuit that generates a voltage corresponding to the resistance element; and
a conversion circuit that converts the voltage into the characteristic information.

12. The LED driving system according to claim 11, wherein:
the light emitting diode includes a first light emitting diode that emits red light, a second light emitting diode that emits green light, and a third light emitting diode that emits blue light;
the characteristic information includes at least one of information related to a combination of a color rank of emitted light produced by the first light emitting diode, a color rank of emitted light produced by the second light emitting diode, and a color rank of emitted light produced by the third light emitting diode and information related to a combination of a brightness of emitted light produced by the first light emitting diode, a brightness of emitted light produced by the second light emitting diode, and a brightness of emitted light produced by the third light emitting diode;
the control device generates a first drive signal for driving the first light emitting diode, a second drive signal for driving the second light emitting diode, and a third drive signal for driving the third light emitting diode in accordance with the characteristic information, and the control device outputs the first drive signal, the second drive signal, and the third drive signal to the driving circuit; and
the driving circuit generates a first drive current supplied to the first light emitting diode in accordance with the first drive signal, a second drive current supplied to the second light emitting diode in accordance with the second drive signal, and a third drive current supplied to the third light emitting diode in accordance with the third drive signal, and the driving circuit supplies the first drive current, the second drive current, and the third drive current to respectively drive the first light emitting diode, the second light emitting diode, and the third light emitting diode.

13. The LED driving system according to claim 11, wherein the resistance value of the resistance element is greater than or equal to 100Ω and less than or equal to 10 kΩ.

14. The LED driving system according to claim 11, wherein the detector detects the characteristic information before the light emitting diode is driven by the driving circuit.

15. The LED driving system according to claim 11, wherein the LED module is a package of the light emitting diode and the identification unit.

16. The LED driving system according to claim 11, wherein
the LED module includes a plurality of the light emitting diodes,
the characteristic information includes at least one of information related to a color rank of emitted light produced by the plurality of light emitting diodes and information related to a brightness of the emitted light produced by the plurality of light emitting diodes,
the control device generates the drive signal corresponding to the characteristic information for each of the plurality of light emitting diodes and outputs the drive signal to the driving circuit, and
the driving circuit generates the drive current for each of the plurality of light emitting diodes according to the drive signal and supplies the drive current to drive each of the plurality of light emitting diodes.

17. The LED driving system according to claim 11, wherein:
the light emitting diode includes a first light emitting diode that emits red light, a second light emitting diode that emits green light, and a third light emitting diode that emits blue light,
the characteristic information includes at least one of information related to a color rank of emitted light produced by the first light emitting diode, the second light emitting diode, and the third light emitting diode and information related to a brightness of emitted light produced by the first light emitting diode, the second light emitting diode, and the third light emitting diode,
the control device generates a first drive signal for driving the first light emitting diode, a second drive signal for driving the second light emitting diode, and a third drive signal for driving the third light emitting diode in accordance with the characteristic information, and the control device output the first drive signal, the second drive signal, and the third drive signal to the driving circuit, and
the driving circuit generates a first drive current supplied to the first light emitting diode with the first drive signal, a second drive current supplied to the second light emitting diode with the second drive signal, and a third drive current supplied to the third light emitting diode with the third drive signal, and the driving circuit supplies the first drive current, the second drive current, and the third drive current to respectively drive the first light emitting diode, the second light emitting diode, and the third light emitting diode.

* * * * *